US006420754B2

(12) United States Patent
Takahashi et al.

(10) Patent No.: US 6,420,754 B2
(45) Date of Patent: Jul. 16, 2002

(54) SEMICONDUCTOR INTEGRATED CIRCUIT DEVICE

(75) Inventors: Masahito Takahashi, Tachikawa; Shiro Akamatsu, Kodaira; Akihiko Satoh, Hachiouji; Fukuo Owada, Ome; Masataka Kato, Koganei, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/791,832

(22) Filed: Feb. 26, 2001

(30) Foreign Application Priority Data

Feb. 28, 2000 (JP) ........................................ 2000-052436

(51) Int. Cl.[7] ............................................. H01L 29/792
(52) U.S. Cl. ........................ 257/326; 257/265; 438/258
(58) Field of Search .............................. 257/231, 249, 257/250, 265, 277, 298, 315, 316, 350, 365, 326, 258, 758, 390; 438/286

(56) References Cited

U.S. PATENT DOCUMENTS 4,780,431 A    10/1988  Maggioni et al.
5,828,096 A  * 10/1998  Ohno et al. ................. 257/306

FOREIGN PATENT DOCUMENTS

JP    02025069    1/1990
JP    08298314    11/1996
JP    08306889    11/1996

* cited by examiner

Primary Examiner—David Nelms
Assistant Examiner—Andy Huynh
(74) Attorney, Agent, or Firm—Antonelli, Terry, Stout & Kraus, LLP

(57) ABSTRACT

A gate electrode of a field-effect transistor used as a peripheral circuit is constituted by the same gate electrode structure as a double-level gate electrode structure of nonvolatile memory cells. A hole for connecting the two layers of the gate electrode of a first field-effect transistor used as peripheral circuit is provided at a location which two-dimensionally overlaps the active area within the plane of the gate electrode, and a hole for connecting the two layers of the gate electrode of a second field-effect transistor used as a peripheral circuit is provided at a location which two-dimensionally overlaps an isolation area within the plane of the gate electrode. The gate length of the first field-effect transistor is longer than the gate length of the second field-effect transistor, and the gate width of the first field-effect transistor is wider than the gate width of the second field-effect transistor.

17 Claims, 64 Drawing Sheets

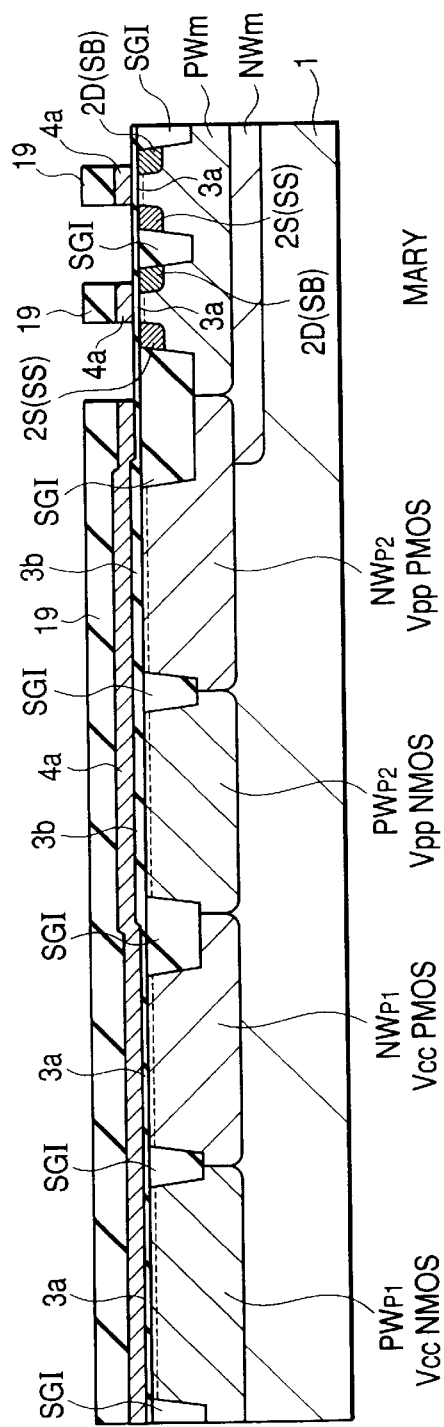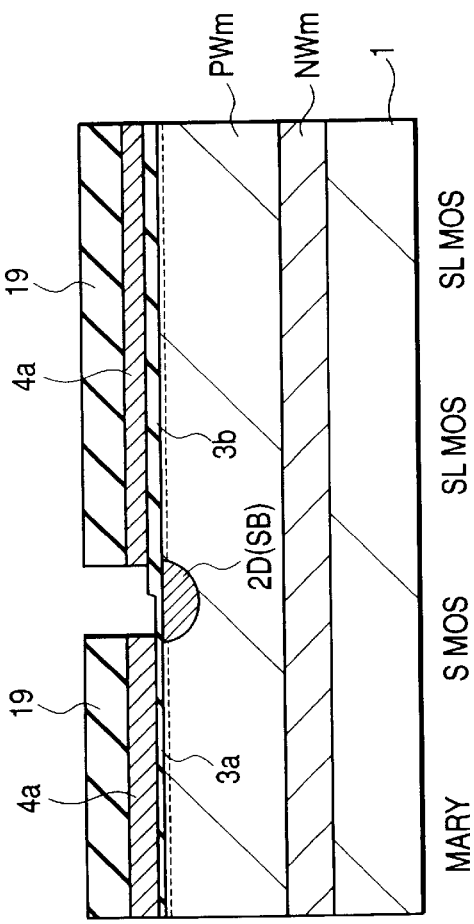

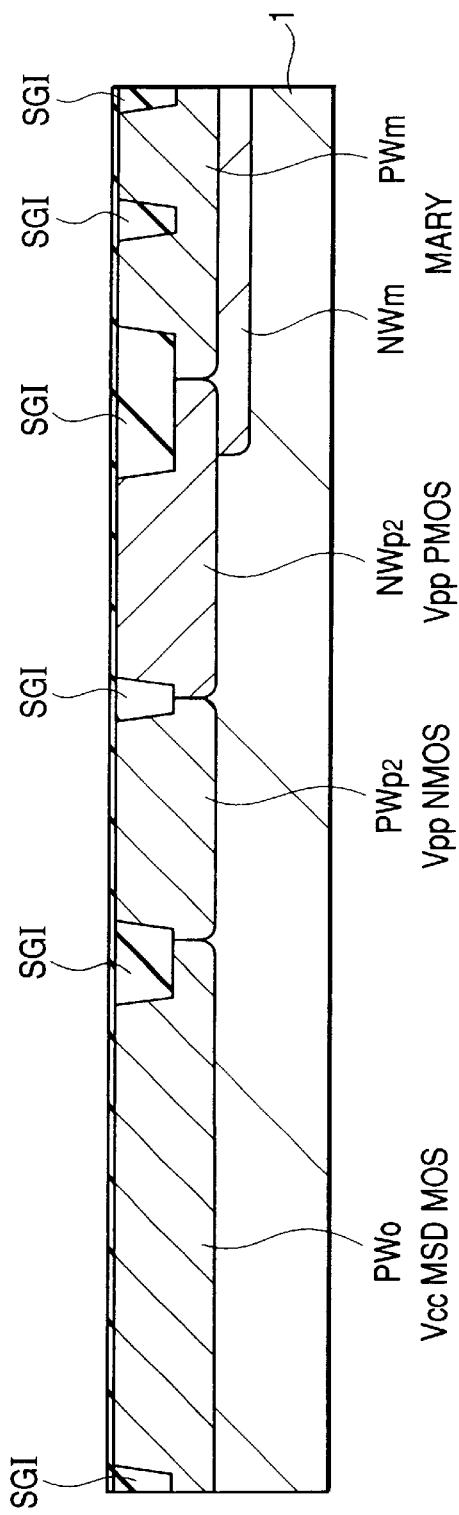
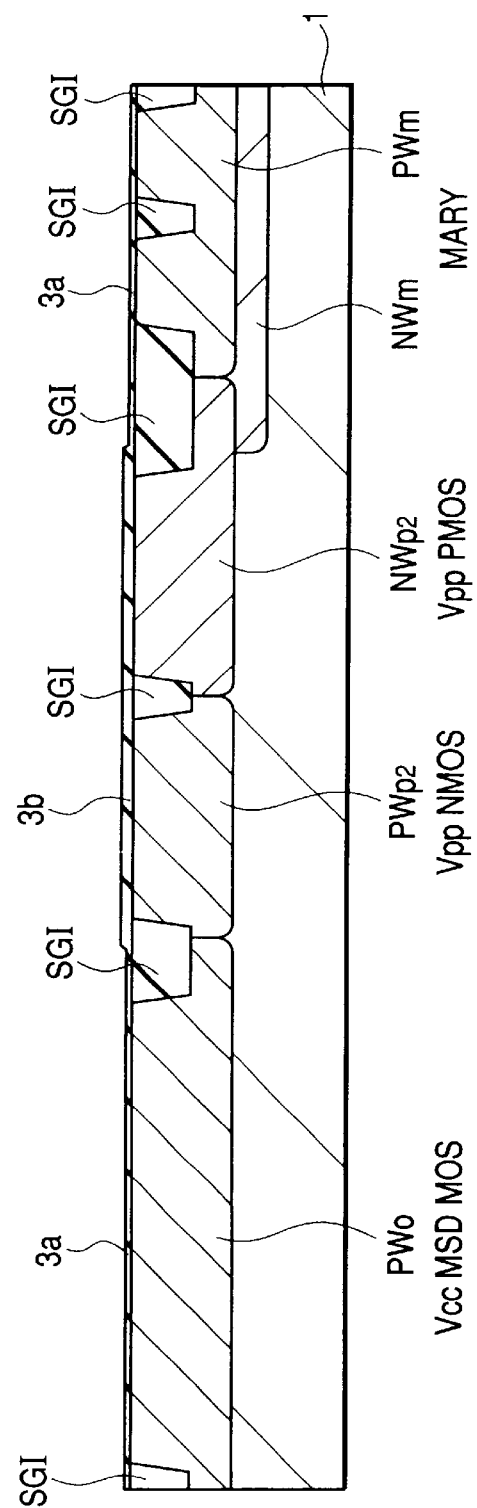

SEMICONDUCTOR INTEGRATED CIRCUIT DEVICE

FIELD OF THE INVENTION

The present invention relates to a semiconductor integrated circuit device and the method of manufacture thereof; and, more particularly, the invention relates to a technique that can be effectively applied to a semiconductor integrated circuit device including nonvolatile memories, and the method of manufacture thereof.

BACKGROUND OF THE INVENTION

Nonvolatile memories in which data writing and erasing can be electrically performed are widely used in various products that require memories, and they are noted for their simplicity in use since they can be overwritten without the need of removing them from, for example, a wiring board on which they are mounted. Especially, electric erasable programmable read only memories (hereinafter referred to as a "flash memory (EEPROM)") allow the size of memory cells to be reduced to a size smaller than the memory cells of DRAMs (Dynamic Random Access Memory); thus, such memories are expected to be effective for use as a substitute for magnetic disks.

A flash memory (EEPROM) has a function to electrically erase, in batch, the data stored in a given range of a memory cell array (all the memory cells in the memory cell array or a given group of the memory cells). Among such flash memories (EEPROM), a demand for those having a 1-bit/1-MISFET (metal insulator semiconductor field-effect transistor) structure is drastically growing, since such devices allow higher levels of integration. In the 1-bit/1-MISFET structure, a memory cell fundamentally comprises one double-level gate MISFET. This double-level gate MISFET is formed by providing a floating gate electrode over a semiconductor substrate via a tunnel insulating film and additionally forming a control gate electrode thereon via an interlayer film. A data storing operation is performed by injecting electrons into the floating gate electrode and by drawing the electrons out from the floating gate electrode.

For flash memories (EEPROM), a structure is disclosed in Japanese Patent Laid-Open No. 306889/1996, in which floating gates are provided to transistors other than memory cells of the flash memories, and the floating gates and control gates of the transistors other than the memory cells are connected via metal wirings.

Also, a structure and the manufacturing method thereof are disclosed in, for example, Japanese Patent Laid-open NO. 25069/1990, wherein a first gate oxide film, a first gate electrode, a second gate oxide film, a second gate electrode and a high-melting point silicide film are deposited as a common structure for both nonvolatile memory cells having a double gate structure and MOS transistors; and, in the MOS transistor, the first gate electrode and the second gate electrode are connected via a contact hole formed within the second gate oxide film.

As another example, there is a structure and the manufacturing method thereof disclosed in, for example, Japanese Patent Laid-Open No. 34977/1988 which is a publication of a patent application corresponding to U.S. Pat. No. 4,780,431, in which the same gate structure is used for EEPROM nonvolatile memory cells and associated transistors; and, for the associated transistors, a first silicon layer and a second silicon layer formed thereon are connected by etching portion of an oxide thin film provided between them.

As still another example, there is a nonvolatile semiconductor memory device and the manufacturing method thereof disclosed in, for example, Japanese Patent Application Laid-Open No. 298314/1996, in which, after sequentially forming a first polysilicon film and a second gate oxide film from the bottom over a memory cell region and a peripheral circuit region, the second gate insulating film within the peripheral circuit region is selectively removed, and a second polysilicon film is then deposited.

SUMMARY OF THE INVENTION

The inventor of the present invention has discovered, however, that the above-mentioned techniques for formation of a semiconductor integrated circuit device including nonvolatile memories have the following problems.

That is, where the double-level gate electrode structure is employed for the field-effect transistors of the peripheral circuitry, the resistivity of the gate electrodes cannot be reduced according to the types of the field-effect transistors by simply providing contact holes for connecting between the two layers of the gate electrode; and so, as the through current of the whole flash memory (EEPROM) increases, the power consumption also increases.

When attempting to change the layout of each of the components (i.e. contact holes connecting the source and drain to a first-level wiring layer) of a field-effect transistor to be used as a peripheral circuit in order to solve the above problem, a desirable layout can hardly be obtained. That is, there is a problem in that it is difficult to represent a device structure without encountering inconveniences in circuit designing.

An object of the present invention is to provide a technique which provides for a the reduction in the resistivity of the gate electrodes of the peripheral circuits of a semiconductor integrated circuit device including nonvolatile memories.

Another object of the present invention is to provide a technique which provides for a reduction in the power consumption of a semiconductor integrated circuit device including nonvolatile memories.

Still another object of the present invention is to provide a technique which allows the layout of the devices intended for peripheral circuits of a semiconductor integrated circuit device including nonvolatile memories to be performed more easily.

Yet another object of the present invention is to provide a technique which allows the transition to be made more easily from the circuit design of peripheral circuits to the device design of a semiconductor integrated circuit device having nonvolatile memories.

The above and other objects and novel features of the present invention will be apparent from the following description when taken in conjunction with the attached drawings.

The summary of representative aspects of the invention disclosed herein will be briefly explained as follows.

In accordance with the present invention, the gate electrode of a field-effect transistor for a peripheral circuit is constituted by the same gate electrode structure as that of nonvolatile memory cells having a double-level gate electrode structure, and a hole for the connection between the two layers of the gate electrode of the field-effect transistor for the peripheral circuit is formed at a location which two-dimensionally overlaps an active area within the plane of the gate electrode.

Moreover, in accordance with the present invention, the gate electrode of a field-effect transistor for a peripheral circuit is constituted by the same gate electrode structure as that of nonvolatile memory cells having a double-level gate electrode structure, and a hole for the connection between the two layers of the gate electrode of the field-effect transistor for a peripheral circuit is formed at each of a location which two-dimensionally overlaps an active area and a location which two-dimensionally overlaps an isolation area within the planes of the gate electrode.

Furthermore, in accordance with the present invention, the gate electrode of a field-effect transistor for a peripheral circuit is constituted by the same gate electrode structure as that of nonvolatile memory cells having a double-level gate electrode structure, and a hole for the connection between the two layers of the gate electrodes of the field-effect transistor for the peripheral circuit is formed at a location which two-dimensionally overlaps an isolation area within the planes of the gate electrode.

Also, in accordance with the present invention, the gate electrodes of first and second field-effect transistors for a peripheral circuit are constituted by the qame gate electrode structure as that of nonvolatile memory cells having a double-level gate electrode structure, and a hole for the connection between the two layers of the gate electrode of the first field-effect transistor is formed at a location which two-dimensionally overlaps an active area within the planes of the gate electrode, and a hole for the connection between the two layers of the gate electrode of the second field-effect transistor is formed at a location which two-dimensionally overlaps an isolation area within the planes of the gate electrodes. The gate length of the first field-effect transistor is longer than the gate length of the second field-effect transistor. The gate width of the first field-effect transistor is wider than the gate width of the second field-effect transistor.

Furthermore, in accordance with the present invention, the first gate electrode of the double-level gate electrode is made of polycrystalline silicon, and the second gate electrode includes a higb-melting point metal silicide film or a high-melting point metal film.

Figure 26:
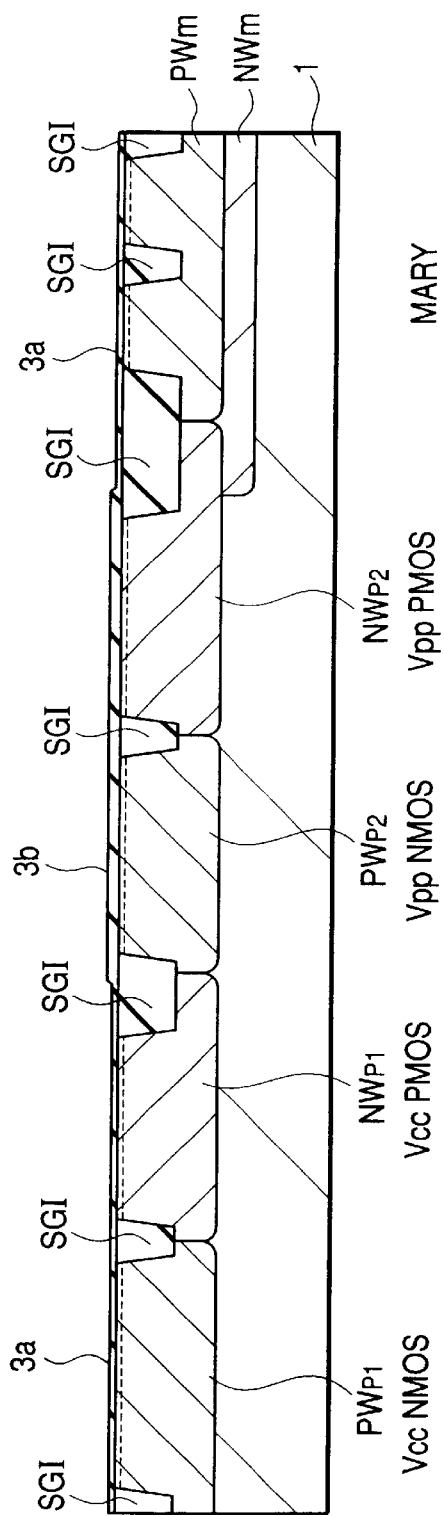
FIG. 26 is a schematic cross-sectional view of the flash memory (EEPROM) showing the same section as that shown in FIG. 24 during a step of the manufacturing process step subsequent to the process shown in FIGS. 23 to 25.
Figure 27:
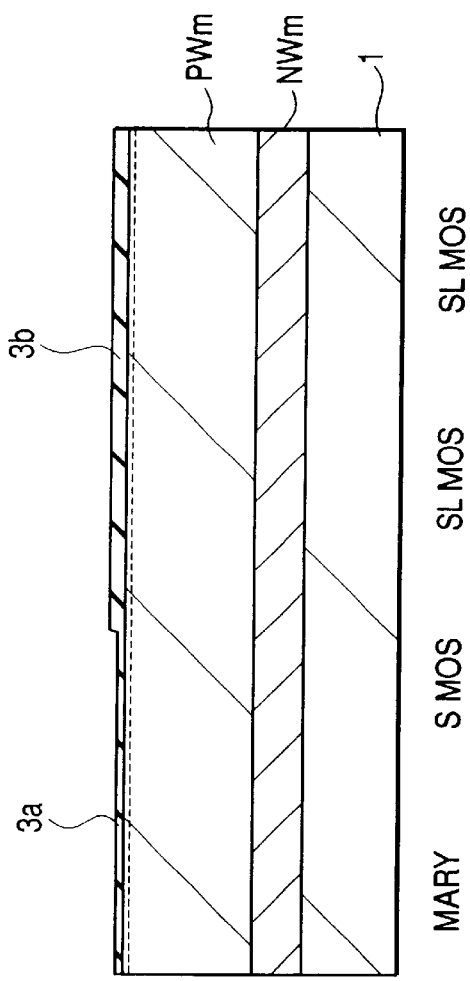
FIG. 27 is a schematic cross-sectional view of the flash memory (EEPROM) showing the same section as that shown in FIG. 25 during the same step of the manufacturing process as that shown in FIG. 26.

23 during a step of the manufacturing process subsequent to the process step shown in FIGS. 26 and 27.

Figure 24:
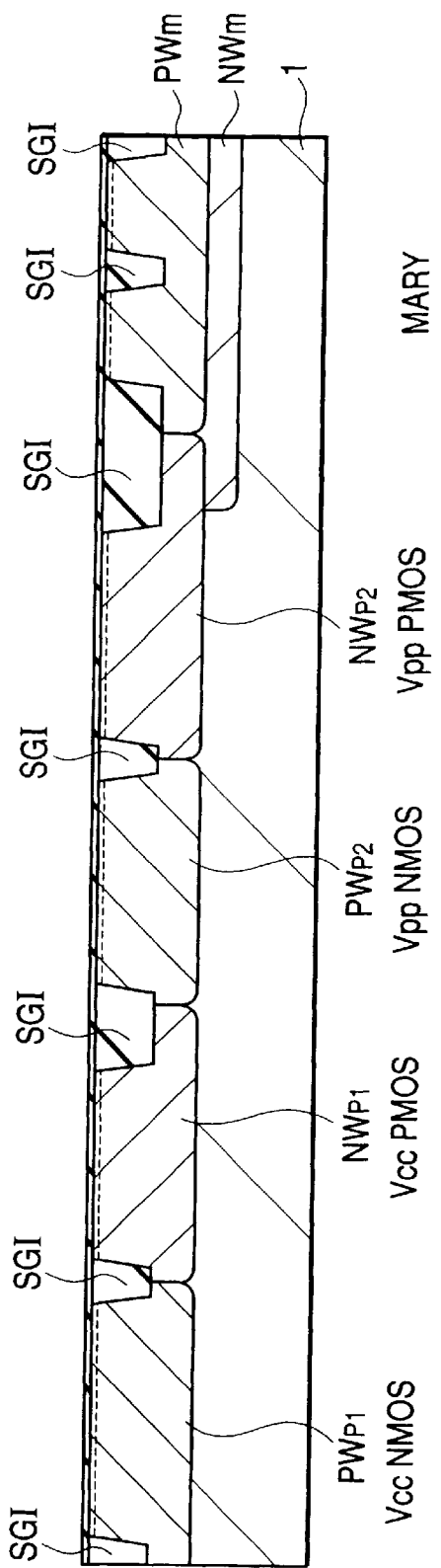
FIG. 24 is a schematic cross-sectional view of the flash memory (EEPROM) during the same step of the manufacturing process as FIG. 23.
Figure 28:
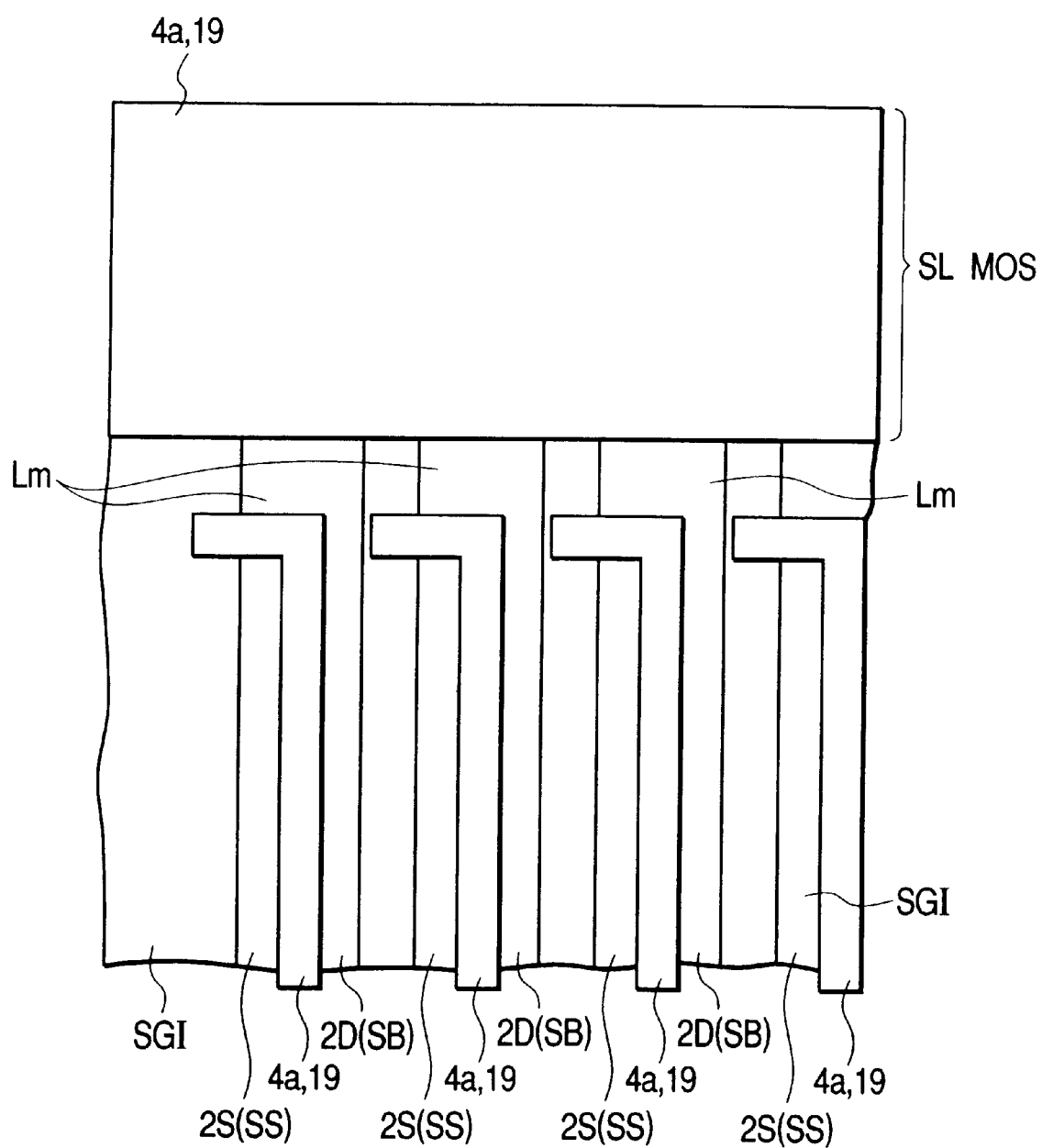
FIG. 28 is a schematic plan view of the flash memory (EEPROM) showing the same section as that shown in FIG.

FIG. 29 is a schematic cross-sectional view of the flash memory (EEPROM) showing the same section as that shown in FIG. 24 during the same step of the manufacturing process as that shown in FIG. 28.

Figure 25:
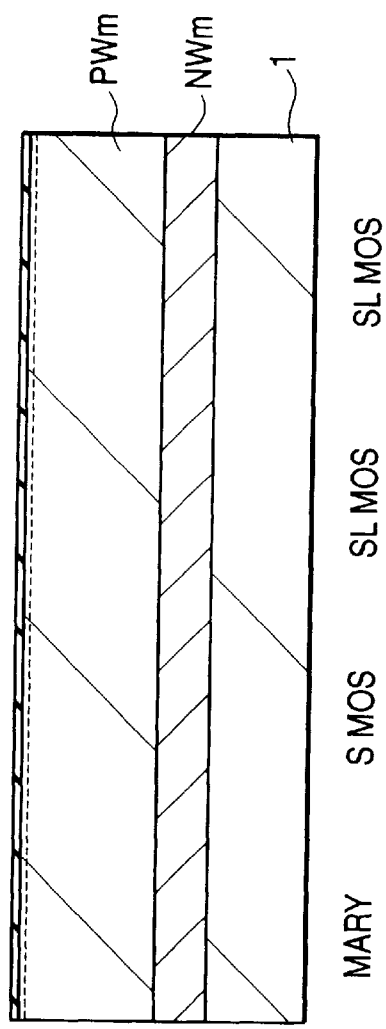
FIG. 25 is a schematic cross-sectional view of the flash memory (EEPROM) showing a section different from that shown in FIG. 24 during the same step of the manufacturing process.

FIG. 30 is a schematic cross-sectional view of the flash memory (EEPROM) showing the same section as that shown in FIG. 25 during the same step of the manufacturing process as that shown in FIG. 28.

Figure 31:
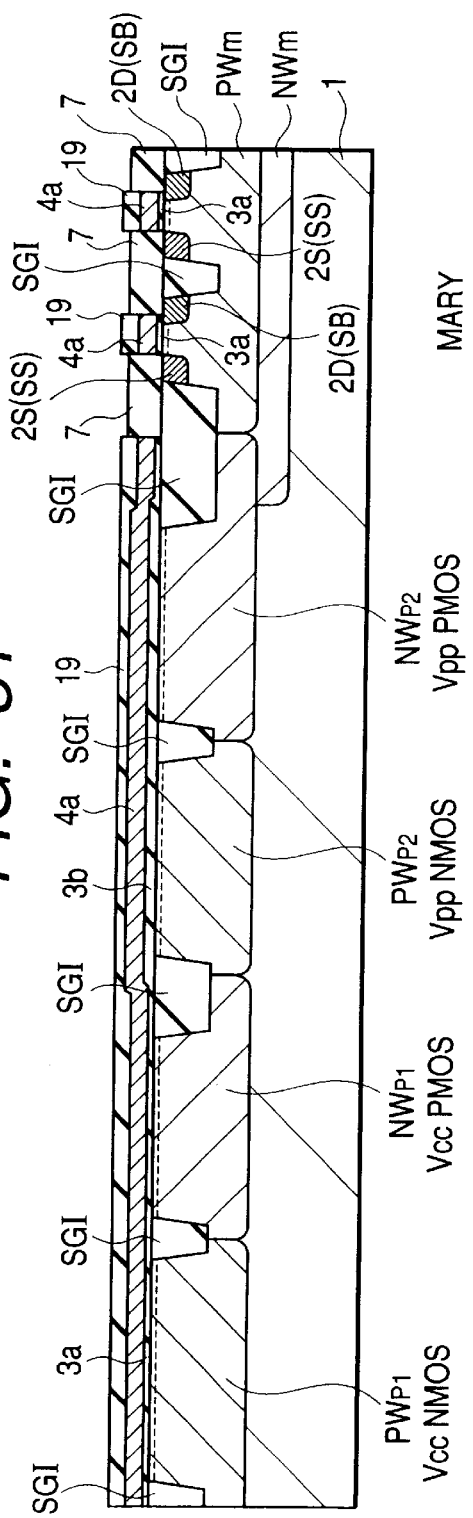

FIG. 31 is a schematic cross-sectional view of the flash memory (EEPROM) showing the same section as that showing in FIG. 2A during a step of the manufacturing process subsequent to the process step shown in FIGS. 28 to 30.

Figure 32:
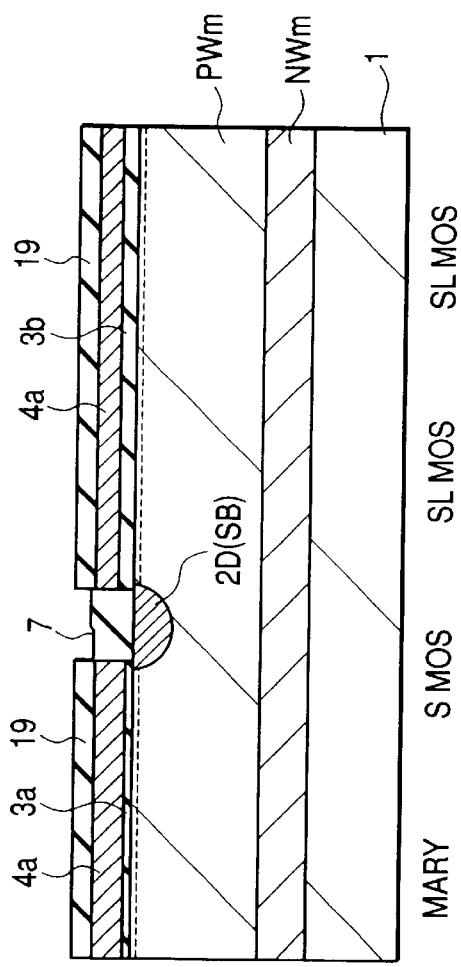

FIG. 32 is a schematic cross-sectional view of the flash memory (EEPROM) showing the same section as that shown in FIG. 25 during the same step of the manufacturing process as that shown in FIG. 31.

Figure 23:
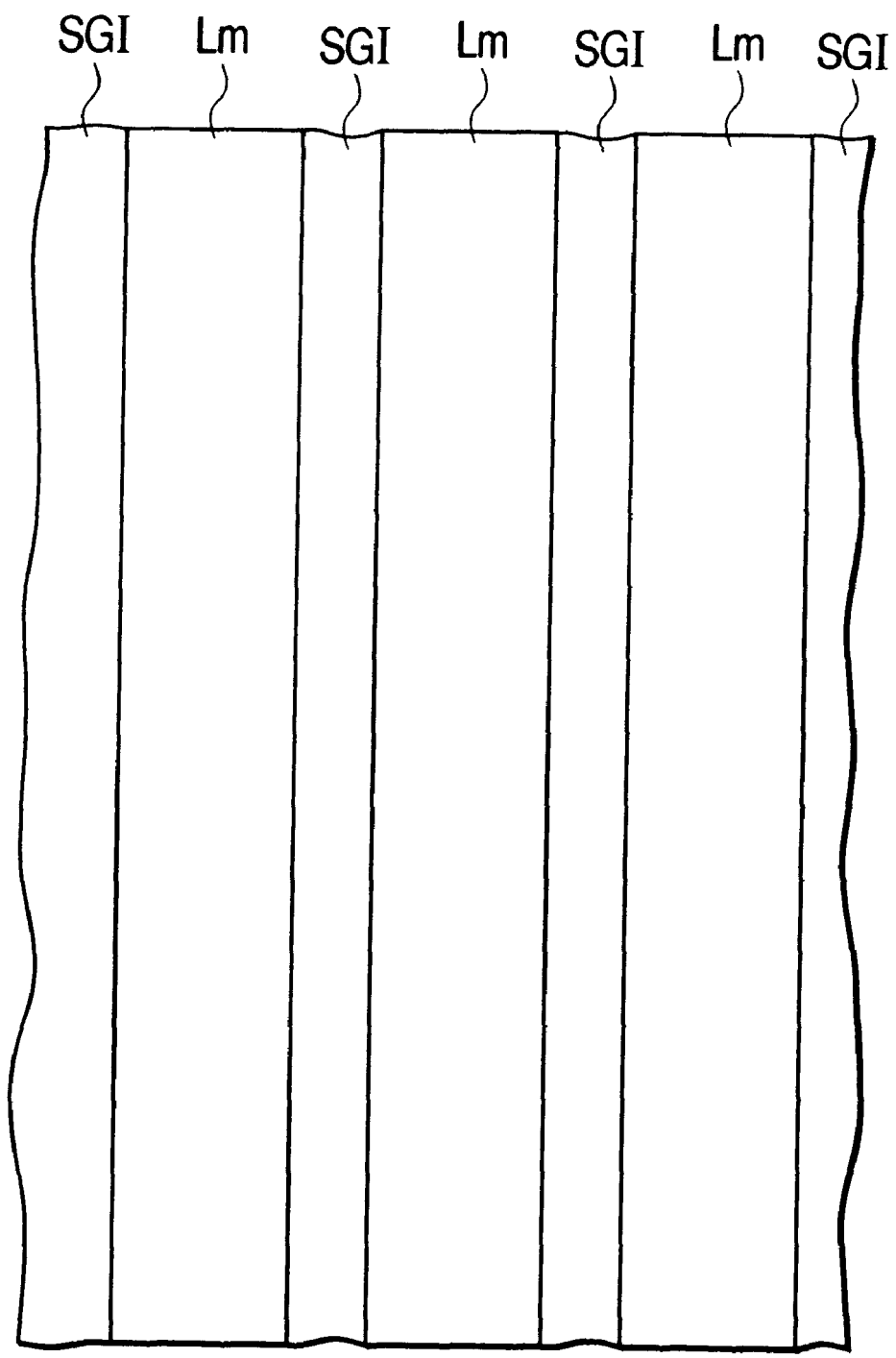
FIG. 23 is a schematic plan view of the flash memory (EEPROM) of FIG. 1 during a step of the manufacturing process.
Figure 33:
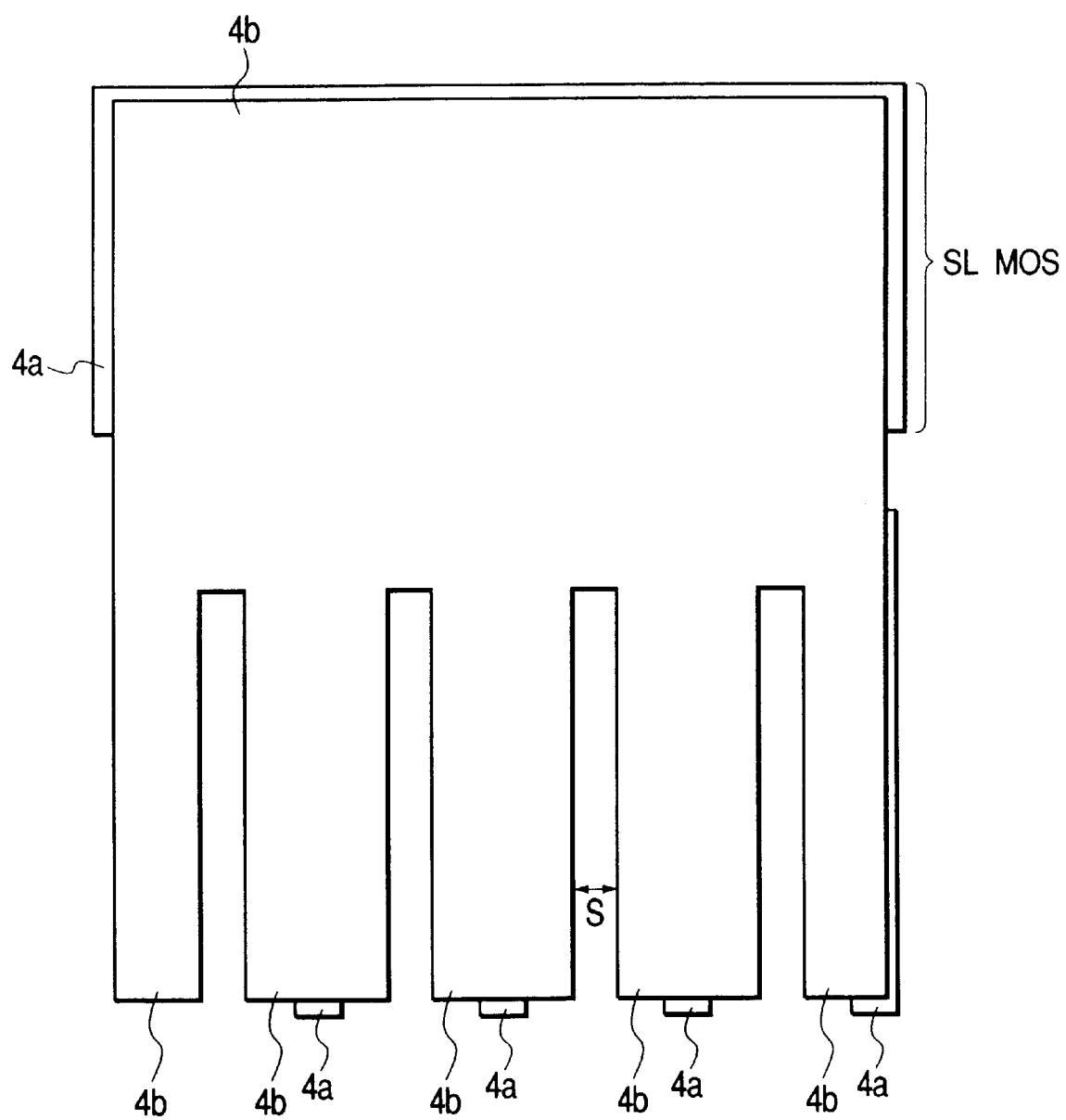

FIG. 33 is a schematic plan view of the flash memory (EEPROM) showing the same section as that shown in FIG. 23 during a step of the manufacturing process subsequent to the process step shown in FIGS. 31 and 32.

Figure 34:
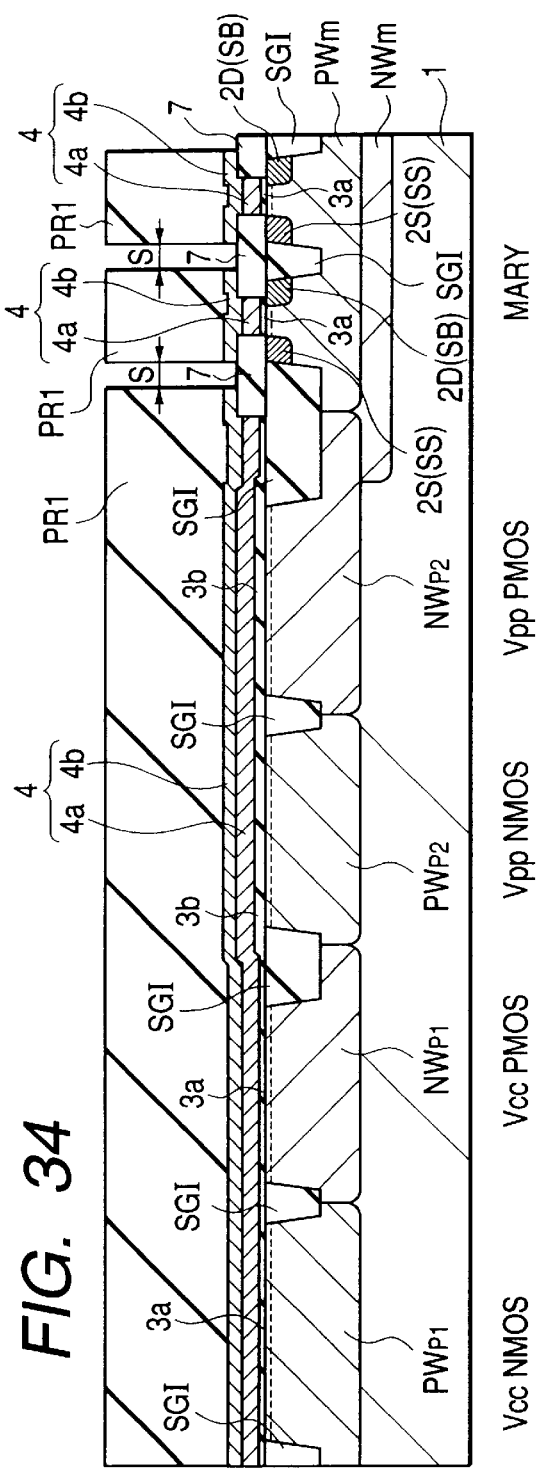

FIG. 34 is a schematic cross-sectional view of the flash memory (EEPROM) showing the same section as that shown in FIG. 24 during the same step of the manufacturing process as that shown in FIG. 33.

Figure 35:
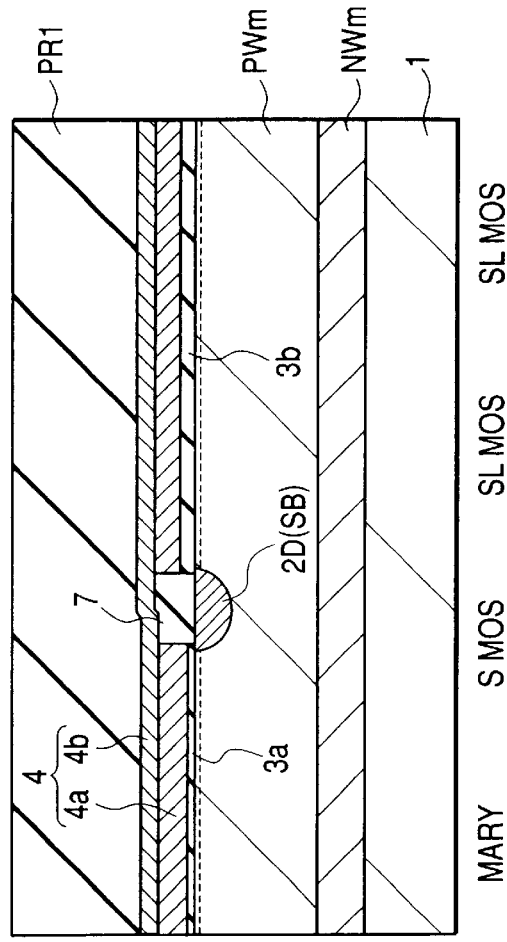

FIG. 35 is a schematic cross-sectional view of the flash memory (EEPROM) showing the same section as that shown in FIG. 25 during the same step of the manufacturing process as that shown in FIG. 33.

Figure 36:
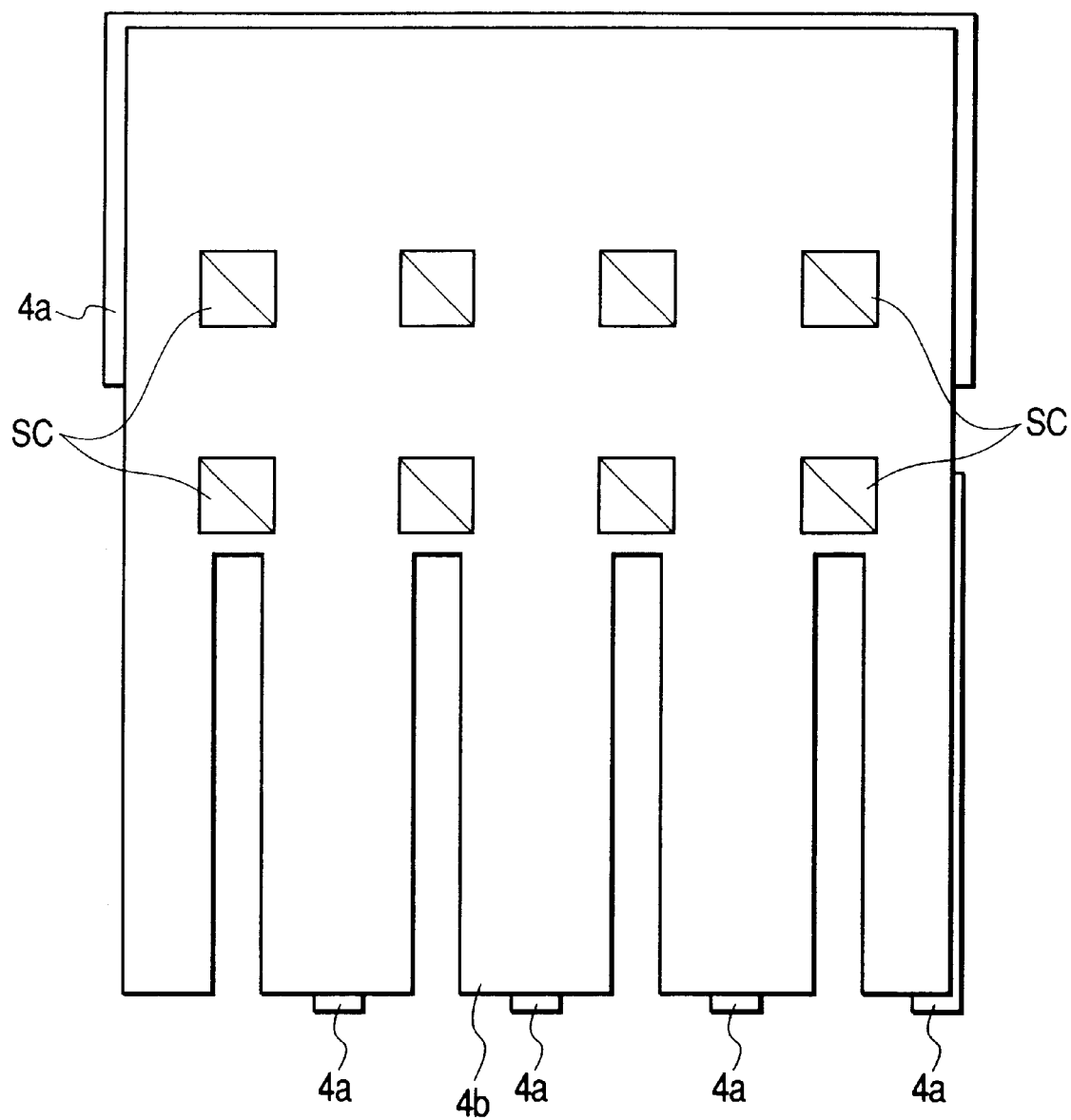

FIG. 36 is a schematic plan view of the flash memory (EEPROM) showing the same section as that shown in FIG. 23 during a step of the manufacturing process subsequent to the process step shown in FIGS. 33 to 35.

Figure 37:
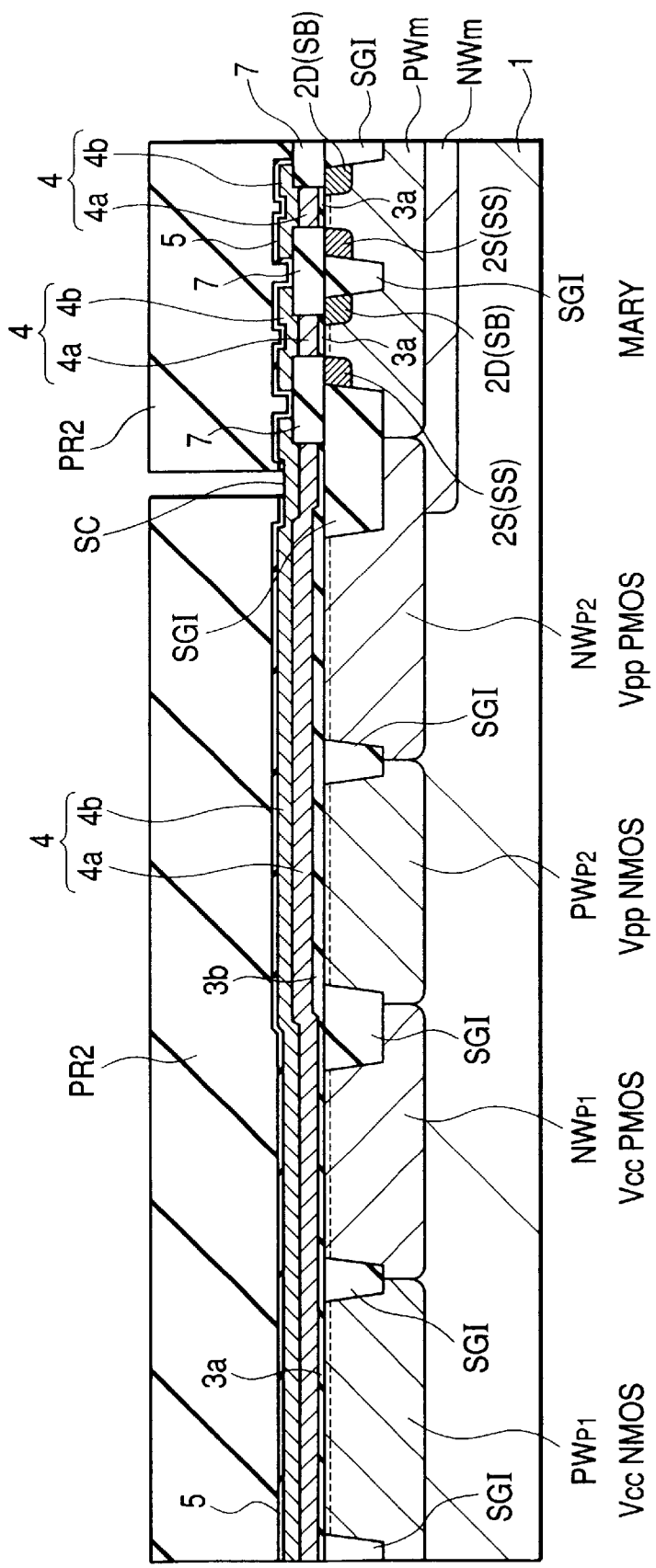

FIG. 37 is a schematic cross-sectional view of the flash memory (EEPROM) showing the same section as that shown in FIG. 24 during the same step of the manufacturing process as that shown in FIG. 36.

Figure 38:
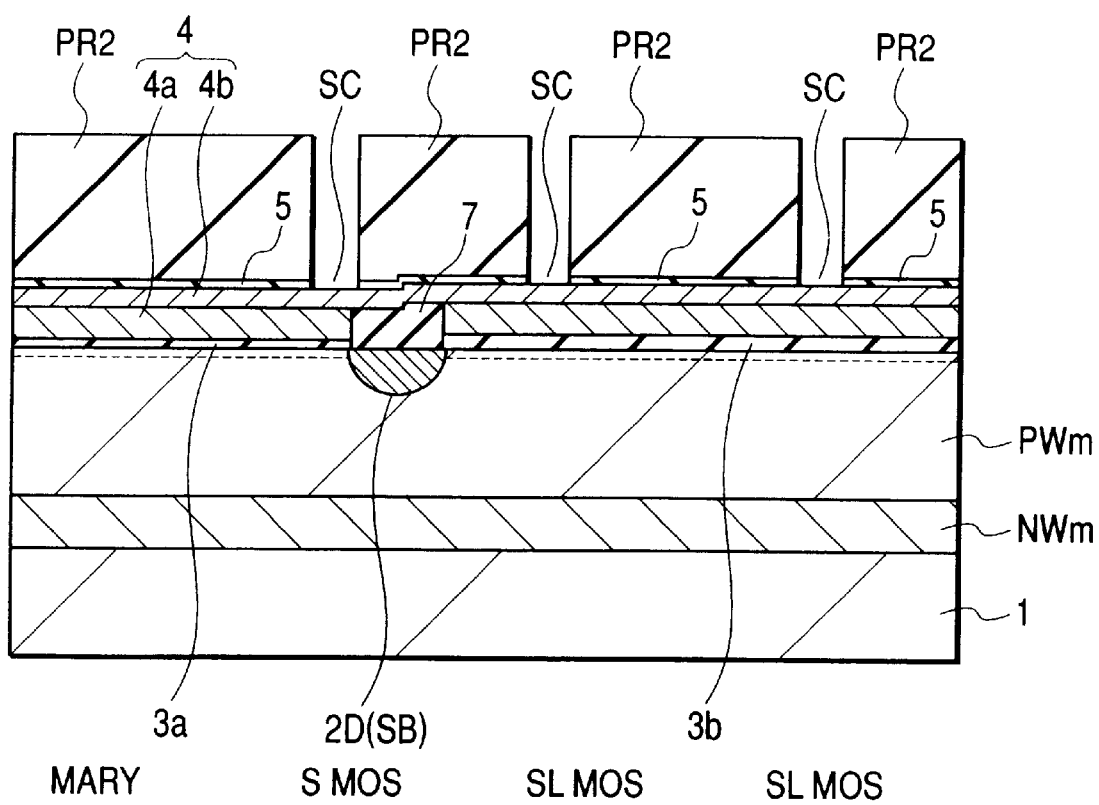

FIG. 38 is a schematic cross-sectional view of the flash memory (EEPROM) showing the same section as that shown in FIG. 25 during the same step of the manufacturing process as that shown in FIG. 36.

Figure 39:
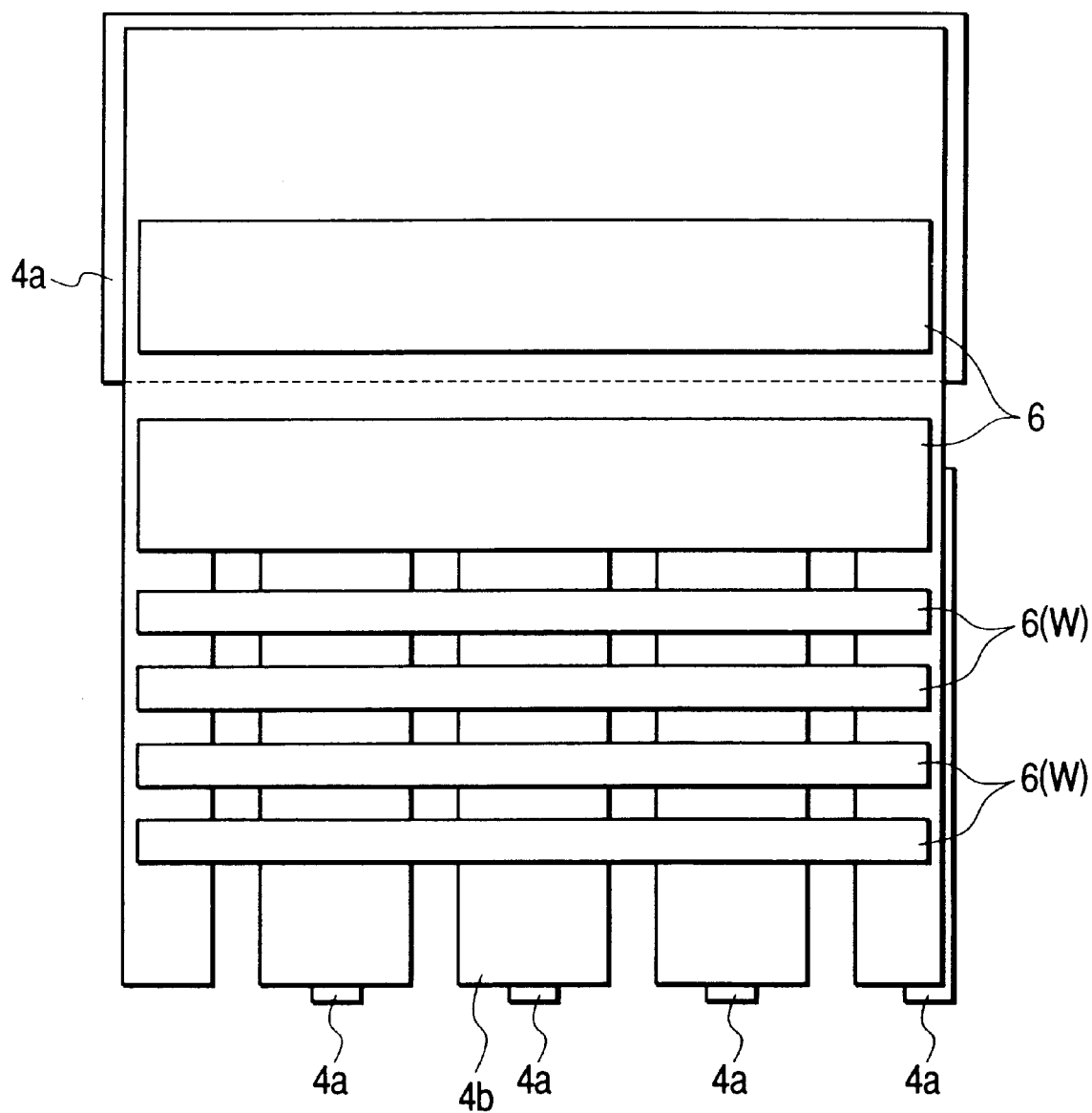

FIG. 39 is a schematic plane view of the flash memory (EEPROM) showing the same section as that shown in FIG. 26 during a step of the manufacturing process subsequent to the process step shown in FIGS. 36 to 38.

Figure 40:
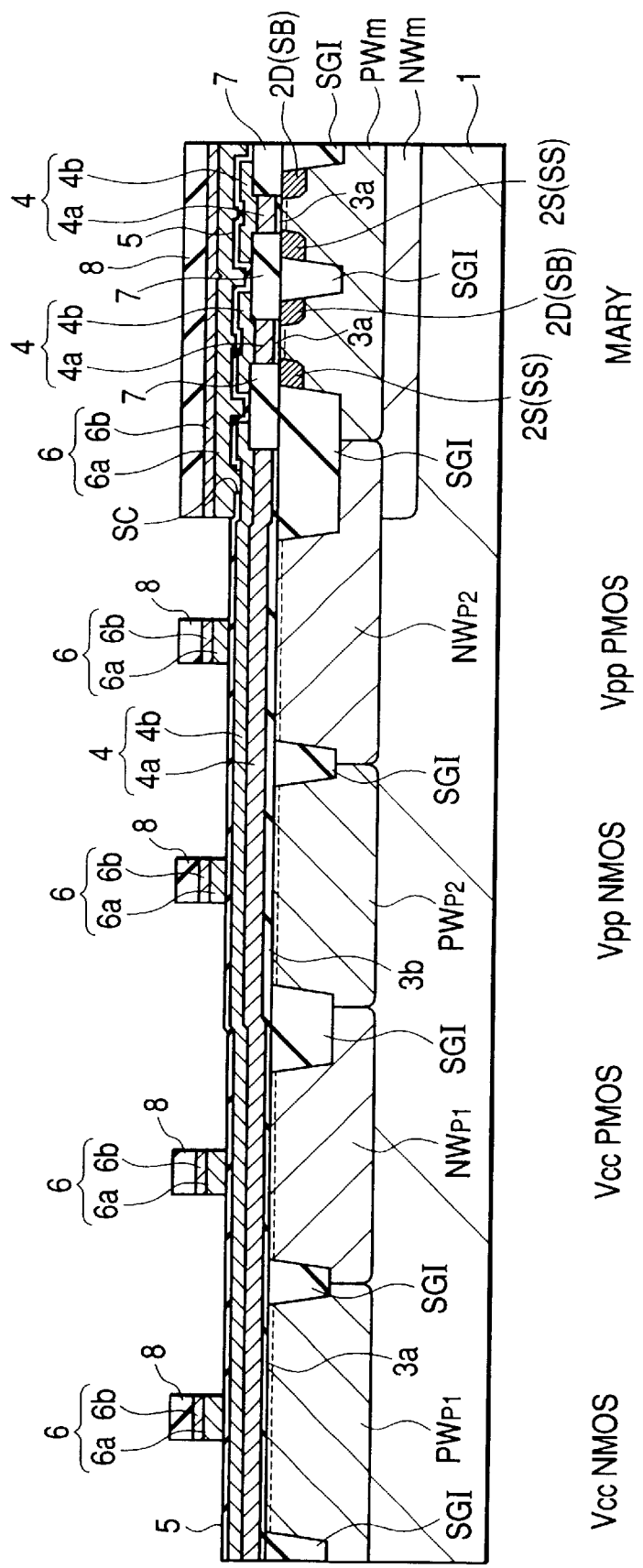

FIG. 40 is a schematic cross-sectional view of the flash memory (EEPROM) showing the same section as that shown in FIG. 24 during the same step of the manufacturing process as that shown in FIG. 39.

Figure 41:
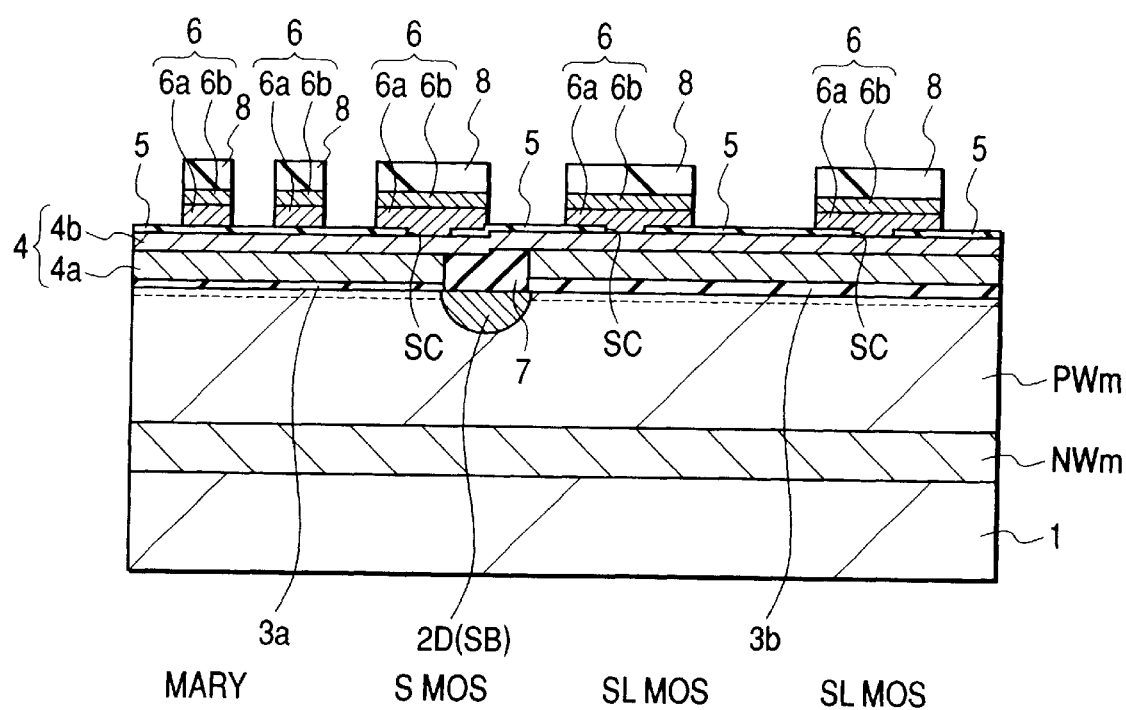

FIG. 41 is a schematic cross-sectional view of the flash memory (EEPROM) showing the same section as that shown in FIG. 25 during the same step of the manufacturing process as that shown in FIG. 39.

Figure 42:
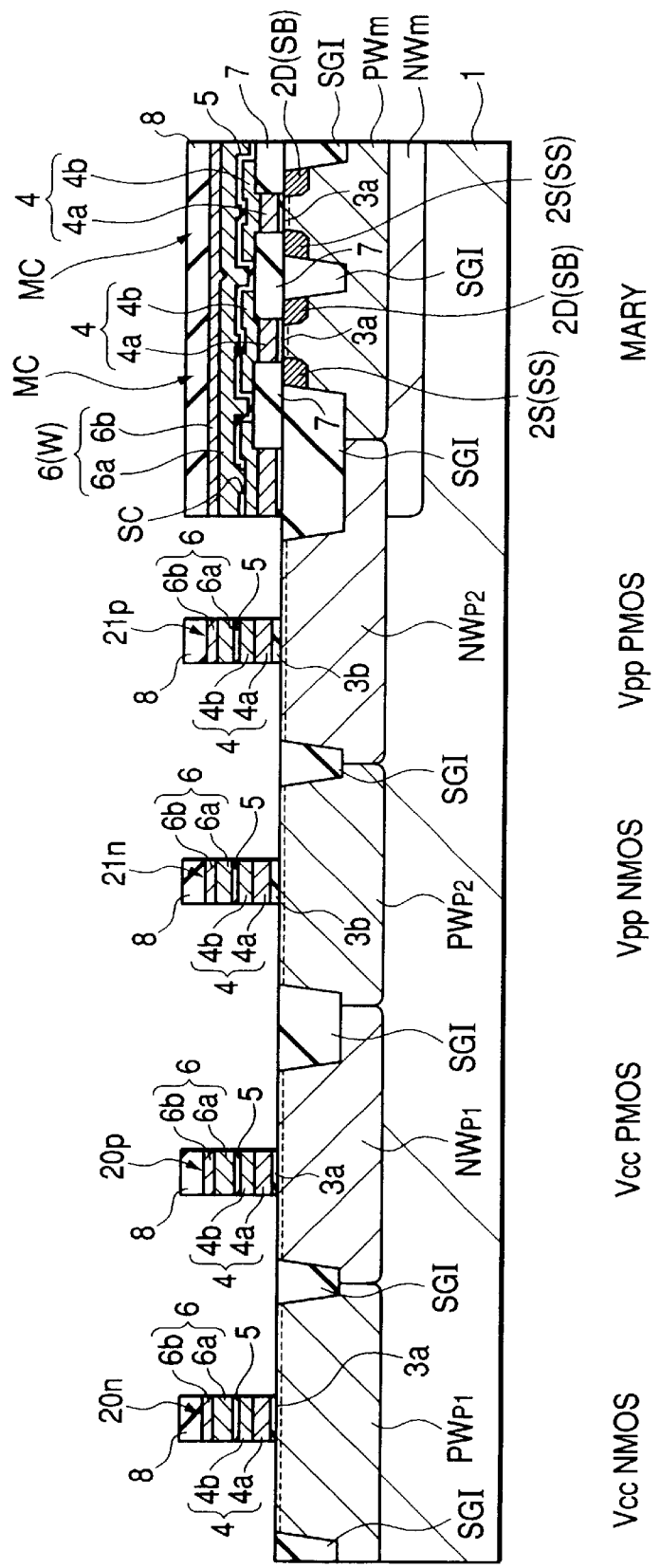

FIG. 42 is a schematic cross-sectional view of the flash memory (EEPROM) showing the same section as that shown in FIG. 24 during a step of the manufacturing process subsequent to the process step shown in FIGS. 39 to 41.

Figure 43:
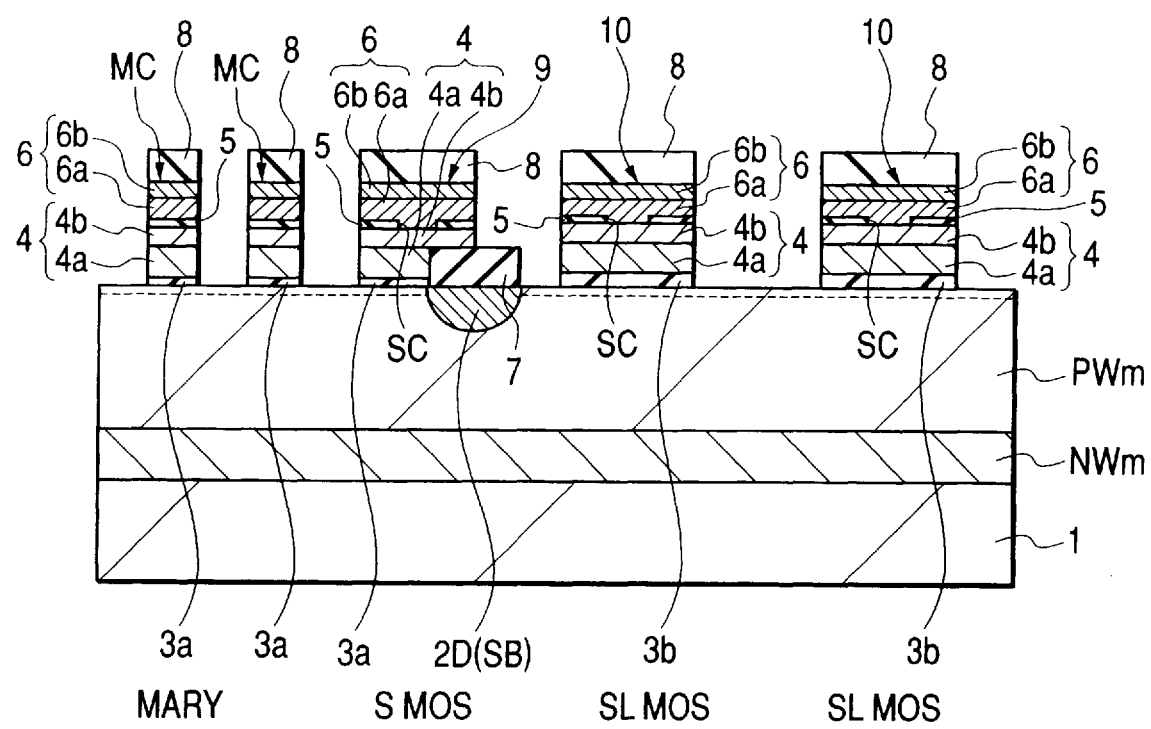

FIG. 43 is a schematic cross-sectional view of the flash memory (EEPROM) showing the same section as that shown in FIG. 2S during the same step of the manufacturing process as that shown in FIG. 42.

Figure 44:
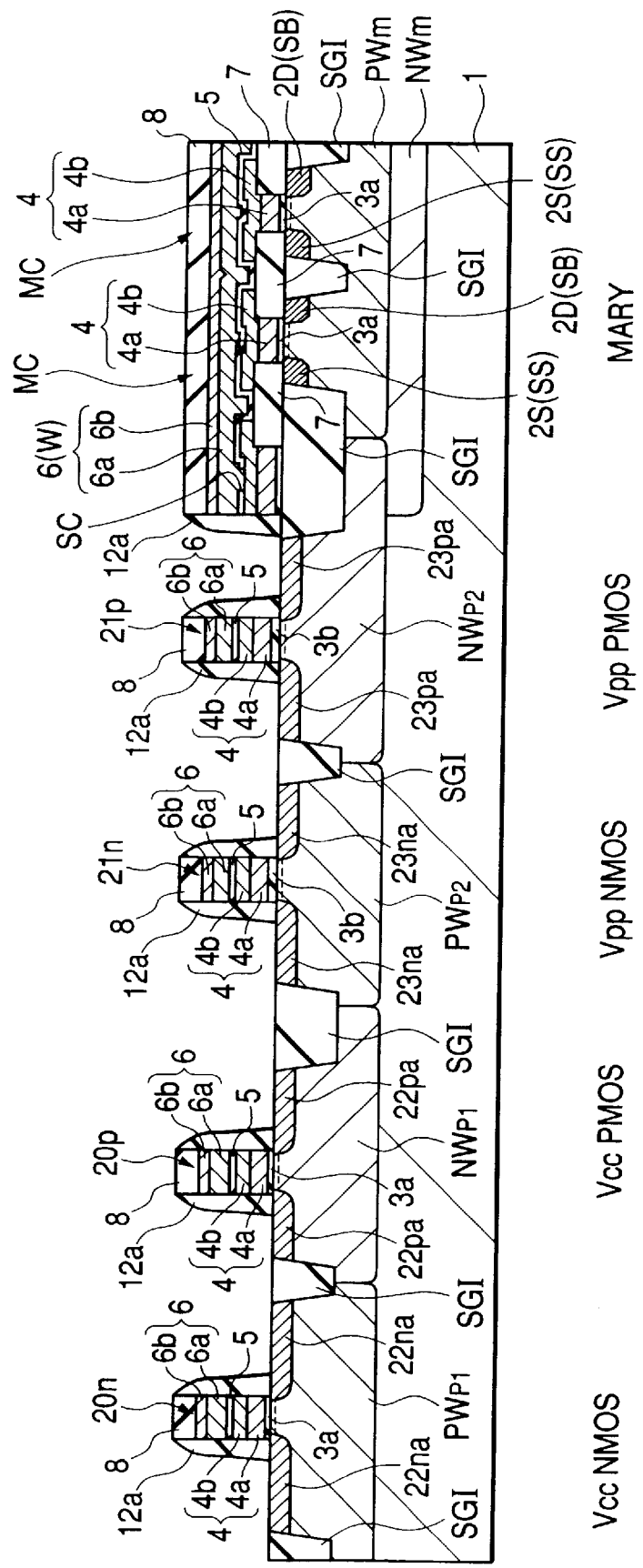

FIG. 44 is a schematic cross-sectional view of the flash memory (EEPROM) showing the same section as that shown in FIG. 24 during a step of the manufacturing process subsequent to the process step shown in FIGS. 42 and 43.

Figure 45:
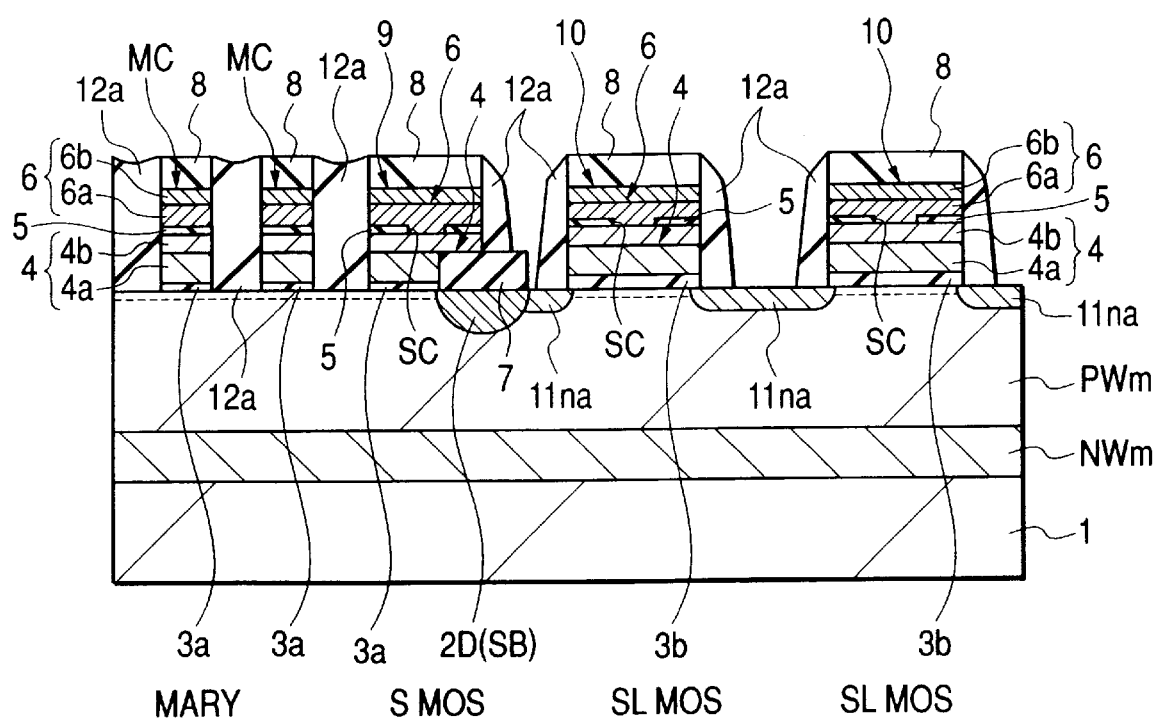

FIG. 45 is a schematic cross-sectional view of the flash memory (EEPROM) showing the same section as that shown in FIG. 25 during the same step of the manufacturing process as that shown in FIG. 44.

Figure 46:
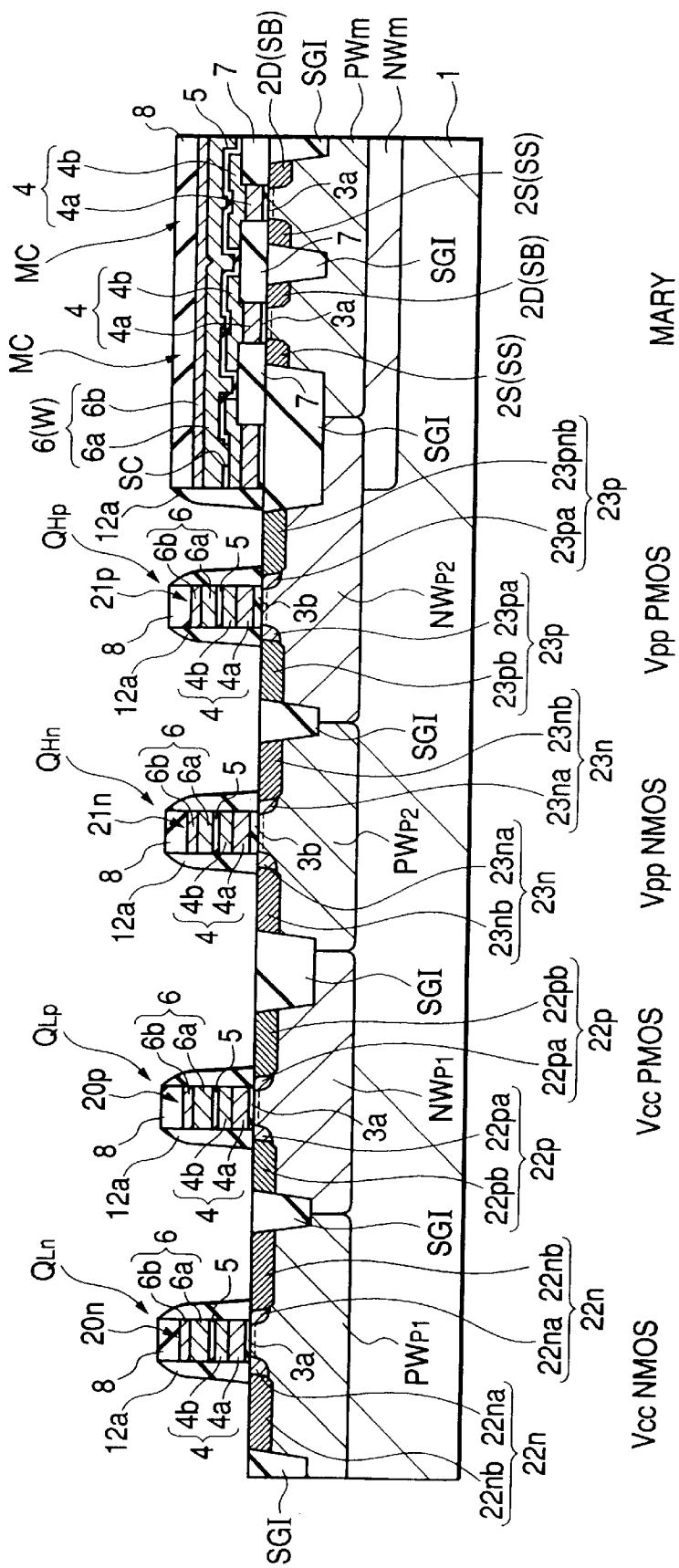

FIG. 46 is a schematic cross-sectional view of the flash memory (EEPROM) showing the same section as that shown in FIG. 24 during a step of the manufacturing process subsequent to the process step shown in FIGS. 44 and 45.

Figure 47:
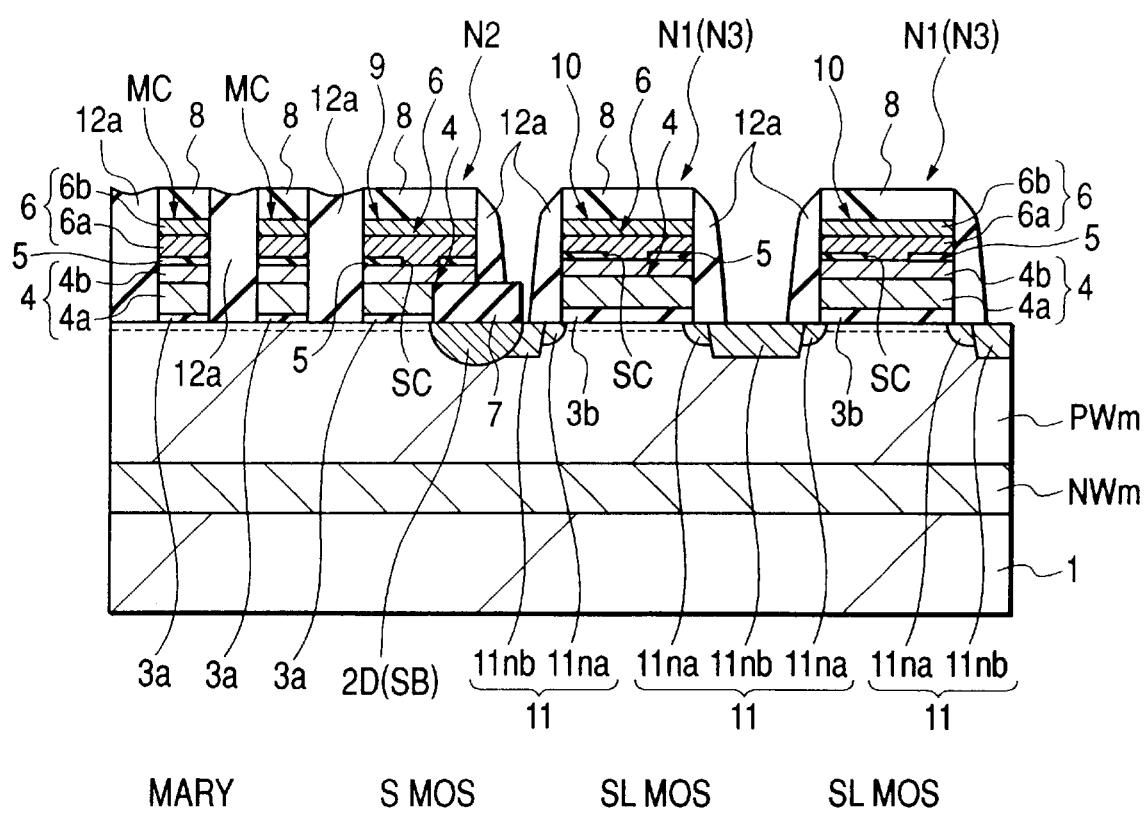

FIG. 47 is a schematic cross-sectional view of the flash memory (EEPROM) showing the same section as that shown in FIG. 25 during the same step of the manufacturing process as that shown in FIG. 46.

Figure 48:
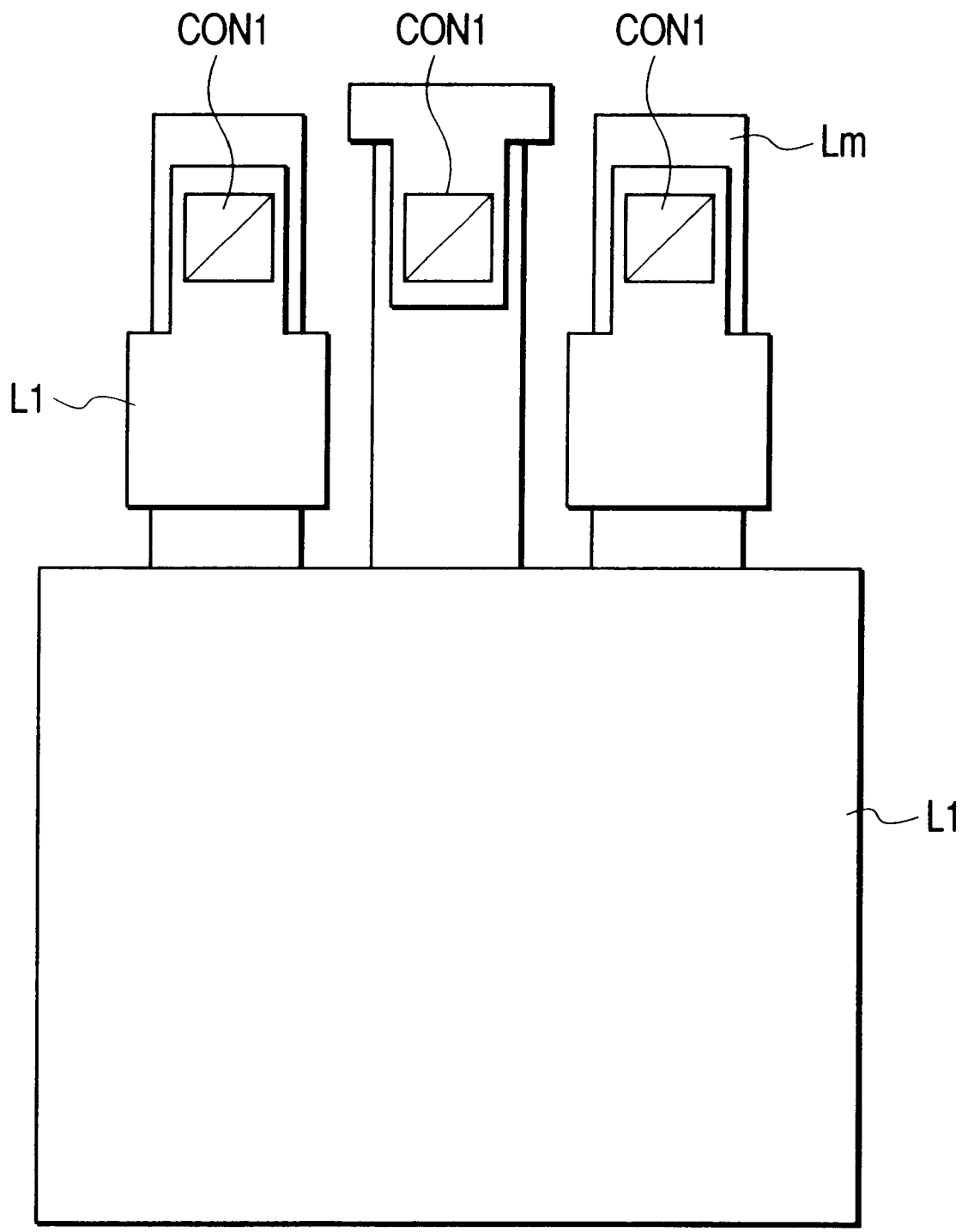

FIG. 48 is a schematic plan view of the flash memory (EEPROM) showing the same section as that shown in FIG. 23 during a manufacturing process step subsequent to the process step shown in FIGS. 46 and 47.

Figure 49:
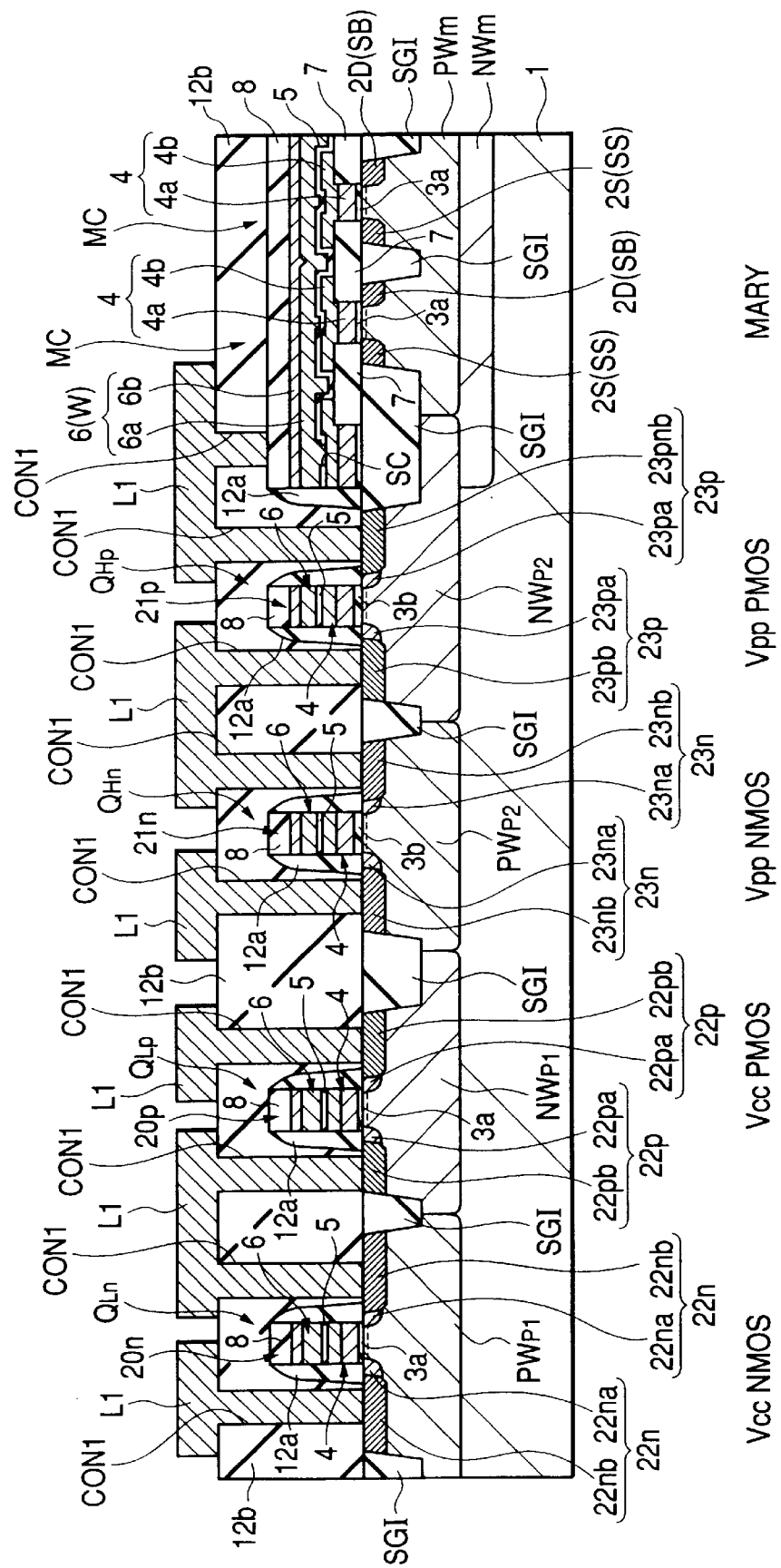

FIG. 49 is a schematic cross-sectional view of the flash memory (EEPROM) showing the same section as that shown in FIG. 24 during the same step of the manufacturing process as that shown in FIG. 48.

Figure 50:
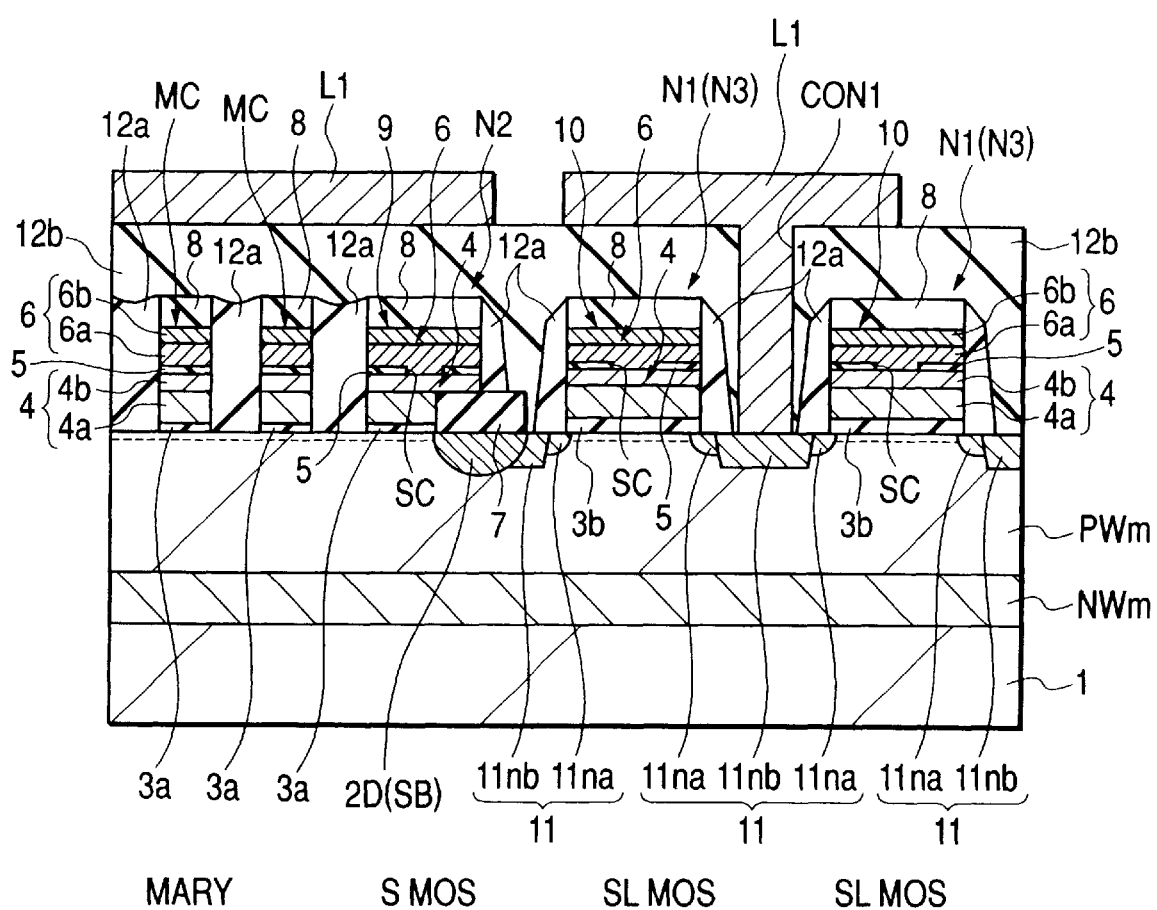

FIG. 50 is a schematic cross-sectional view of the flash memory (E-EPROM) showing the same section as that shown in FIG. 25 during the same step of the manufacturing rocess as that shown in FIG. 48.

Figure 51:
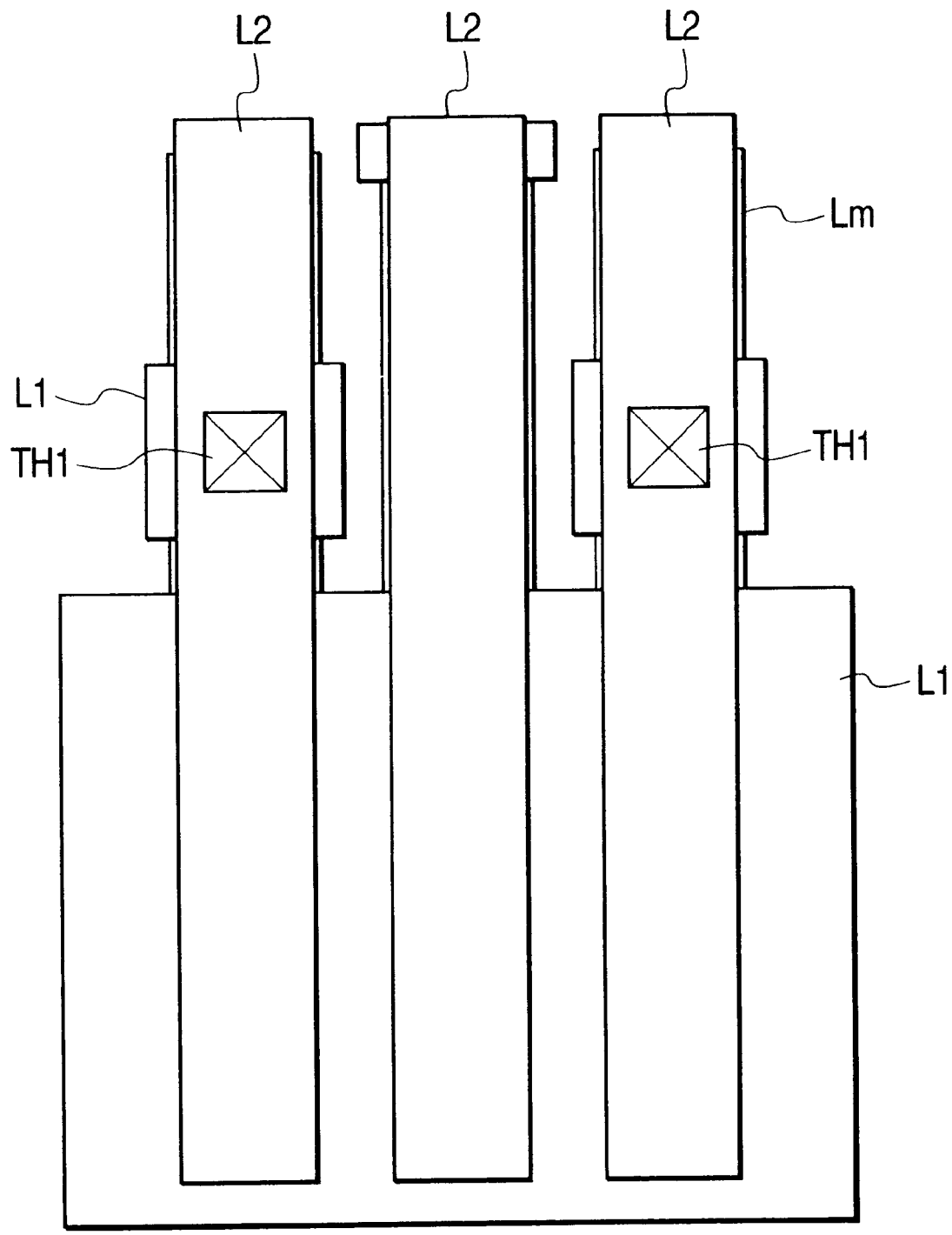

FIG. 51 is a schematic plan view of the flash emory (EEPROM) showing the same section as that shown in FIG. 23 during a step of the manufacturing process step subsequent to the process shown in FIGS. 48 to 50.

Figure 52:
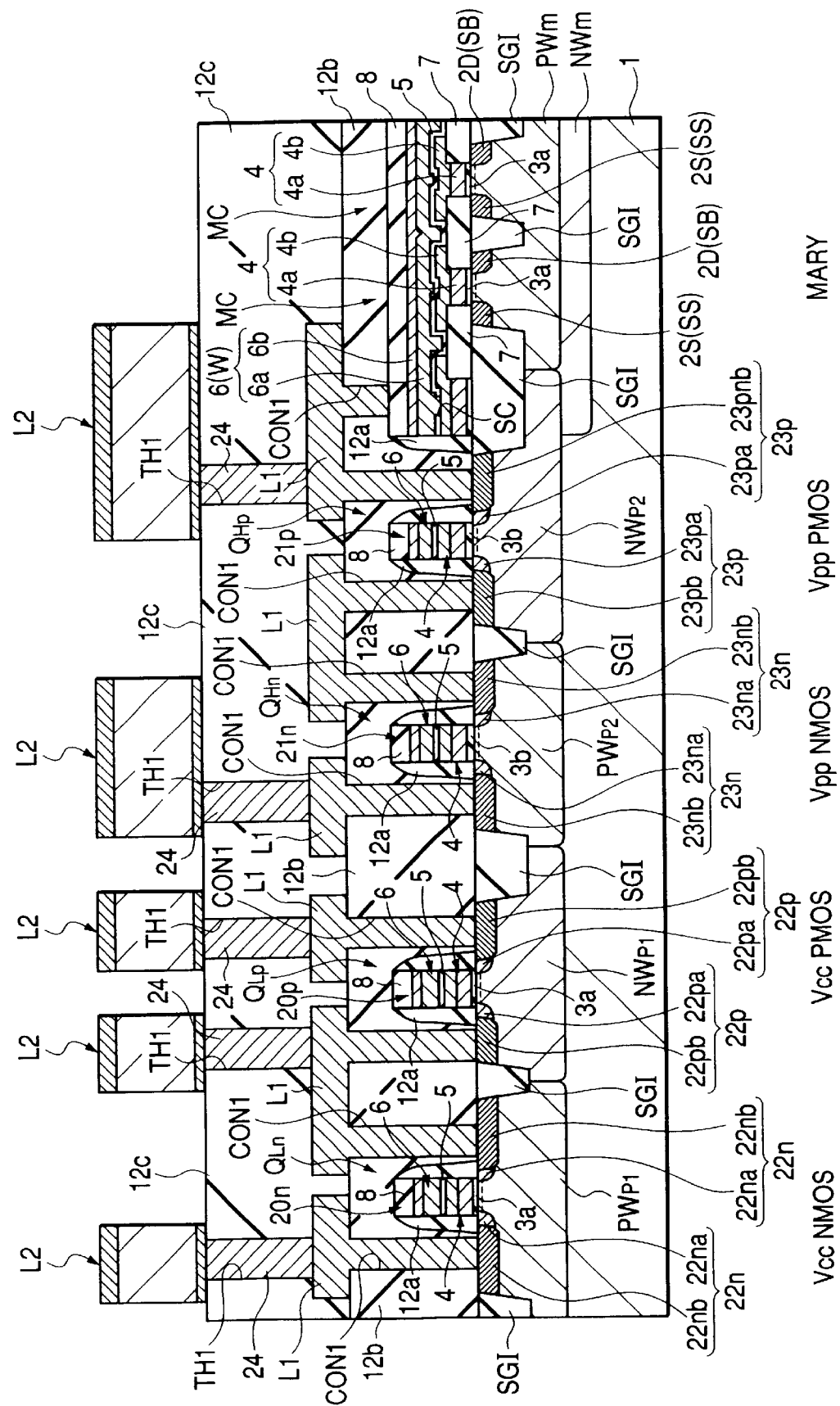

FIG. 52 is a schematic cross-sectional view of the flash memory (EEPROM) showing the same section as that shown in FIG. 24 during the same step of the manufacturing as that process shown in FIG. 51.

Figure 53:
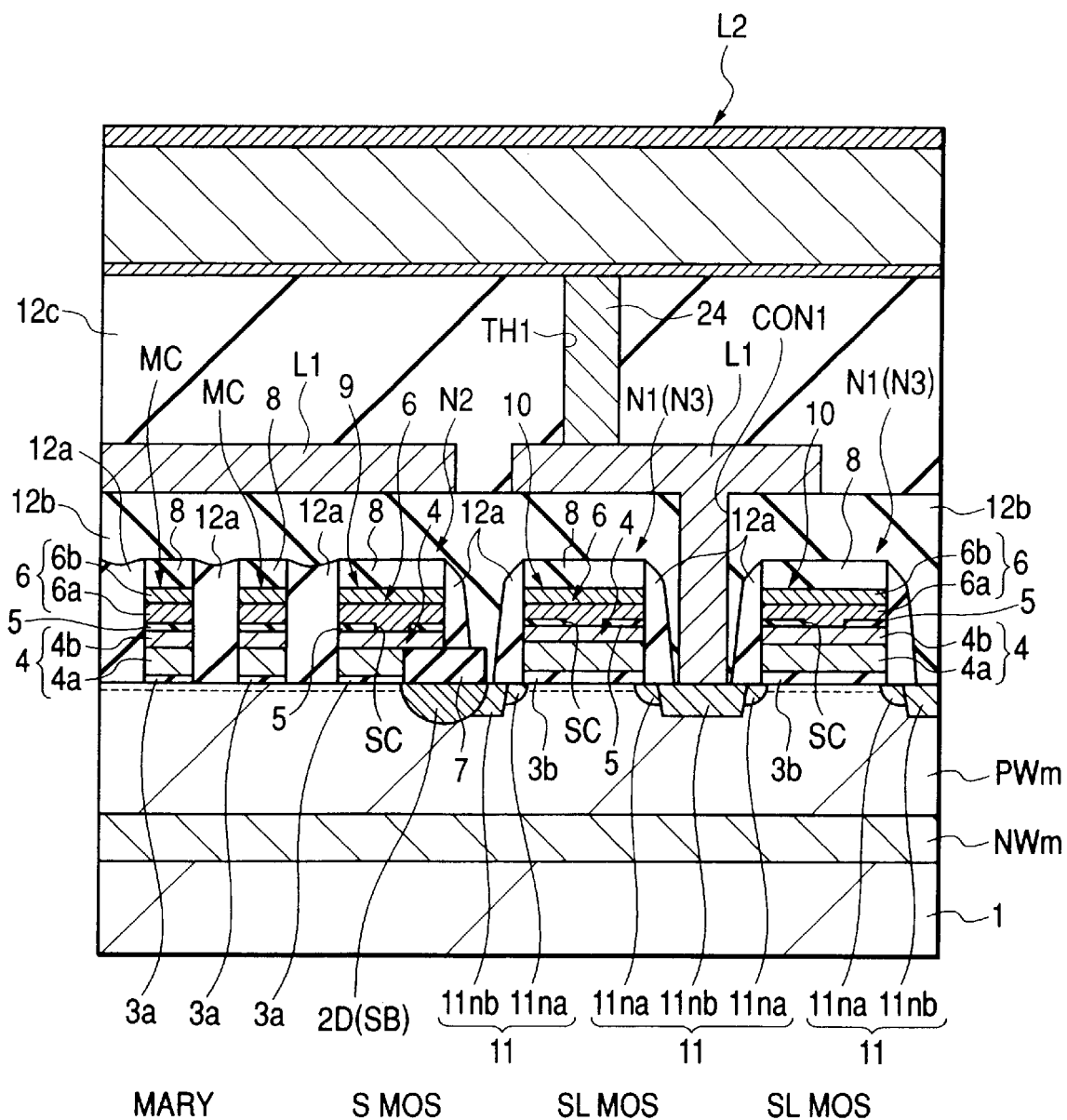

FIG. 53 is a schematic cross-sectional view of the flash memory (EEPROM) showing the same section as that shown in FIG. 25 during the same step of the manufacturing process as that shown in FIG. 51.

Figure 54:
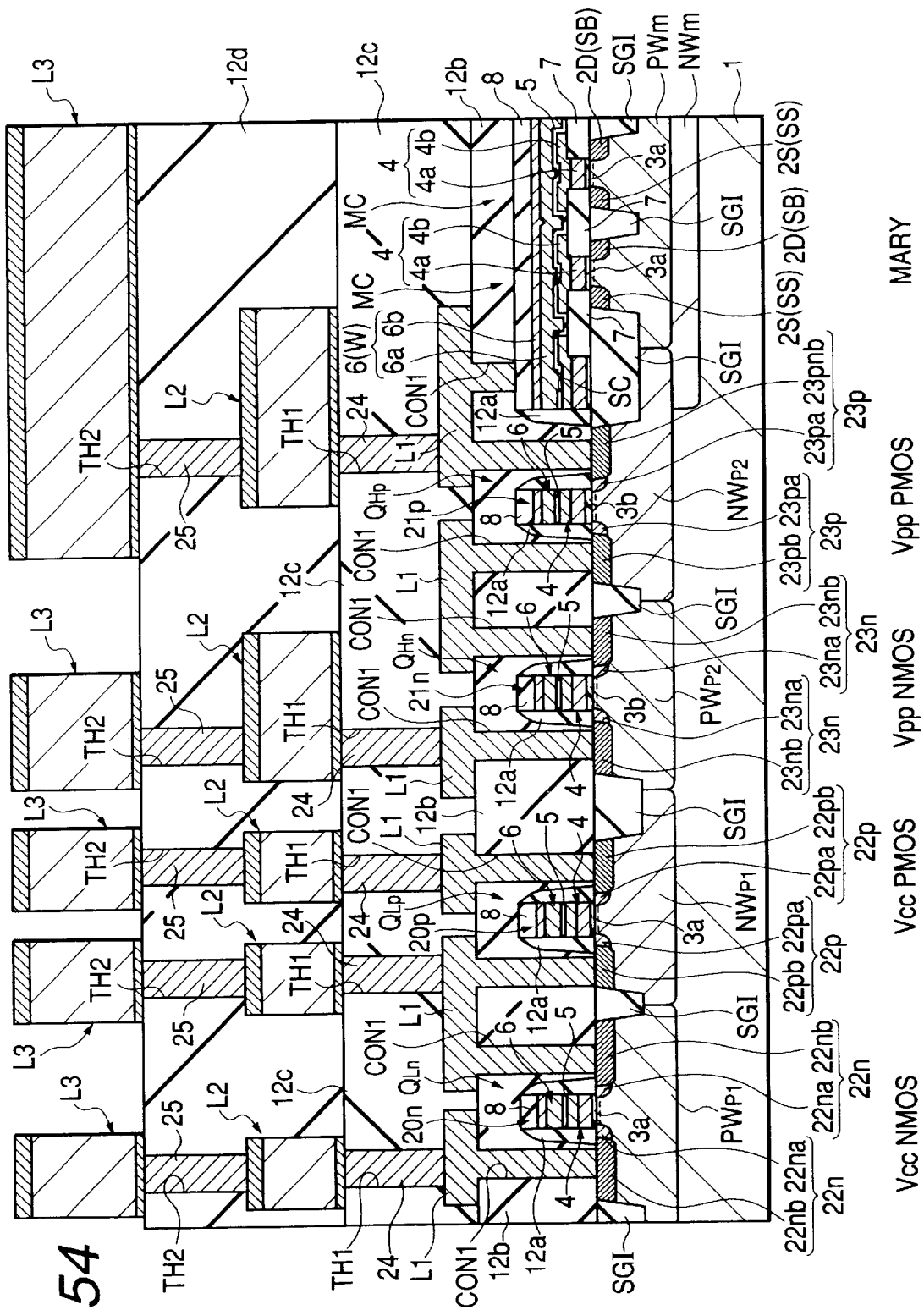

FIG. 54 is a schematic cross-sectional view of the flash memory (EEPROM) showing the same section as that shown in FIG. 24 during a step of the manufacturing process subsequent to the process step shown in FIGS. 51 to 53.

Figure 55:
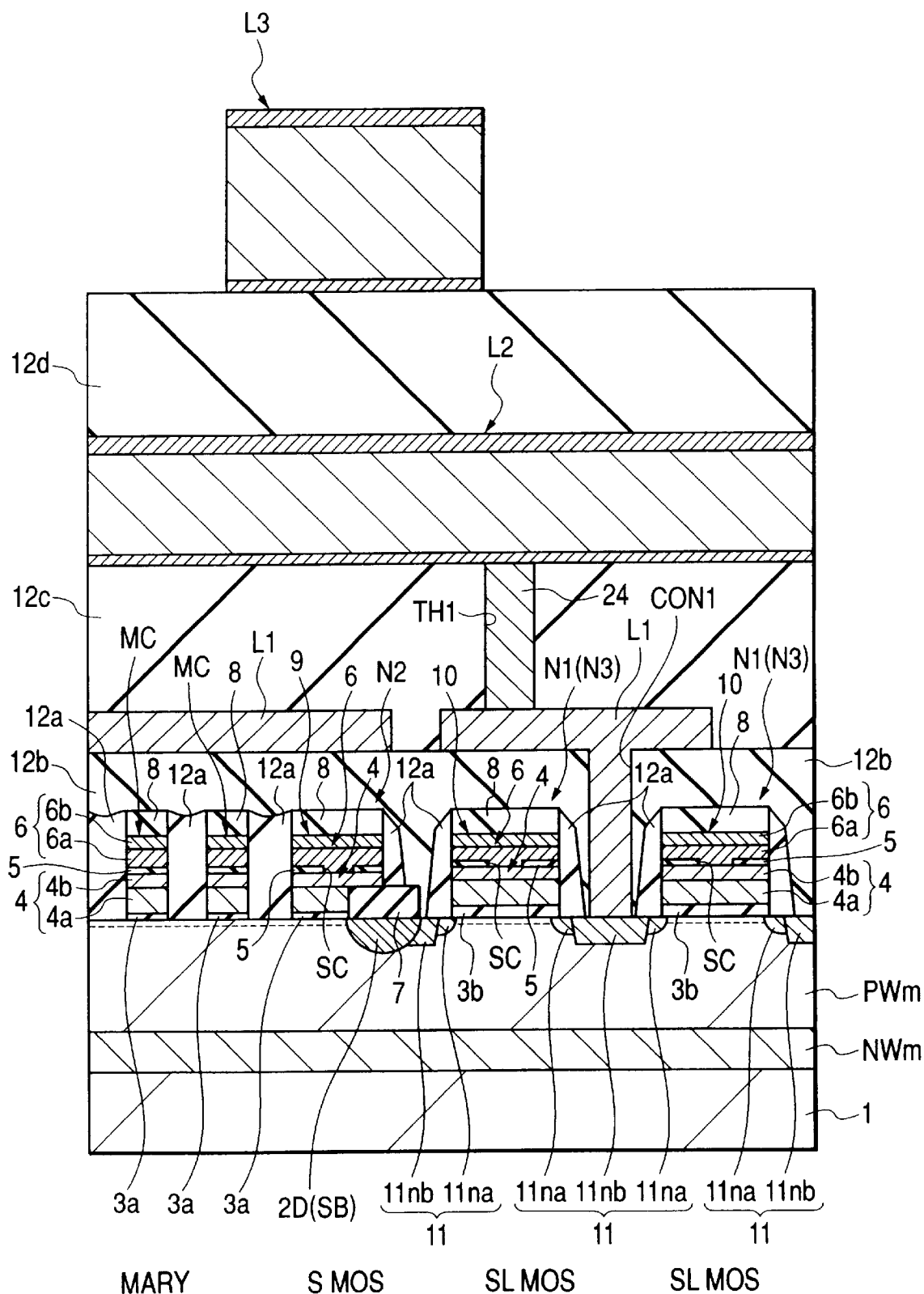

FIG. 55 is a schematic cross-sectional view of the flash memory (EEPROM) showing the same section as that shown in FIG. 25 during the same step of the manufacturing process step as that shown in FIG. 54.

Figure 56:
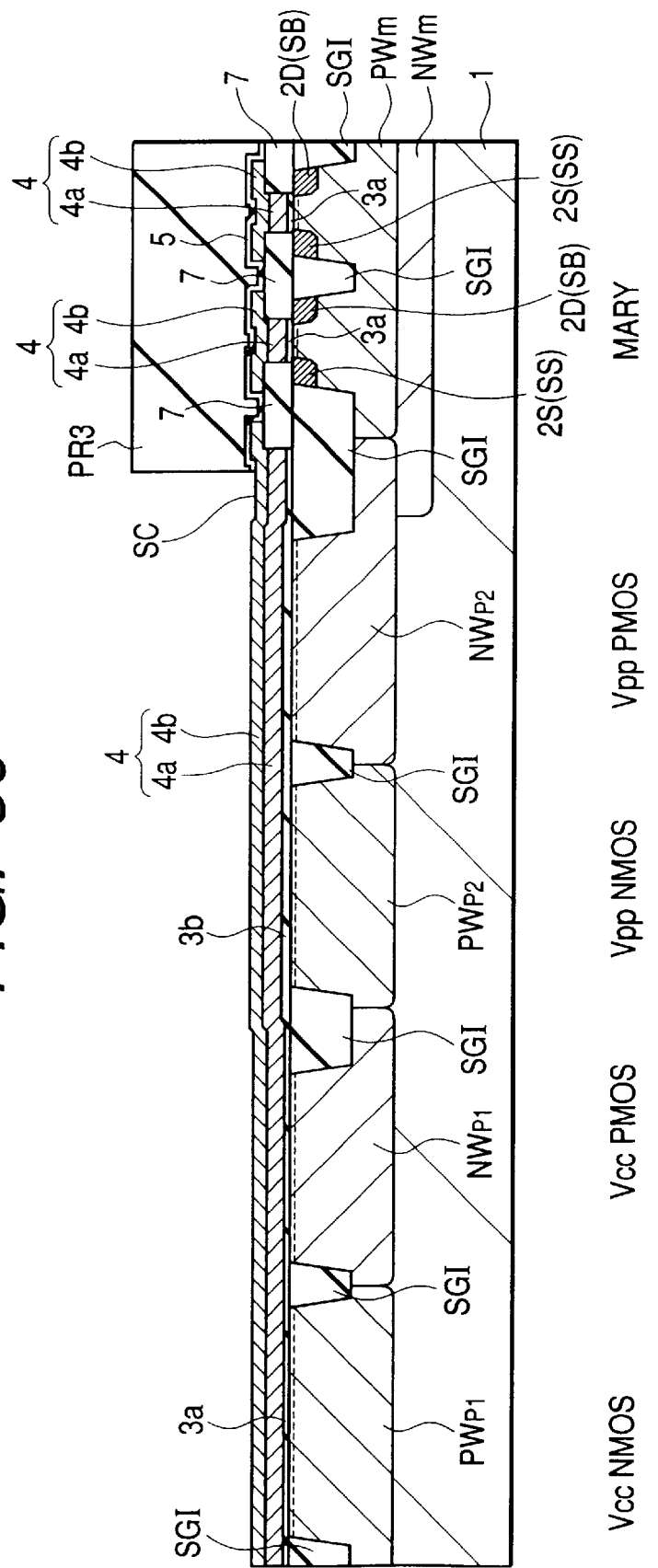

FIG. 56 is a schematic cross-sectional view of a flash memory (EEPROM) according to another embodiment of the present invention during a step of the manufacturing process.

Figure 57:
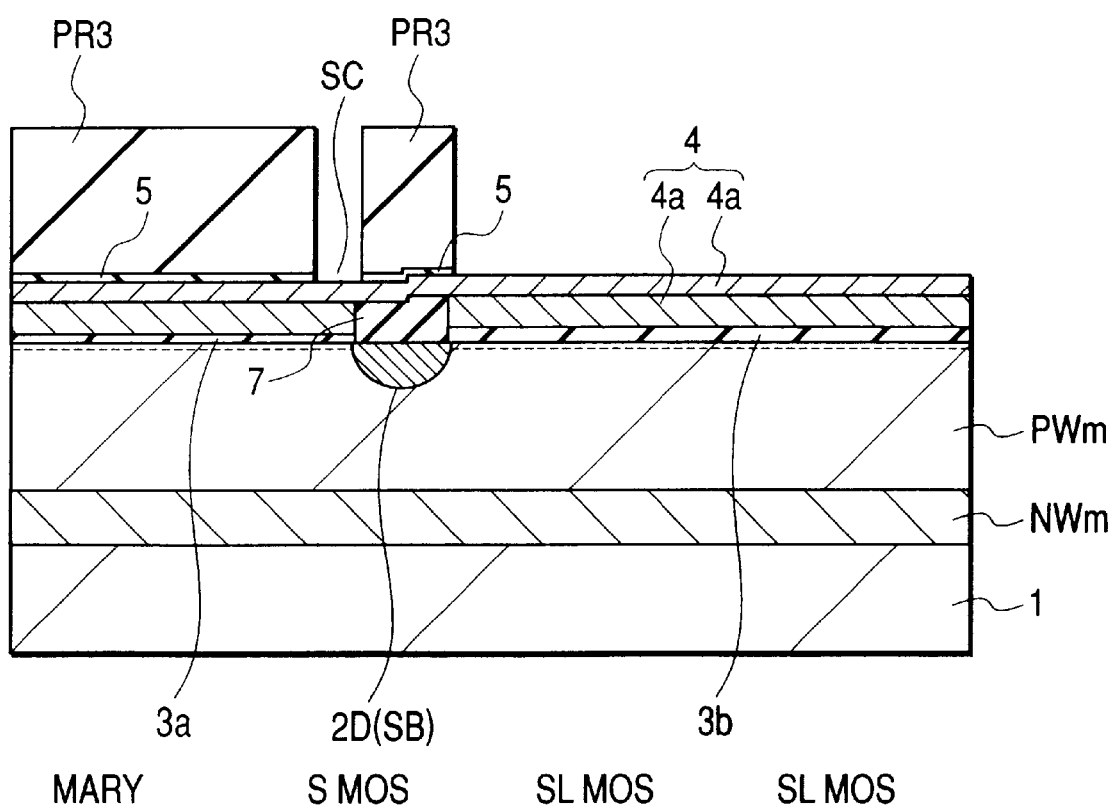

FIG. 57 is a schematic cross-sectional view of the flash memory (EEPROM) of FIG. 56 along another cutting line during the same step of the manufacturing process.

Figure 58:
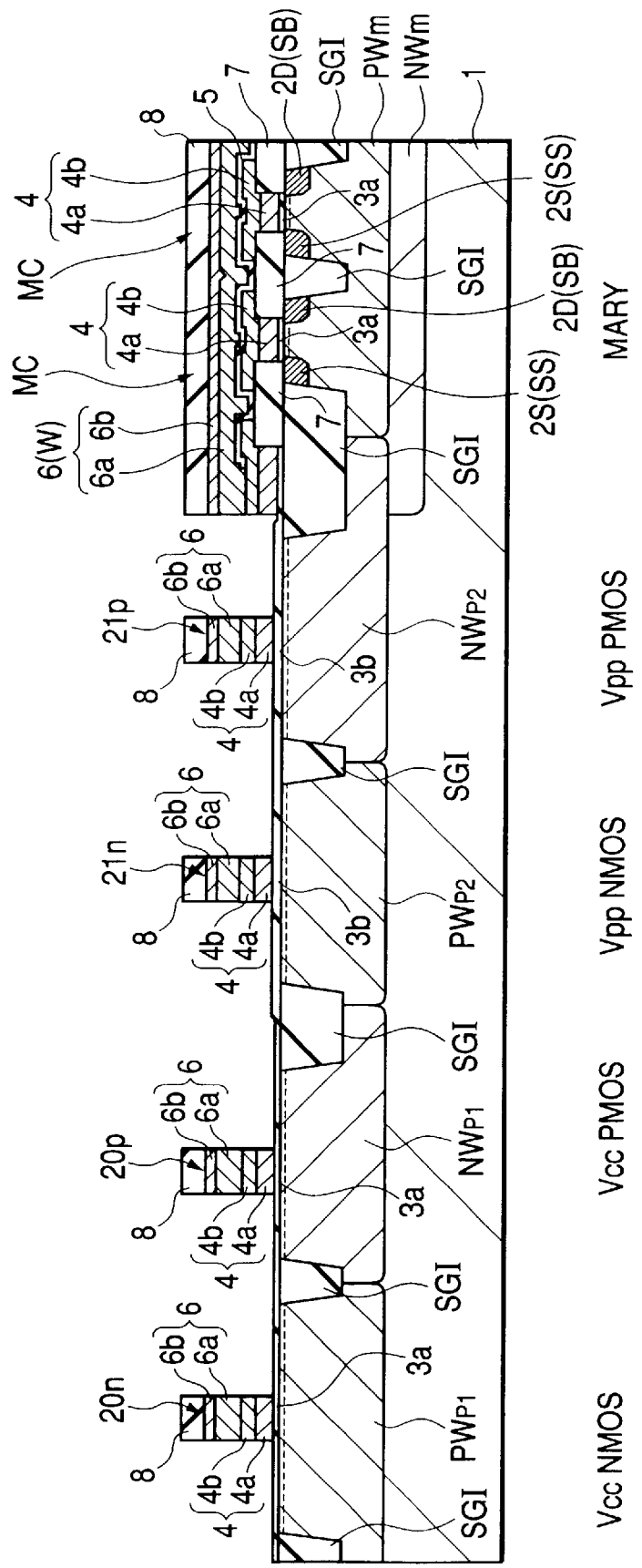

FIG. 58 is a schematic cross-sectional view of the flash memory (EEPROM) during a step of the manufacturing process subsequent to the process step shown in FIG. 56.

Figure 59:
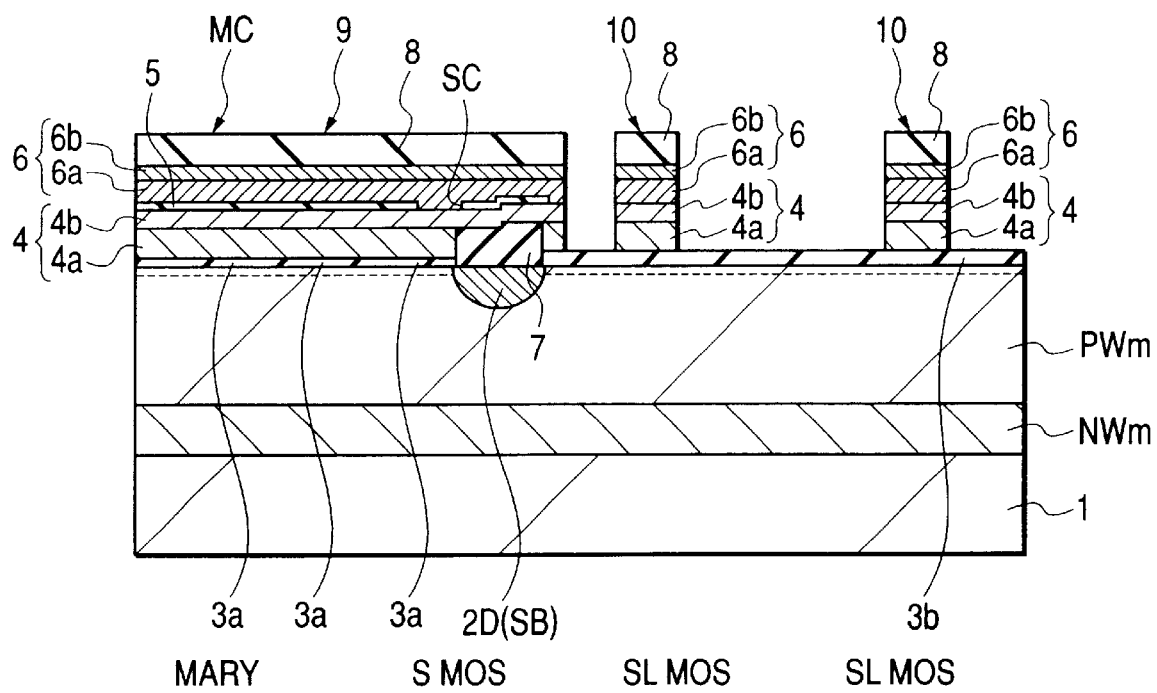

FIG. 59 is a schematic cross-sectional view of the flash memory (EEPROM) along another cutting line during the same step of the manufacturing process shown in FIG. 58.

Figure 60:
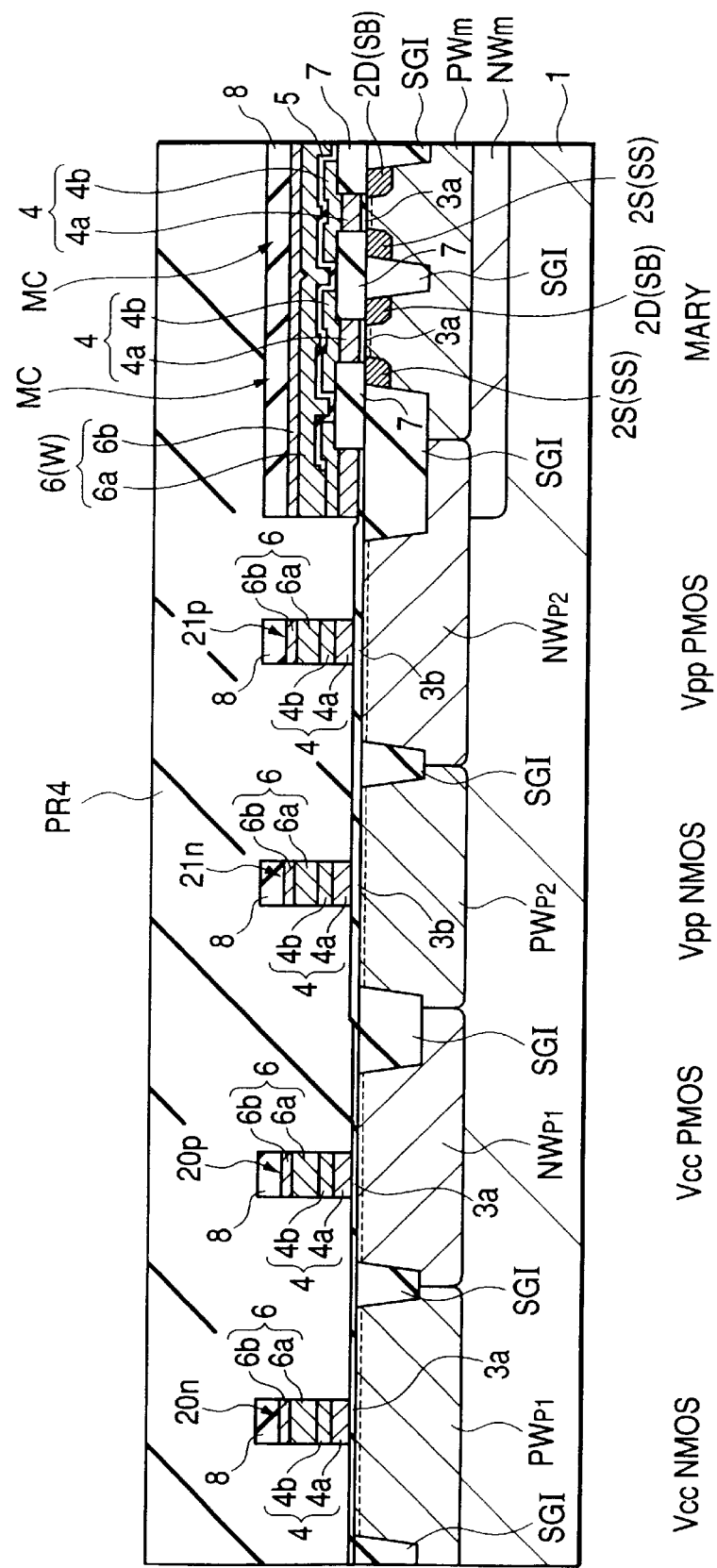

FIG. 60 is a schematic cross-sectional view of the flash memory (EEPROM) during a step of the manufacturing process subsequent to the process step shown in FIG. 58.

Figure 61:
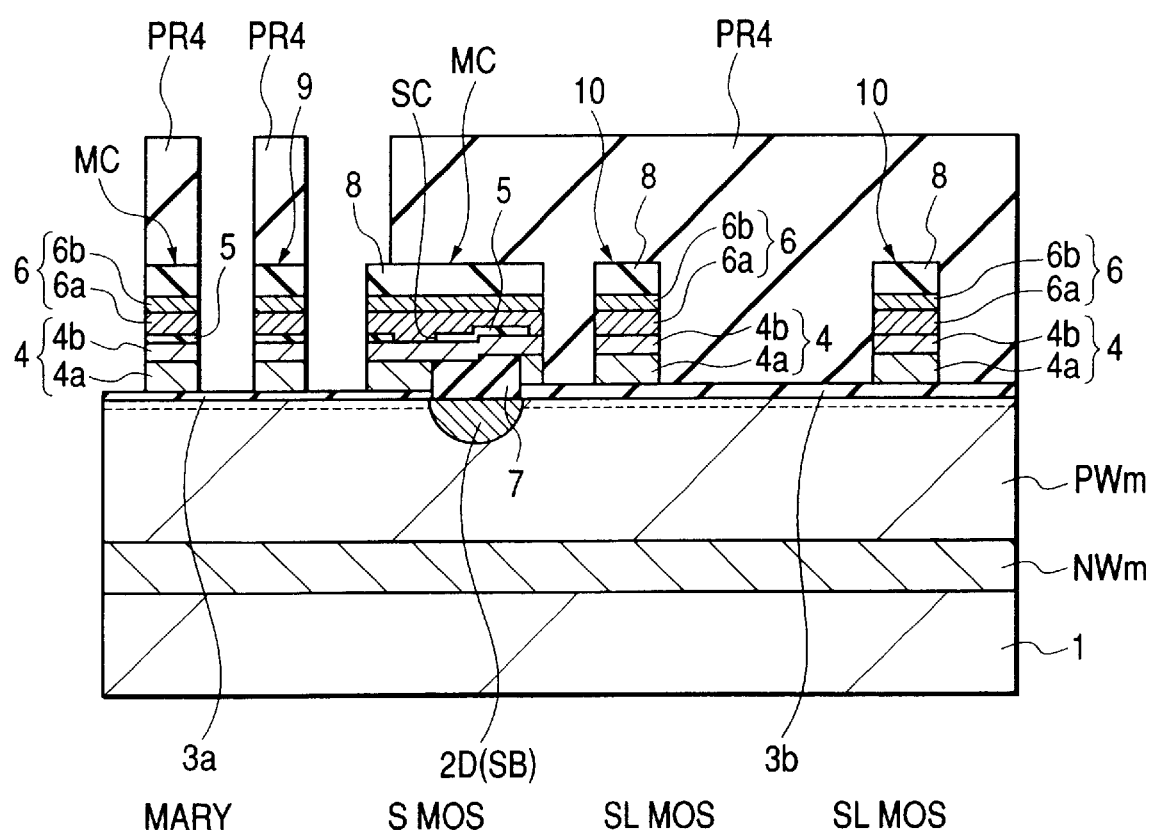

FIG. 61 is a schematic cross-sectional view of the flash memory (EEPROM) along another cutting line during the same step of the manufacturing process shown in FIG. 60.

FIG. 62 is a schematic cross-sectional view of a flash memory (EEPROM) according to still another embodiment of the present invention during a step of the manufacturing process.

FIG. 63 is a schematic cross-sectional view of the flash memory (EEPROM) during a step of the manufacturing process subsequent to the process step shown in FIG. 62.

Figure 64:
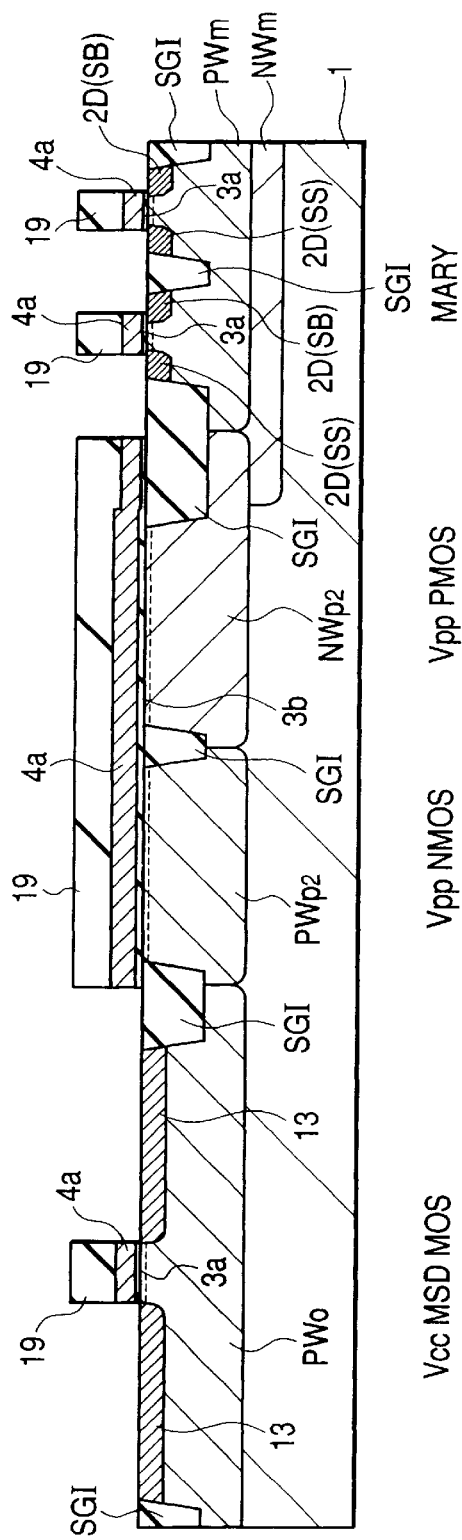

FIG. 64 is a schematic cross-sectional view of the flash memory (EEPROM) during a step of the manufacturing process subsequent to the process step shown in FIG. 63.

Figure 65:
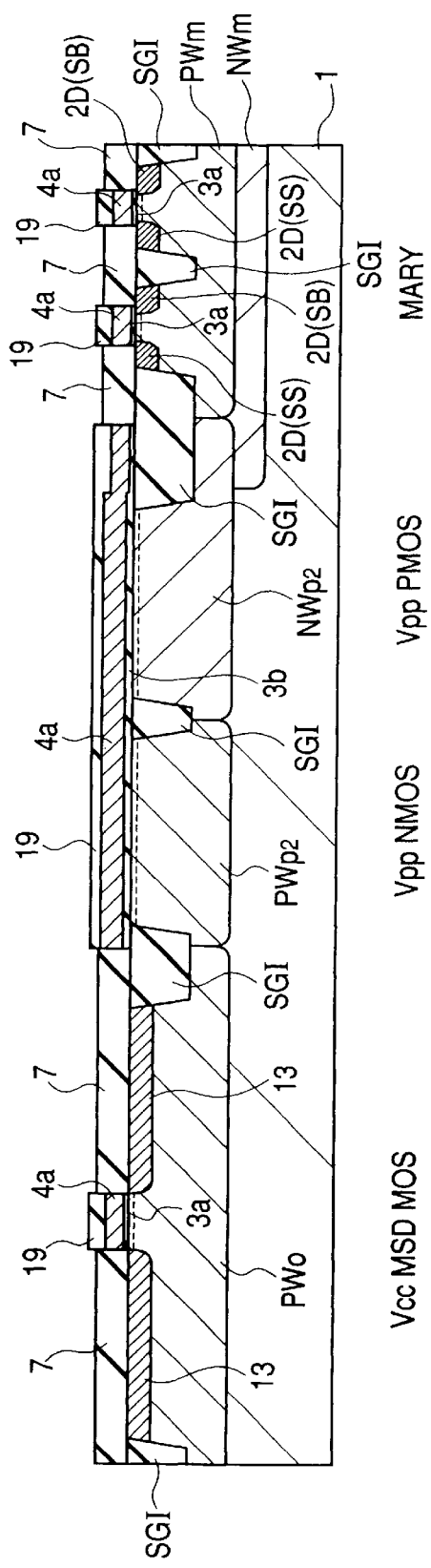

FIG. 65 is a schematic cross-sectional view of the flash memory (EEPROM) during a step of the manufacturing process subsequent to the process step shown in FIG. 64.

Figure 66:
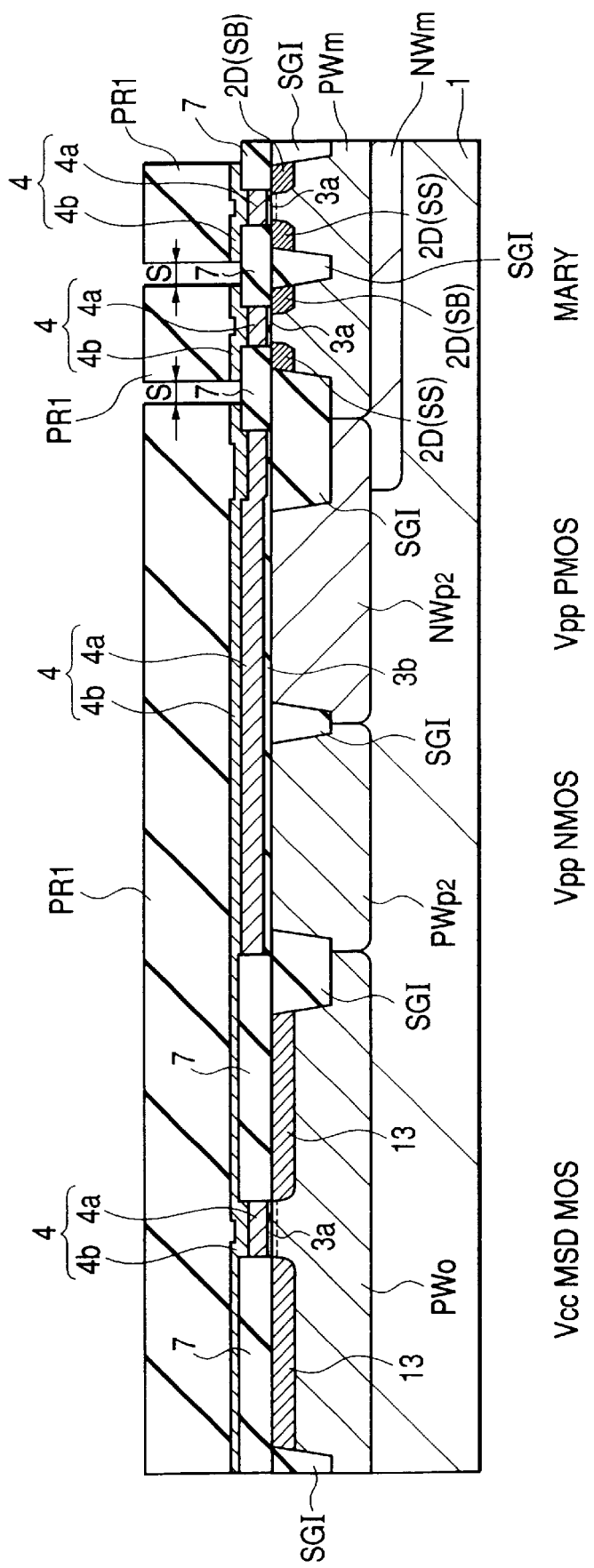

FIG. 66 is a schematic cross-sectional view of the flash memory (EEPROM) during a step of the manufacturing process subsequent to the process step shown in FIG. 65.

Figure 67:
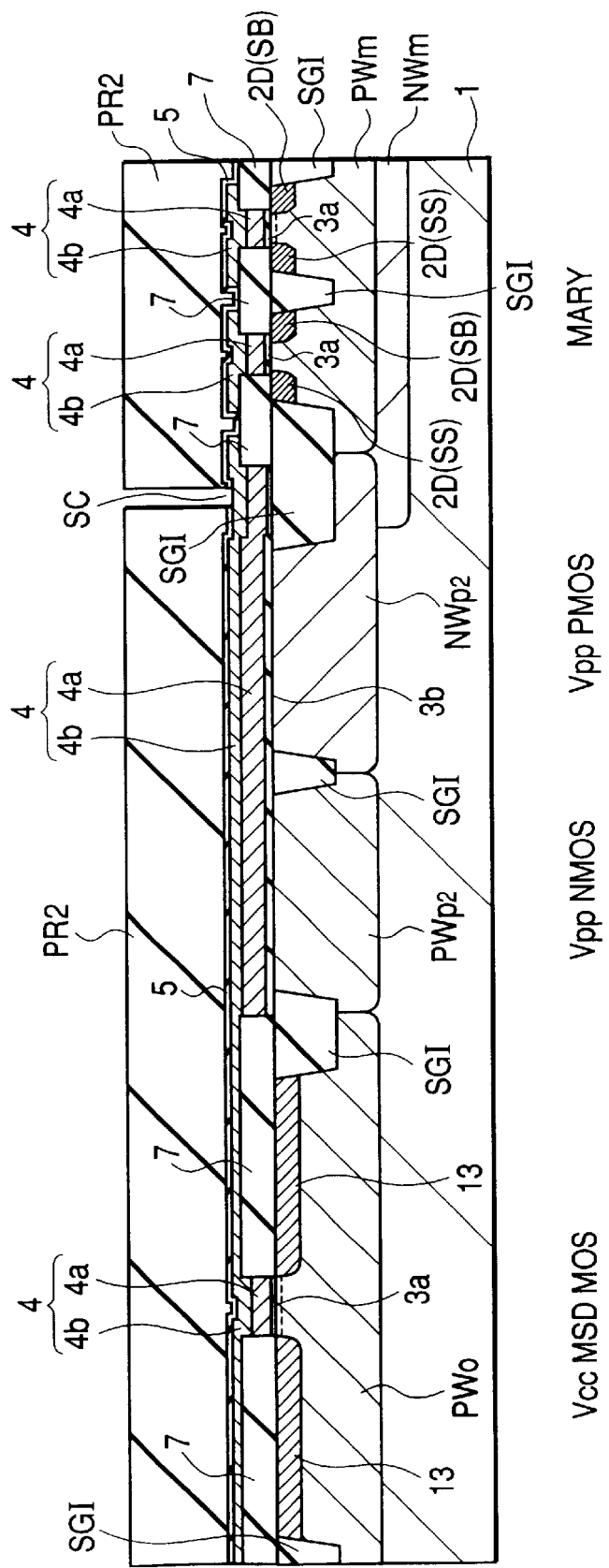

FIG. 67 is a schematic cross-sectional view of the flash memory (EEPROM) during a step of the manufacturing process subsequent to the process step shown in FIG. 66.

Figure 68:
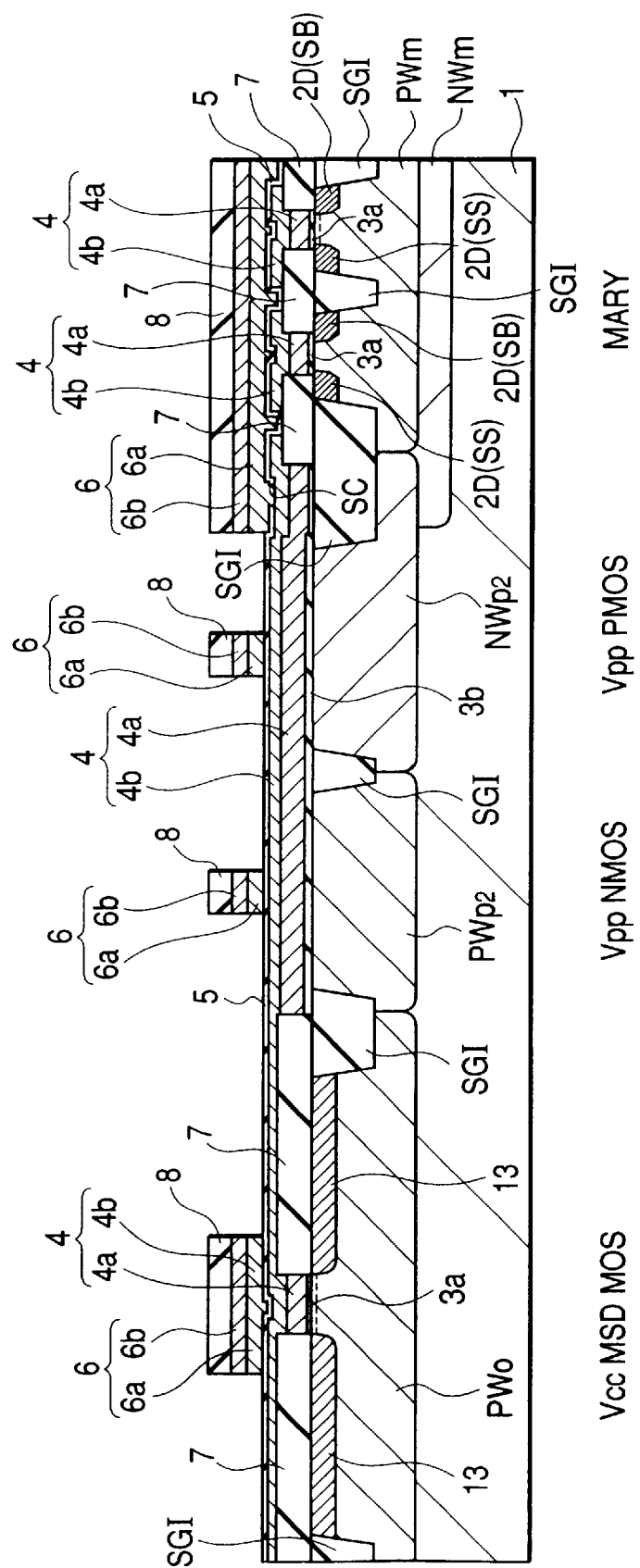

FIG. 68 is a schematic cross-sectional view of the flash memory (EEPROM) during a step of the manufacturing process subsequent to the process step shown in FIG. 67.

Figure 69:
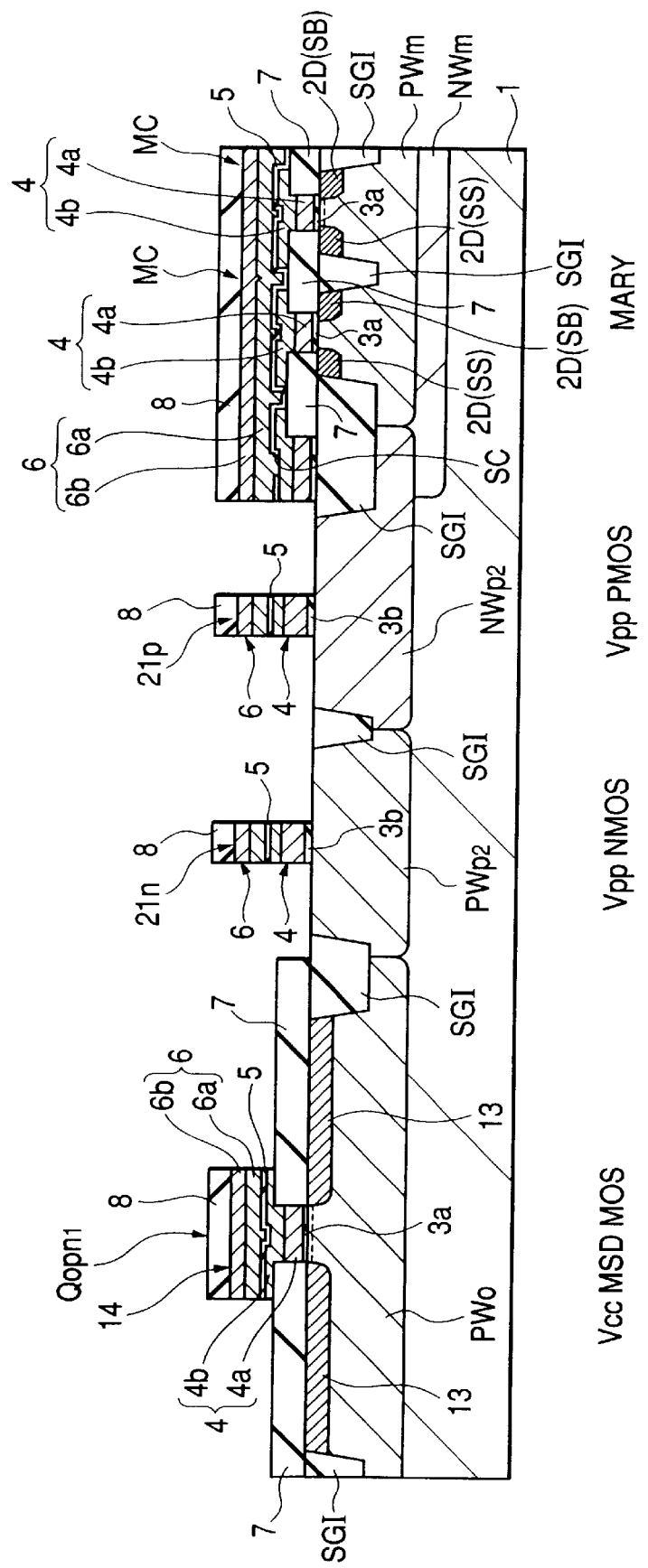

FIG. 69 is a schematic cross-sectional view of the flash memory (EEPROM) during a step of the manufacturing process subsequent to the process step shown in FIG. 68.

Figure 70:
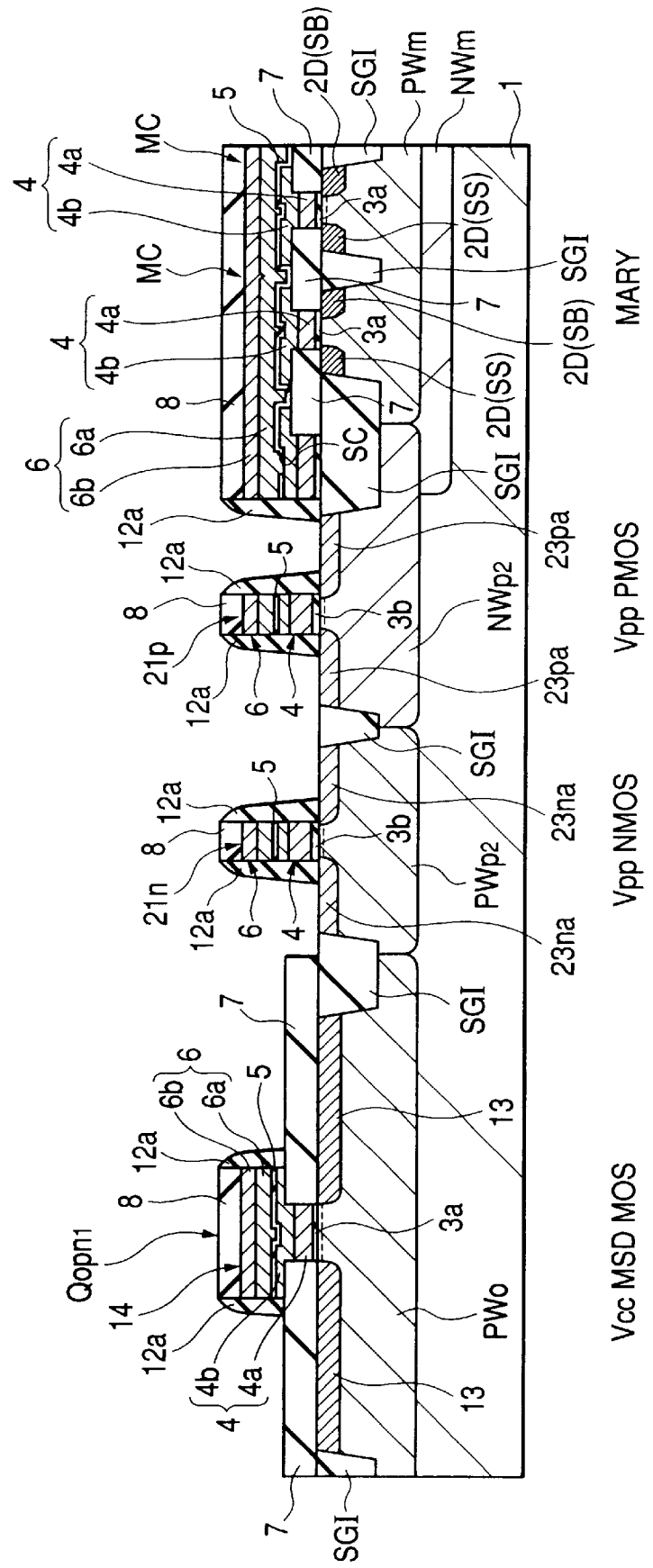

FIG. 70 is a schematic cross-sectional view of the flash memory (EEPROM) during a step of the manufacturing process subsequent to the process step shown in FIG. 69.

Figure 71:
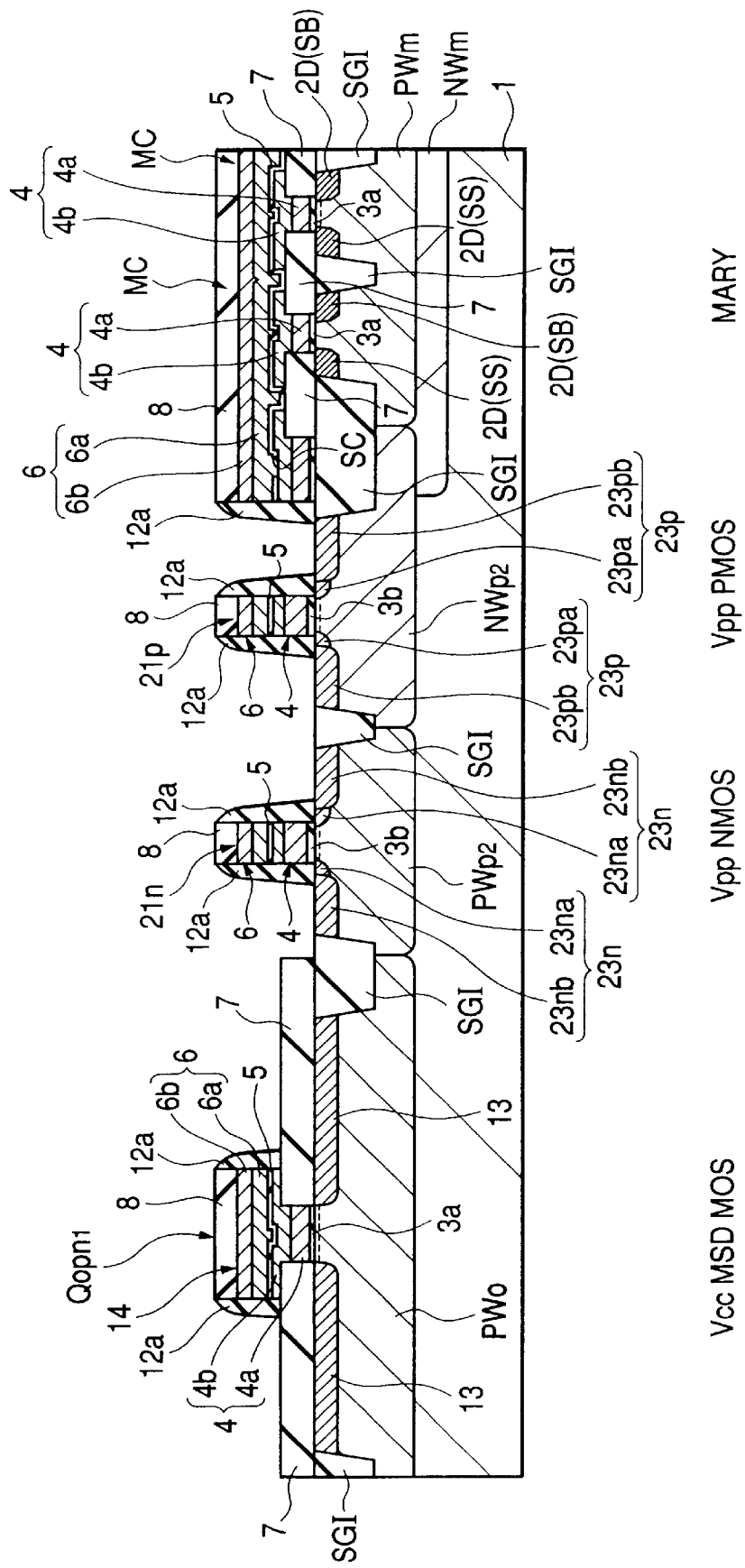

FIG. 71 is a schematic cross-sectional view of the flash memory (EEPROM) during a step of the manufacturing process subsequent to the process step shown in FIG. 70.

Figure 72:
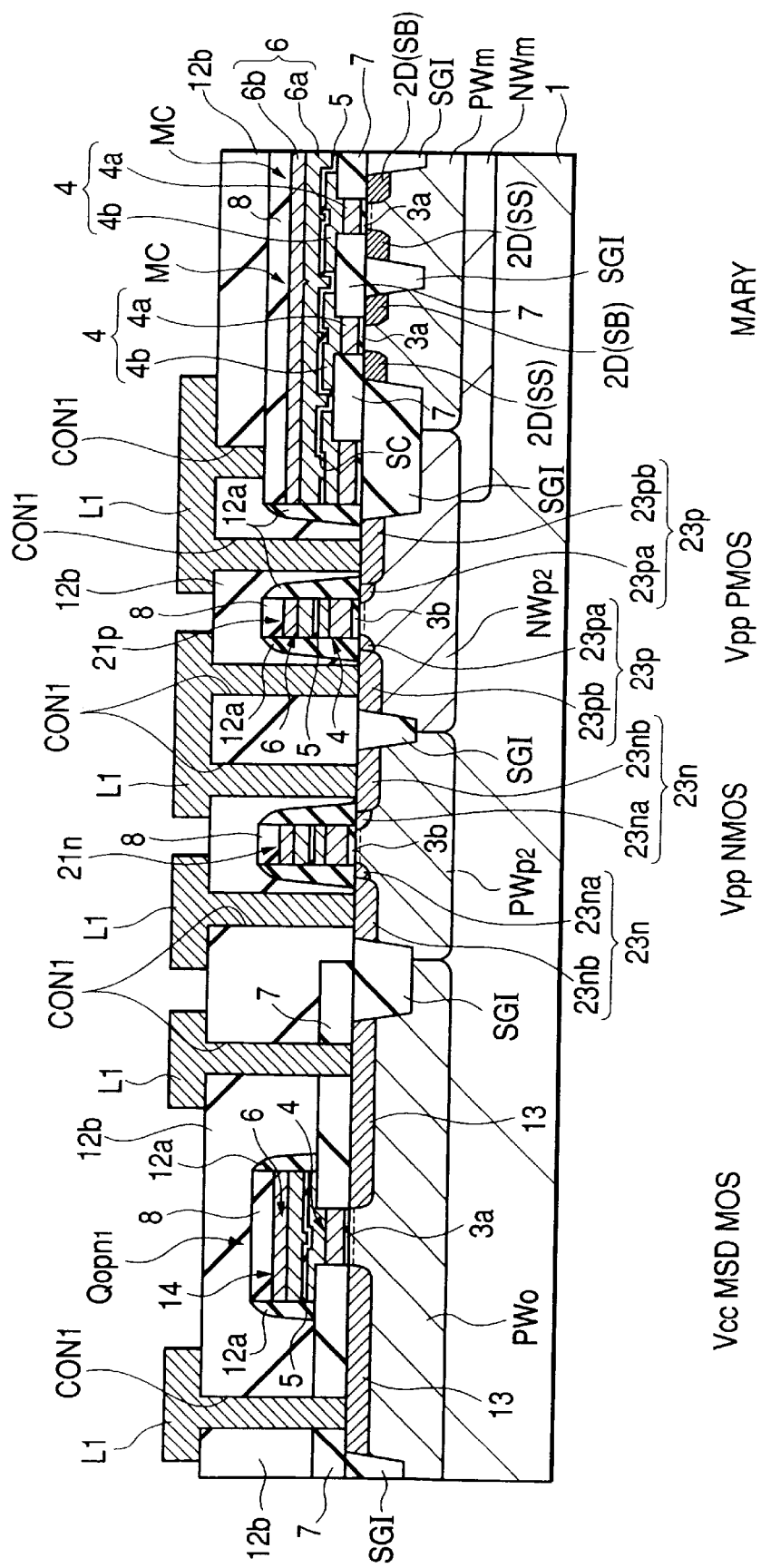

FIG. 72 is a schematic cross-sectional view of the flash memory (EEPROM) during a step of the manufacturing process subsequent to the process step shown in FIG. 71.

Figure 73:
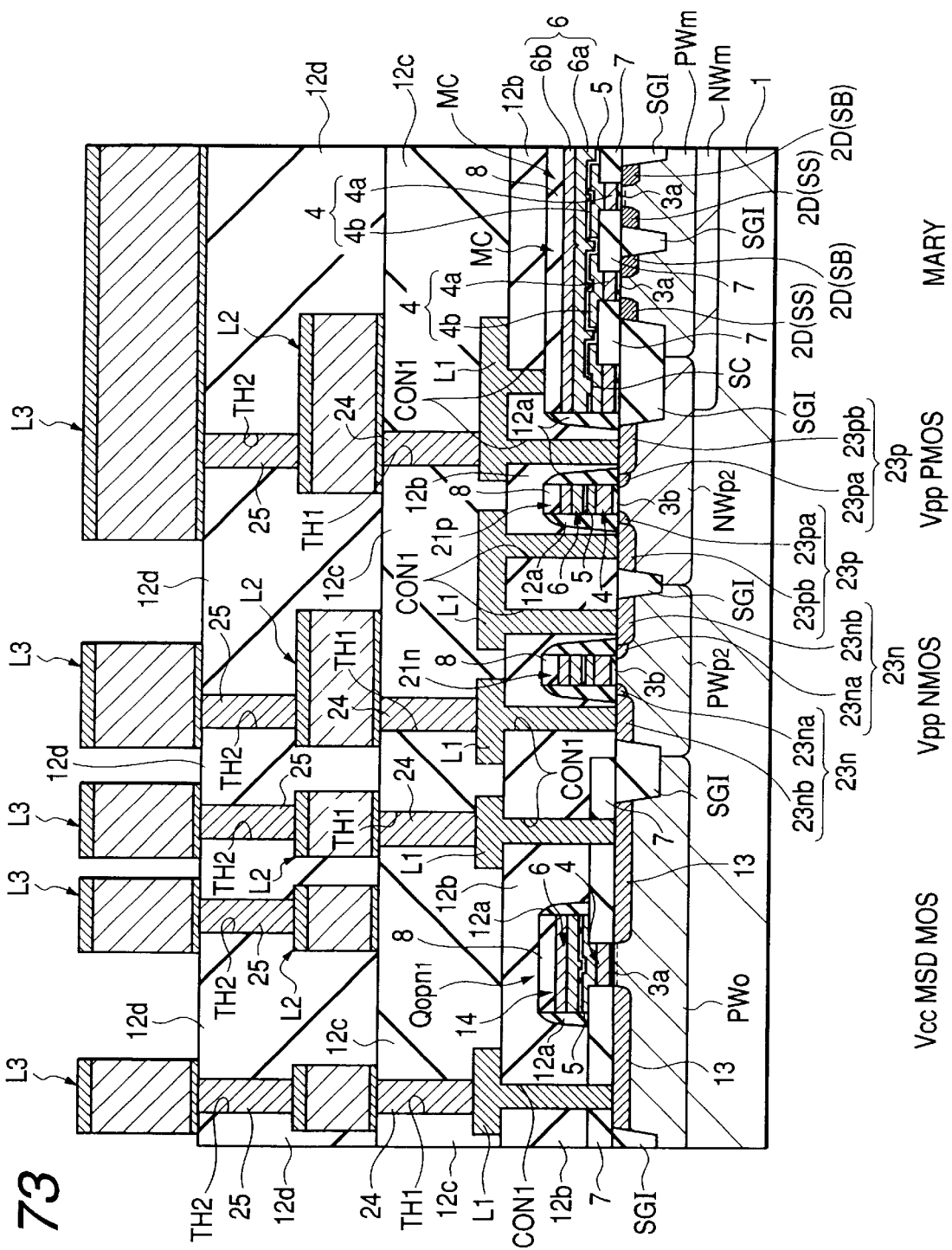

FIG. 73 is a schematic cross-sectional view of the flash memory (EEPROM) during a step of manufacturing process subsequent to the process step shown in FIG. 72.

DESCRIPTION OF THE PREFERRED EMBODIMENTS

Now, various embodiments of the present invention will be explained in detail with reference to the drawings.

For better understanding of the embodiments, those elements having the same functions are referred to using the same numerals through all of the figures, and detailed descriptions thereof will not be repeated.

In the preferred embodiments of the present invention, a field-effect transistor generally refers to a MISFET or MOSFET (metal oxide semiconductor field-effect transistor). As used herein, a MOSFET is simply referred to as a "MOS"; accordingly, a p-channel type MOS-FET is referred to as a "pMOS", and an n-channel type MOSFET is referred to as a "nMOS". Similarly, a MISFET is simply referred to as a "MIS"; accordingly, a p-channel type MISFET is referred to as a "pMIS", and an n-channel type MISFET is referred to as a "nMIS". For the purpose of explanation, the term "MOS" as used in the following description refers to both a MIS and a MOS.

Embodiment 1

The first embodiment of the present invention will be explained with reference to a flash memory (EEPROM) having a memory capacity of 512 megabits. However, the present invention is not limited to a memory having a capacity of 512 megabits, since the present invention may also be applied to various types of memories, such as those having smaller capacities (i.e. 256 megabits) or larger capacities (i.e. larger than 512 megabits).

Figure 1:
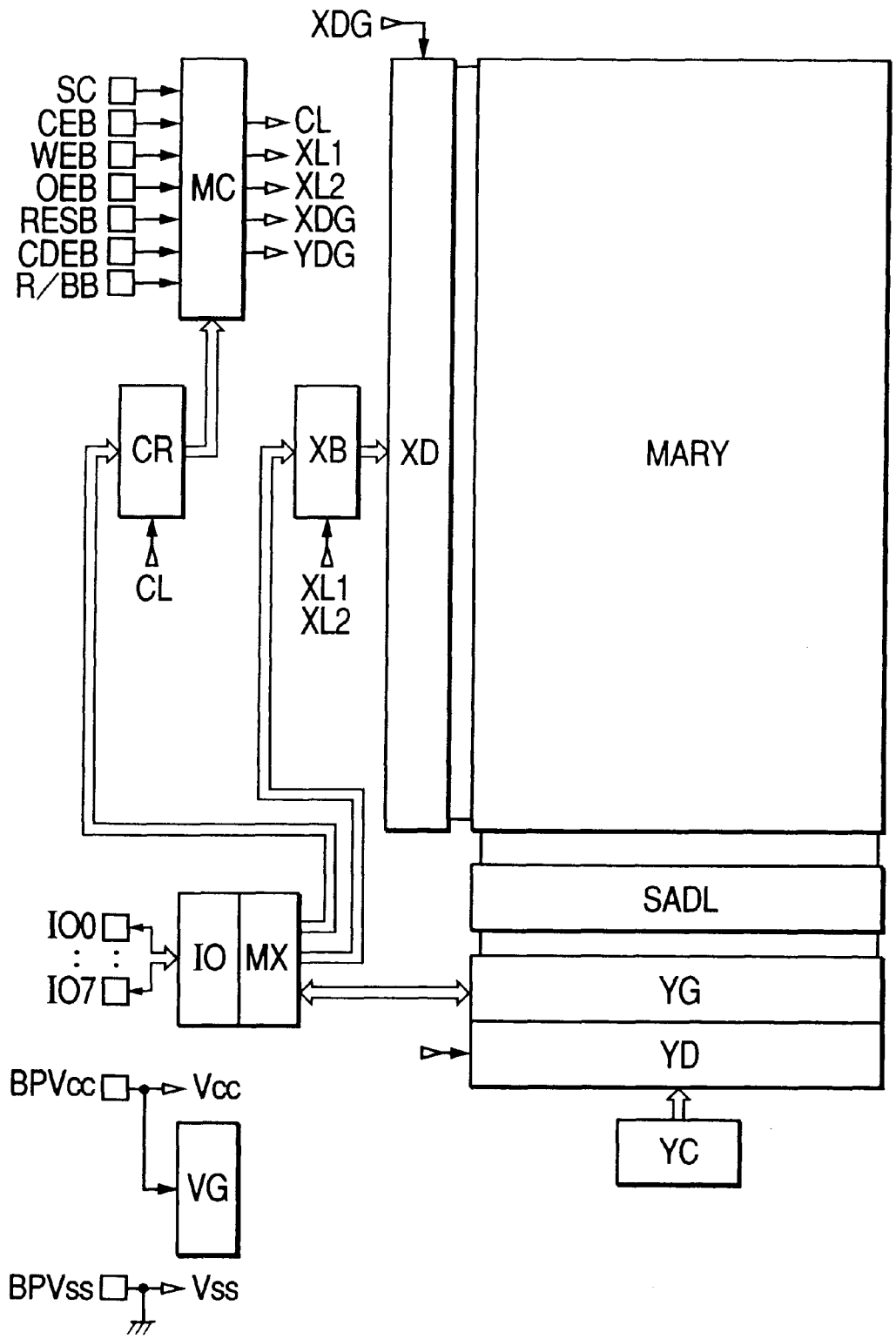
FIG. 1 is block diagram showing the structure of a flash memory (EEPROM) according to one embodiment of the present invention.

FIG. 1 shows a block diagram of a flash memory (EEPROM) according to one embodiment. First, with reference to this figure, the configuration and operation of the flash memory (EEPROM) according to Embodiment 1 will be outlined.

As shown in FIG. 1, the flash memory (EEPROM) of Embodiment 1 comprises a memory cell array MARY as its fundamental component, and further includes an X-address decoder XD, a sense amplifier data latch SADL, a Y-gate circuit YG and a Y-address decoder YD that constitute the direct peripheral circuits thereto.

The memory array MARY is arranged over a major portion of the principal surface of a semiconductor substrate (a small thin plate made of a semiconductor material having the shape of a flat square, which herein will be referred to as a semiconductor chip), and, as will be later explained, the array has a given number of word lines arranged in parallel to the horizontal direction of the diagram, a given number of bit lines arranged in parallel to the vertical direction of the diagram, and a large number of memory cells having the double-level gate structure arranged in a matrix array substantially at the intersections of these word lines and bit lines. These memory cells are grouped into cell units, each of which includes m+1 cells arranged in the same column, and every one of the n+1 cell units constitutes a memory cell block. The flash memory (EEPROM) in Embodiment 1 employs a hierarchical bit line scheme, so that the bit lines of the memory array MARY comprises sub-bit lines each constituted by commonly coupling the drains of m+1 memory cells which form each cell unit, and main bit lines to which p+1 sub-bit lines arranged in the same column are selectively connected via drain-side select on MOSs.

The sources of m+1 memory cells which constitute each cell unit of the memory cell array MARY are commonly coupled to a corresponding local source line, respectively, and these local source lines are coupled to common source lines via corresponding source-side selection MOSs. The control gates of n+1 memory cells arranged in the same row of the memory array MARY are commonly coupled to a corresponding word line, respectively, and the gates of the selection MOSs on the side of drains and on the side of sources are commonly coupled, respectively, to corresponding bits of p+1 block selection signal lines on the side of the drains or on the side of the sources that are arranged in parallel to the word lines.

In Embodiment 1, each cell unit of the memory array MARY further comprises an n-channel type short MOS provided between the sub-bit lines and the local source lines, that is, between the drains and sources of m+1 memory cells that have been commonly coupled. The gates of each of the n+1 short MOSs arranged on the same row are commonly coupled to a corresponding block selection signal line for the short MOSS. A specific configuration and the operation of the memory array MARY and the effect and the device structure etc. of the short MOS provided to each cell unit will be explained in detail later.

The word lines of the memory array MARY, which comprise drain-side block selection signal lines, source-side block selection signal lines and short MOS block selection signal lines, are coupled on their left side to the X-address decoder XD, and each of them is selectively set in a selected level or a non-selected level. To the X-address decoder XD, internal X-address signals having a given number of bits are supplied from the X-address buffer XB. Moreover, internal control signals XDG are supplied from the memory control circuit MC, and various internal voltages are supplied from the internal voltage generating circuit VG. X-address signals are supplied to the X-address buffer XB from data input/output terminals IO0 through IO7 via a data input/output circuit IO and a multiplexer MX, and internal control signals XL1, XL2 are supplied from the memory control circuit MC.

Although the invention is not so limited, in Embodiment 1, an X-address signal holds more than 8 bits, and it is supplied time-divisionally from the data input/output terminals IO0–IO7 in two cycles. The lower order bits of the X-address signal inputted by the first cycle are taken, according to the internal control signal XL1, into the lower order bits of the x-address buffer XB, and the higher order bits of the X-address signal inputted by the second cycle are taken, according to the internal control signal XL2, into the higher order bits of the X-address buffer XB. The X-address buffer XB forms internal X-address signals comprising inverted and non-inverted signals based on these X-address signals and supplies them to the X-address decoder XD.

The X-address decoder XD decodes the internal X-address signals supplied from the X-address buffer XB and selectively sets the corresponding word lines of the memory array MARY to a given selection level; and, at the same time, it sets the above-mentioned drain-side block selection signal lines, source-side block selection signal lines and short MOS block selection signal lines to a given valid level in order to selectively activate specified memory cell blocks.

Next, the main bit lines which form the memory array MARY are coupled, at their bottom ends, to corresponding unit circuits of the sense amplifier data latch SADL. The sense amplifier data latch SADL comprises n+1 unit circuits provided correspondingly to the respective main bit lines of the memory array MARY, and each unit circuit includes a unit sense amplifier serving as a read circuit and a unit data latch which holds read or write data, and which, at the same time, serves as a write circuit. The input/output terminals on one side of unit circuits of the sense amplifier data latch SADL are coupled to corresponding main bit lines of the memory array MARY, and the input/output terminals on the other side are coupled to the multiplexer MX via Y-gate circuit YG selectively by each of eight terminals, that is, by each 1 byte.

Now, the multiplexer MX comprises a first input/output terminal provided on the left side thereof, and second and third output terminals and a fourth input/output terminal provided on the right side thereof. Among them, the fourth input/output terminal which is provided on the right side is selectively connected to the other input/output terminals of specified eight unit circuits of the sense amplifier data latch SADL via Y-gate circuit YG, and the first input/output terminal provided on the left side is coupled to the right side input/output terminal of the data input/output circuit IO. The second output terminal is coupled to an input terminal of the command register CR, and the third output terminal is coupled to the input terminal of the X-address buffer XB. The left-side input/output terminals of the data input/output circuit IO are coupled to the data input/output terminals IO0–IO7.

To the unit sense amplifier included in each of the unit circuits of the sense amplifier data latch SADL, an internal control signal SA (not shown) is commonly supplied from the memory control circuit MC, and, to the unit data latch, an internal control signal TR (not shown) is supplied from the memory control circuit MC. To the command register CR, an internal control signal CL is supplied from the memory control circuit MC, and a bit-line selection signal (not shown) of a given bit is supplied to the Y-gate circuit YG from Y-address decoder YD. To the Y-address decoder YD, an internal Y address signal of a given bit is supplied from the Y-address counter YC, and an internal control signal YDG is supplied from the memory control circuit MC.

When the flash memory is in a read mode, each of the unit sense amplifiers of the sense amplifier data latch SADL is activated selectively according to the internal control signal SA, amplifies a read signal outputted from n+1 memory cells coupled to a selected word line of the memory array MARY via a corresponding main bit line, and determines its logic level to transmit it to the corresponding unit data latch. This read data is sequentially selected by every 1 byte, or 8 bits, via the Y-gate circuit YG, and is outputted to an external accessing device from the multiplexer MX via the data input/output circuit IO and the-data input/output terminals IO0–IO7.

On the other hand, when the flash memory (EEPROM) is in a write mode, each of the unit data latches of the sense amplifier data latch SADL sequentially receives and holds write data inputted serially by every 1 byte, or 8 bits, from an external accessing device via the data input/output terminals IO0–IO7, the data input/output circuit IO, the multiplexer MX and the Y-gate circuit YG; and, when capturing of the write data of n+1 bits is completed, it converts this write data into a given write signal, and writes it at once into the n+1 selection memory cells coupled to the selected word line of the memory array MARY via each of the main bit lines.

In the flash memory (EEPROM) according to Embodiment 1, the data writing operation is performed by utilizing, for example, the FN tunneling effect; and, during this write operation, a write voltage supplied to each of the main bit lines of the memory array MARY is set at a first write voltage, such as ground potential VSS, or 0V, when the corresponding bit of the write data is logic 1, in other words, when writing is to be practically performed to a selected memory cell. On the other hand, when the corresponding bit of the write data is logic 0, or when writing should not practically occur to the selected memory cell, then the voltage is set at a second write voltage such as +6v, for example. The writing operation of the flash memory (EEPROM) will be described later in detail.

The Y-address counter YC performs a stepping operation according to an internal clock signal (not shown), and by forming an internal Y-address signal having a given number of bits and decoding the internal Y-address signal supplied from the Y-address counter YC, the bit lines corresponding to a bit line selection signal for the Y-gate circuit YG are sequentially turned into a high level alternatively. Furthermore, the Y-gate circuit YG, in response to the alternative high level of the bit line selection signal, sequentially selects corresponding eight unit circuits of the sense amplifier data latch SADL to selectively provide a connection between the multiplexer MX and the data input/output circuit IO.

The data input/output circuit IO transmits the X-address signal, write data and command data inputted from the external accessing device via the data input/output terminals IO0–IO7 to the multiplexer MX, and, at the same time, outputs the read data transmitted from the Y-gate circuit YG via the multiplexer MX to the external accessing device via the data input/out terminals IO0–IO7. Multiplexer MX transmits the X-address signal, write data and command data supplied from the data input/output circuit IO to the corresponding X-address buffer XB, the Y-gate circuit YG, or the command register CR, and at the same time, transmits 8-bit read data outputted from specified eight unit circuits of the sense amplifier data latch SADL via the Y-gate circuit YG to the data input/output circuit IO.

The command register CR receives and holds the 8-bit command data inputted from the data input/output terminals IO0–IO7 via the data input/output circuit IO and the multiplexer MX according to the internal control signal CL, and, at the same time, transmits the data to the memory control circuit MC. The memory control circuit MC is constituted by a microprogram-type state machine and selectively forms the various internal control signals based on a serial clock signal SC, chip enable signal CEB (herein, those inverted signals etc. which are selectively set at a low level when they are valid are indicated by the suffix "B" after their symbols), write enable signal WEB, output enable signal OEB, reset control signal RESB and command data enable signal CDEB supplied by the external accessing device as execution control signals, and the command data supplied by the command register CR, and then supplies them to each of the sections of the flash memory (EEPROM). It also selectively generates a ready/busy signal R/BB to inform the external accessing device of the availability of the flash memory (EEPROM).

The internal voltage generating circuit HVD selectively generates various internal voltages representing the selected or unselected level of the word lines, drain-side block selection signal lines, source-side block selection signal lines, and short MOS block selection signal lines based on the power source voltage VCC on the higher potential side supplied via an external terminal (bonding pad BP VCC) and the ground potential VSS on the lower potential side supplied via at external terminal (bonding pad BP VSS), and supplies them to the X-address decoder XD etc.

Figure 2:
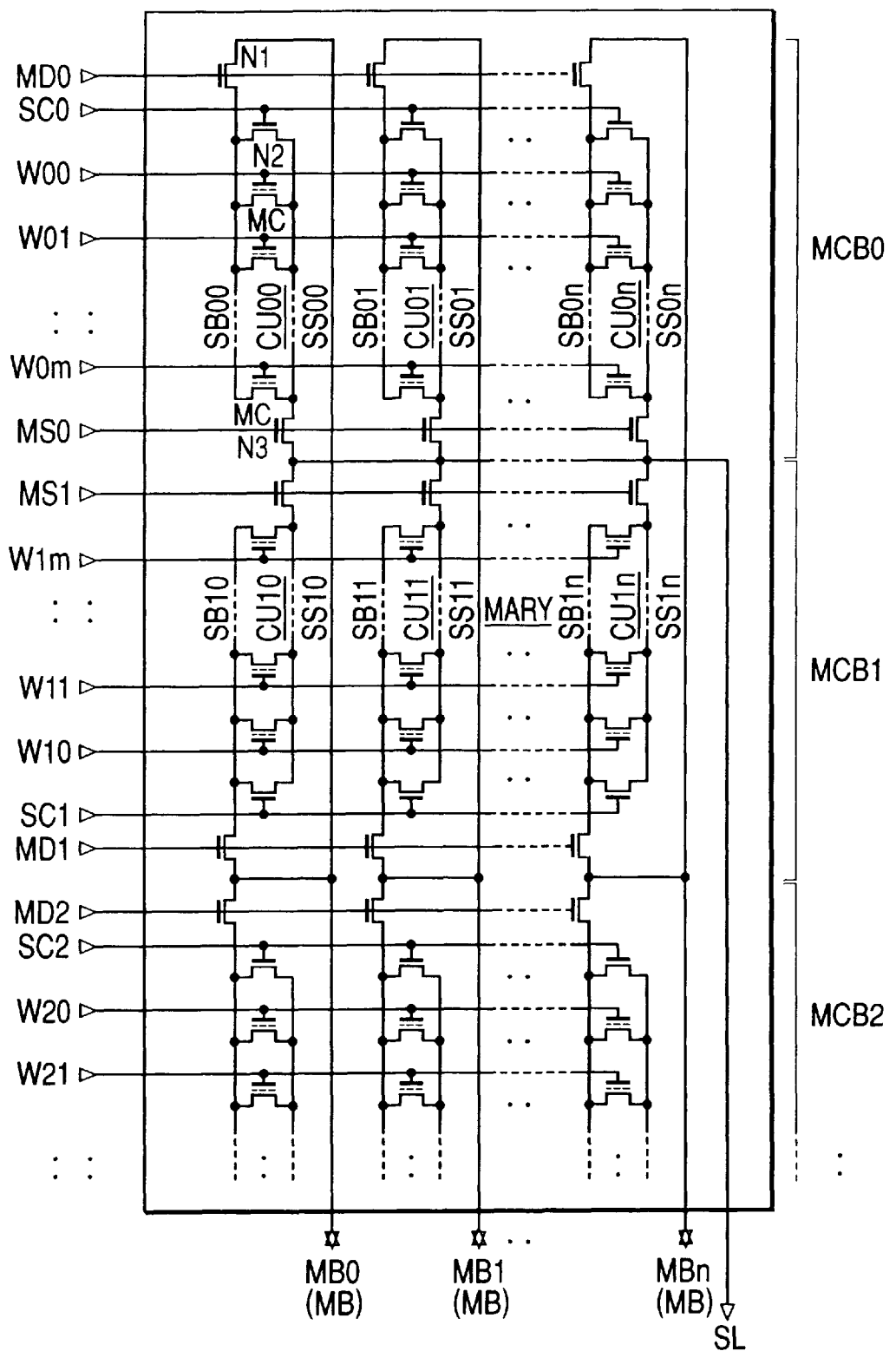
FIG. 2 is a partial schematic circuit diagram of an exemplary memory array included in the flash memory (EEPROM) of FIG. 1.

FIG. 2 shows a partial schematic circuit diagram of one embodiment of the memory array MARY included in the flash memory (EEPROM) of FIG. 1. With reference to the diagram, a specific configuration of the memory array MARY according to Embodiment 1 will be explained. In FIG. 2, those MOSs having arrows at their channel sections (back gates) are pMOSs, and those without arrows are nMOSs.

As shown in FIG. 2, the memory array MARY of the flash memory (EEPROM) according to Embodiment 1 includes p+1 memory cell blocks MCB0–MCBP (FIG. 2 only shows the memory cell blocks MCB0, MCB1 and MCB2 and elements related to these memory cell blocks), and each of the memory cell blocks includes m+1 word lines W00–W0M through Wp0–Wpm arranged in parallel to the horizontal direction of the diagram and n+1 main bit lines MB0–MBn(MB) arranged in parallel to the vertical direction of the diagram. At the substantial intersections of these word lines and the main bit lines, (m+1)×(n+1) memory cells MC having a double-level gate structure are arranged in a matrix array.

Although the invention is not so limited, the memory array MARY has, for example, an AND-type array structure, and the memory cells MC forming the memory cell blocks MCB0–MCBp are grouped respectively into n+1 cell units CU00–CU0N through CUp0–CUpn, each of the units having m+1 memory cells arranged in one column. The drains of the m+1 memory cells MC forming each of these cell units are commonly coupled to a corresponding one of the sub-bit lines SB00–SB0N through SBp0–SBpn, and the sources thereof are commonly coupled to a corresponding one of the local source lines SS00–SS0N through SSp0–SSpn. The sub-bit lines SB00–SB0N through SBp0–SBpn for the respective cell units are coupled to the corresponding main bit lines MB0–MBN via n-channel type drain-side selection MOSs N1 whose gates are coupled to the corresponding drain-side block selection signal lines MD0-MDP, and the local source lines SS00–SS0N through SSp0–SSpn are coupled to the common source lines SL via n-channel type source side selection MOSs N3 whose gates are coupled to the corresponding source-side block selection signal lines MS0–MSP.

In the embodiment, each of the cell units of the memory cell blocks MCB0–MCBp further includes an n-channel type short MOS N2 provided between the commonly coupled drains of the corresponding m+1 memory cells MC, or the sub-bit line SB00–SB0n through SSp0–SSpn, and the commonly coupled sources of the corresponding m+1 memory cells MC, or the local source line SS00–SS0n through SSp0–SSpn. The gates of the n+1 short MOSs N2 included in each of the memory cell blocks are commonly coupled to a corresponding one of the short MOS block selection signal lines SC0–SCp, respectively.

Figure 3:
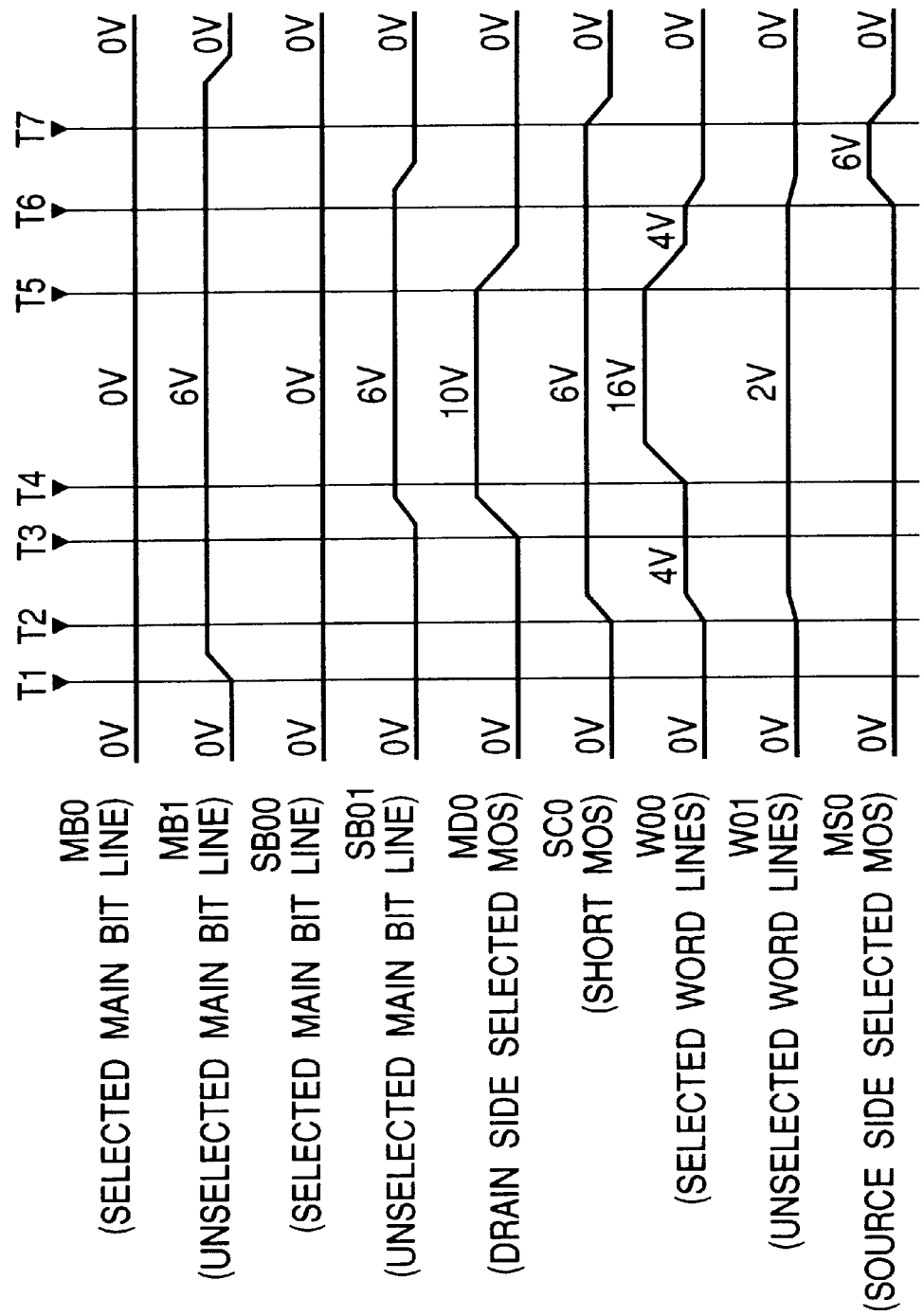
FIG. 3 is a waveform diagram of signals in the write mode of the flash memory (EEPROM) of FIG. 1.

FIG. 3 shows a waveform diagram of the signals in the flash memory (EEPROM) of FIG. 1, according to one embodiment, while it is in the write mode. With reference to this diagram, the specific operations and the characteristics of the flash memory (EEPROM) of the present embodiment during the write mode will now be explained.

Herein, the description will mainly be provided for the write operation. In FIG. 3, the memory cell MC, which forms a part of the cell unit CU00 of the memory cell block MCB0 and is coupled to the word line W00, will be explained as a representative example of the selected memory cell which is subject to the write operation. Accordingly, the main bit line MB0 and the sub-bit line SB00, to which this selected memory cell is coupled, are referred to as representative examples of the selected main bit line and selected sub-bit line, and the adjacent main bit line MB1 and sub-bit line SB01 are referred to as representative examples of the unselected main bit line and the unselected sub-bit line, to which selection memory cells that are not subject to writing are coupled. In addition, the word line W00 is referred to as a representative example of the selected word line, and the word line W01 which forms a part of the same memory cell block MCB0 is referred to as a representative example of the unselected word line. Moreover, the short MOS block selection signal line MS0, to which the gate of the short MOS N2 forming a part of the memory cell block MCB0 is coupled, is referred to as a representative example of the short MOS block selection signal lines MS0–MSp. The source-side block selection signal line MS0, to which the gate of the selection MOSN3 in its source side is coupled, is referred to as a representative example of the source!side block selection signal lines MSO-MSP. The following provides specific descriptions using these examples.

In FIG. 3, when the flash memory (EEPROM) is in the unselected state, the drain-side block selection signal lines MDO-MDp, the short MOS block selection signal lines SC0–SCp, the word lines W00–W0m through Wp0–Wpm and the source-side block selection signal lines MS0–MSP of the memory array MARY are all at the unselected level, such as the ground potential VSS, or 0V. Therefore, the drain-side selection MOSs N1, short MOSs N2 and the source-side selection MOSs N3 of all the cell units in the memory array MARY are all in the OFF state, with the memory cell MC being in the OFF state as well, so that the data retained up to this point will continue to be retained.

The threshold voltage of the memory cell MC, which forms a part of a cell unit of the memory array MARY, is set at a value lower than, for example, +3V while the memory cell MC is in an erased-state and it holds data of logic "0", and is set at a relatively high value higher than, for example, +3V while the memory cell is in a written-state and it holds data of logic "1".

When the flash memory is turned into the selected state at the write mode, at the timing T1, in the flash memory, a first write voltage (first voltage) having a relatively small absolute value, such as 0V, is supplied to the selected main bit line MB0 from the sense amplifier data latch SADL, and to the unselected main bit line MB1, a second write voltage (second voltage) having a relatively large absolute value such as +6V, is supplied. These write voltages will not yet be transmitted to the sub-bit lines SB00 and SB01 since the drain-side selection MOS N1 of each of the cell units is in the OFF state.

Next, at the timing T2, the short MOS block selection signal line SC0 corresponding to the memory cell block MCB0 is alternatively turned into the selected level (second voltage), such as +6V, and, at the same time, the selected word line W00 is turned into an intermediate selected level (third voltage), such as +4V, and the unselected word line W01 is turned into an unselected level (fourth voltage), such as +2V. The third voltage should be higher than the fourth voltage and lower than the second voltage, and the fourth voltage should be higher than the first voltage.

In this way, in the memory cell block MCB0 of the memory array MARY, the short MOSs N2 in respective cell units are turned into the ON state at once in response to the selected level of the short MOS block selection signal line SC0, and the commonly coupled drains of the m+1 memory cells MC forming each of the cell units, or the sub-bit lines SB00–SB0N and the commonly coupled sources, or local source lines SS00–SS0N are short-circuited. The selected word line W00 is first turned into the intermediate selected level (third voltage), such as +4V, before it is turned into a complete selected level, such as +16V, for the purpose of preventing a drastic potential change in the word line to suppress the generation of hot carriers. A voltage of +2V (forth voltage) is applied to the unselected word line W01 in order to reduce the voltage between the channel floating gate of the unselected memory cell to prevent the generation of errors in writing and erasing.

On the other hand, at the timing T3, the drain-side block selection signal line MD corresponding to the memory cell block MCB0 is alternatively turned into a selected level higher than the second voltage, such as +10V, and, in response to this, the drain-side selection MOSs N1, which constitute a part of the cell units CU00–CU0N of the memory cell block MCB0, are turned into the ON state at once. Accordingly, to the selected sub-bit line SB00 of the cell unit CU00, 0V (first-voltage) of the corresponding main bit line MB0 is transmitted, and to the unselected sub-bit line SB01 of the cell unit CU01, +6v (second voltage) of the corresponding main bit line MB1 is transmitted as it is without being affected by the threshold voltage of the drain-side selection MOS N1.

When a write voltage (second voltage) of +6V is transmitted to the unselected sub-bit line SB01, in a flash memory which does not include the short MOSs N2, the source-side selection MOS N3 would be turned into the OFF state in response to the low level of the source-side block selection signal line MS0, and the local source line SS01 would be turned into a floating state. Therefore, the potential of the local source line SS01, which has initially been at the unselected level of 0V (first voltage), would be charged via the corresponding member cells MC in response to the potential change of the sub-bit line SB0L to +6V (second voltage), and a charge current temporarily flows in these memory cells MC. As a result, hot electrons are generated in the proximity of the drains of the memory cells MC, causing errors in writing.

However, in the flash memory (EEPROM) of Embodiment 1, a short MOS N2 is provided between the commonly coupled drains, or one of the sub-bit lines SB00–S80n, and the commonly coupled sources, or one of the local source lines SS00–SS0N, for each m+1 memory cells MC constituting each of the cell units CU00–CU0n of the memory cell block MCB0, and these short MOSs N2 turn into the ON state immediately before the timing T2, that is, the timing at which the drain-side selection MOSs N1 are turned into the ON state. Therefore, by the time the write voltage (second voltage) of +6V is applied to the unselected sub-bit line SB01, the drain and the source of the selected memory cells, which are not subject to writing, would have been short-circuited, so that charge current does not occur via these selected memory cells, with the result that errors in writing due to hot carriers will not occur.

Next, at the timing T4, the selected word line W00 is turned into the state with a relatively larger absolute value, such as +16V, than the second voltage, or a complete selected level. In the memory cell block MCB0, m+1 memory cells MC of a cell unit CU00–CU0N coupled to the word line W00 are selected, and writing is practically performed selectively according to the write voltage potential applied to their drains, or the sub-bit line SB00–SB0N, in other words, the writing is done according to the logic value of a corresponding bit of write data.

That is, in the selected memory cell MC located at the intersection between, for example, the word line W00 and the main bit line MB0, or the sub-bit line SB00, which is subject to the write operation, 16V corresponding to the absolute value of the selected level of the word line W00 is applied between its control gate and the drain, and its source is turned into the floating state; thus, the FN tunneling effect is promoted, so the electron injection takes place from its channel to the floating gate due to the tunnel current. Therefore, the threshold voltage of the selected memory cell MC increases and changes to a relatively large value, such as a value that exceeds +3V.

On the other hand, in the selected memory cell MC placed at the intersection of, for example, the word line W00 and the unselected main bit line MB1, or the unselected sub-bit line SB01, which is not subject to the write operation, 10V which corresponds to the difference between the selected level +16V of the word line W00 and the write voltage +6V (first voltage) is applied between its control gate and the memory channel, but the FN tunneling effect will not occur, since its absolute value is small. Accordingly, the electron injection into the floating gate of this selected memory cell MC will not take place, so that the threshold voltage will be retained unchanged at a lower value, for example, a value smaller than +3V.

When the write operation to the selected memory cell MC is completed, in the flash memory at the timing T5, the drain-side block selection signal line MD0 is brought back to the unselected level of 0V, and, at the same time, the word line W00 is brought back to the intermediate selected level (third voltage), such as +4V. Within the memory cell block MCB0, the drain-side selection MOS N1 is turned into the OFF state in response to the drain-side block selection signal line MD0 being turned back to the unselected level, and the sub-bit lines SB00–SB0n are turned into the floating state while retaining the write voltage of 0V or +6V. The practical writing operation to the selected memory cell MC would terminate in response to the potential change of the word line W00 to the intermediate level, and the reason why the selected word line W00 is first brought back to the intermediate selected level, such as +4V (third voltage), before it is fully turned into the complete unselected level of 0V (first voltage) is to suppress the drastic potential change in the word line in order to restrain the generation of hot carriers.

Next, at the timing T6, the selected word line W00 is brought back to the complete unselected level, such as 0V (first voltage), from +4V (third voltage), and, at the same time, the source-side block selection signal line MS0 corresponding to the memory cell block MCB0 is alternatively turned into the selected level, such as +6V (second voltage). At the slightly later timing T7, the short MOS block selection signal line SC0 is brought back to the unselected level, such as 0V (first voltage), and, at the same time, the source-side block selection signal line MS0 is brought back to the unselected level such as 0V (first voltage).

In the memory cell block MCB0, in response to the word line W00 having been turned into the unselected level, the corresponding n+1 memory cells MC are turned into the OFF state. Also, in response to the alternative selected level of the source-side block selection signal line MS0, n+1 source-side selection MOSs N3 included in the memory cell block MCB0 are turned into the ON state at once, and the potential of the sub-bit lines SB00–SB0N and the local source lines SS00–SS0N, which have been set at +6V, are discharged to 0V via the common source line SL.

Furthermore, at a slightly later timing, the main bit lines MB0–MBN are turned into 0V at once, and this will cause the termination of the first writing. Thereafter, while performing a verifying operation for data verification, similar write operations are repeated until the threshold voltage of the selected memory cell MC which is subject to the writing operation becomes a value sufficiently lower than, for example, +3V.

In a flash memory (EEPROM) that does not include the short MOSs N2, the drain-side selection MOSs N1 are turned into the OFF state, and the source-side selection MOSs N3 are turned into the ON state; thus, a discharge current flows from the sub-bit lines SB00–SB0n, which have been turned into the floating state while being retained at +6V, into the source lines SS00–SS0n that have been turned to 0V, so that there is a risk of incurring hot carriers that may cause writing errors similar to those that might occur immediately before the writing. On the contrary, in the case of Embodiment 1 of the present invention, since the short MOSs N2 are held in the ON state for a length of time including the period during which the discharge current occurs, hot carriers will not be generated so that the writing errors may be prevented.

As explained above, in the flash memory (EEPROM) of Embodiment 1, an n-channel type short MOS N2 is provided in parallel to each of the m+1 memory cells MC constituting each of the cell units of the memory cell blocks MCB0–MCBp of the memory array MARY, and these short MOSs N2 are held in the ON state during the write operation, or during a period from the time immediately after the write voltage of 0V or +6V corresponding to the write data is supplied to the main bit lines MB0–MBn, to the end of the discharge of the sub-bit lines SB00–SB0n and the local source lines SS00–SS0n via the source-side selection MOSs.

In this way, the generation of hot carriers caused by the sub-bit lines SB00–SB0n being selectively set at +6V while the local source lines SS00–SS0n are in the floating state during the initial period of the write operation, may be restrained; and, at the same time, the generation of hot carriers caused by the local source lines SS00–SS0N being set at 0V while the sub-bit lines SB00–SB0n are in the floating state after the termination of the write operation, may also be restrained. As a result, erroneous writing into selected memory cells that are not subject to writing may be prevented without adversely affecting the required write time, and, thus, the reliability of the flash memory (EEPROM) as a product can be improved without causing performance degradation.

Figure 4:
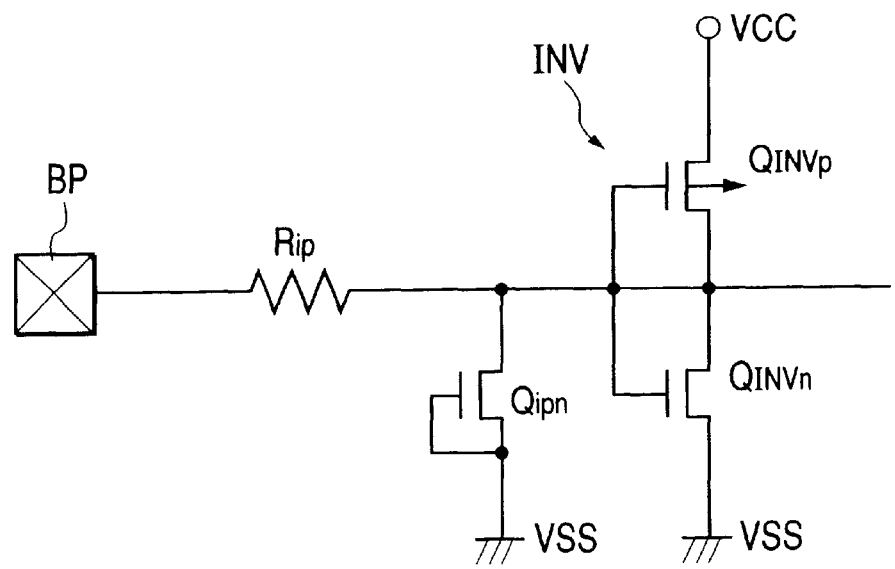
FIG. 4 is a schematic circuit diagram showing one example of an input circuit of the flash memory (EEPROM) of FIG. 1.
Figure 5:
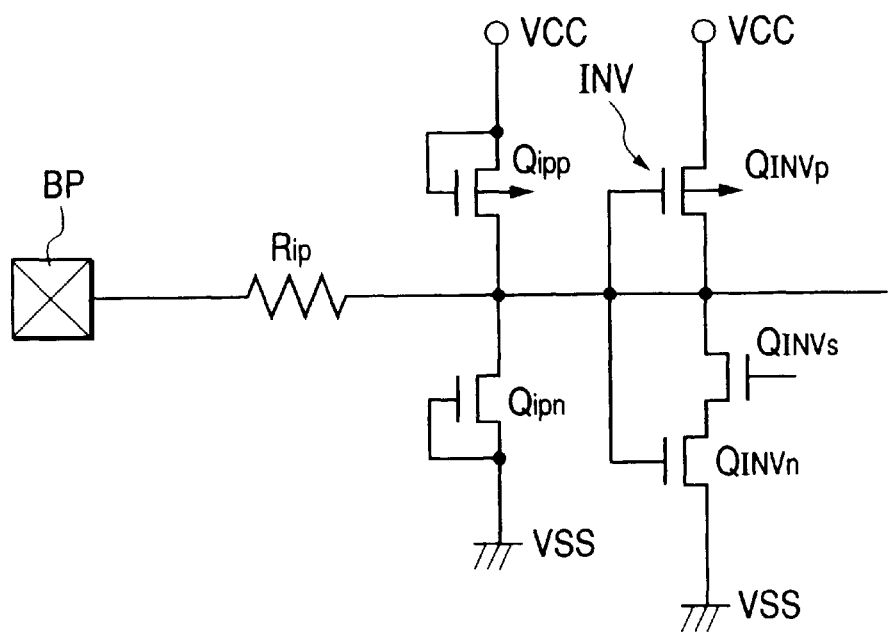
FIG. 5 is a schematic circuit diagram showing another example of the input circuit of the flash memory (EEPROM) of FIG. 1.
Figure 6:
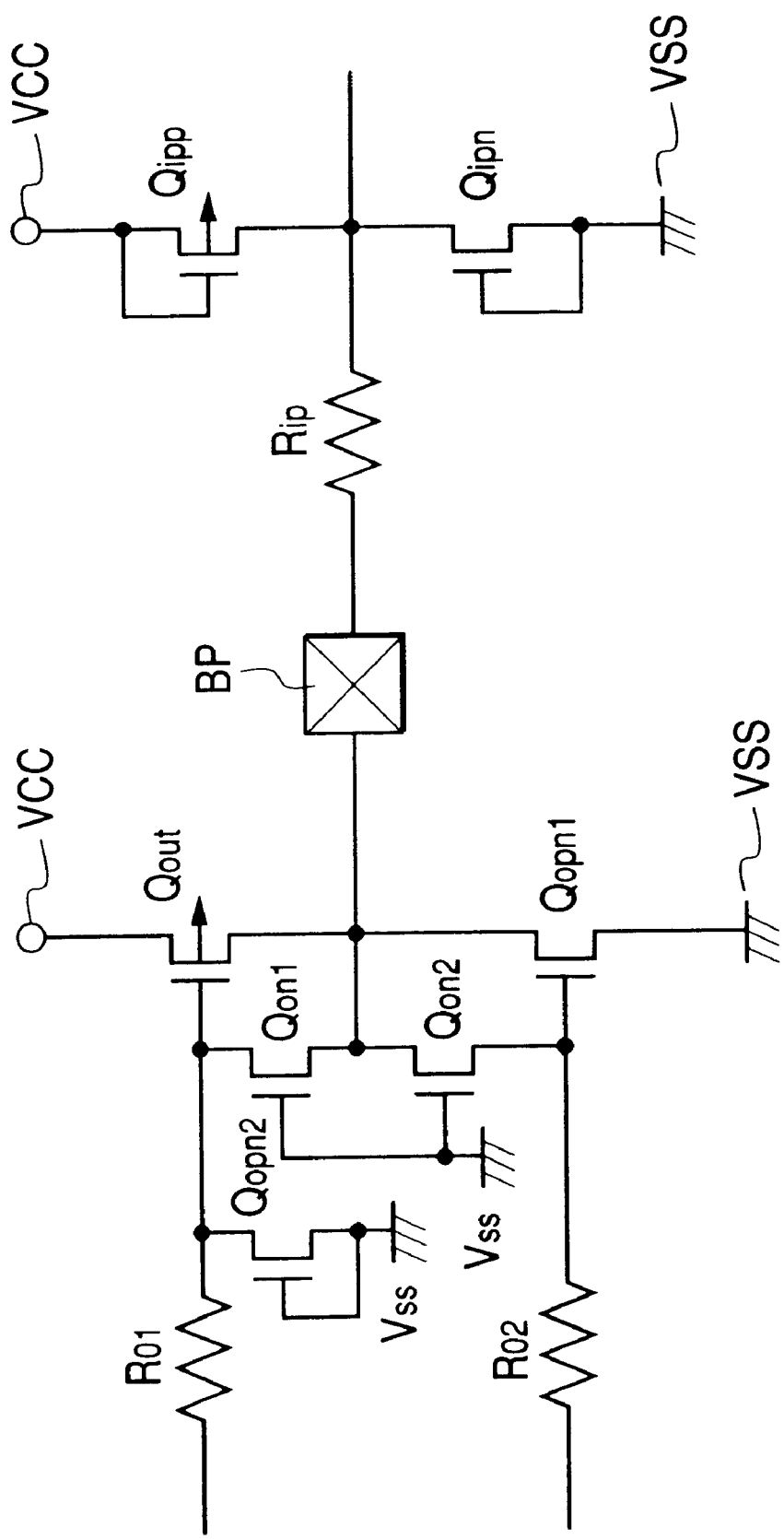
FIG. 6 is a schematic circuit diagram showing one example of input/output bidirectional circuit of the flash memory (EEPROM) of FIG. 1.

FIGS. 4, 5 and 6 show examples of input/output circuits in the flash memory (EEPROM) of Embodiment 1. In each of the diagrams, the bonding pad BP represents an external terminal on the semiconductor chip for electrically connecting the internal circuits (or flash memory (EEPROM)) to the circuits external to the semiconductor chip.

FIGS. 4 and 5 illustrate exemplary input circuits, and, in either case, the key portion is constituted by, for example, a CMOS (complementary MOS) inverter circuit INV. In FIG. 4, this inverter circuit INV is constituted by a pMOS QINVp and an nMOS QINVn that are electrically connected between a wiring for the power source voltage VCC and a wiring for the ground potential VSS. At the input of the inverter circuit INV, the bonding pad BP is electrically connected via a protective resistor Rip and a protective nMOS Qipn. The protective resistor Rip and nNMOS Qipn are protective elements for protecting the inverter circuit INV and the aforementioned internal circuits from being exposed to any high voltages due to electrostatic discharge etc. The protective nMOS Qipn is diode-connected between the input of the inverter circuit INV and the wiring to the ground potential VSS. A given circuit among the aforementioned internal circuits is electrically connected to th e output of the inverter circuit INV.

Turning now to FIG. 5, besides the protective nMOS Qipn, a protective pMOS Qipp is also electrically connected to the input of the inverter circuit INV. This protective pMOS Qipp is a protective element which is diode-connected between the input of the inverter circuit INV and the wiring to the power source voltage VCC. Also, there is provided, between the mMOS QINVp and nMOS QINVn, an nMOS QINVS for switching. This nMOS QINVS for switching serves to suppress the leakage current between the wiring to the source voltage VCC and the wiring to the ground potential VSS while the inverter circuit INV switches between ON and OFF, so as to reduce the power consumption. Other than the above, it essentially has the same configuration as the input circuital FIG. 4.

The signals etc. transmitted from the outside of the semiconductor chip are sent via the bonding pad BP to the input circuit shown in FIGS. 4 and 5 from which the signals are sent to the internal circuit after being processed into a state suitable for the internal circuit.

FIG. 6 shows a bidirectional input/output circuit on the right side of the bonding pad BP in FIG. 6, a portion of the input circuit is shown. Although the input circuit is not illustrated in total in FIG. 6, it should be understood that an input circuit similar to that shown in FIG. 5, for example, is incorporated therein. On the other hand, on the left side of the bonding pad BP, an output circuit is illustrated. This output circuit comprises a pMOS Qout for outputting, a protective nMOS Qopn1, nMOSs Qon1, Qon2 for stabilizing the input potential, and protective MOS Qopn2 and resistors Ro1, Ro2. The protective nMOS Qopn1 has a function to protect the internal circuit by absorbing the charge due to hot carriers etc. In Embodiment 1 of the present invention, this protective nMOS Qopn1 has a configuration substantially identical to that of the memory cells of the flash memory (EEPROM), as will be explained later in detail. That is, by forming the protective device to have a structure identical to the memory cells that can provide a high electrostatic reakdown resistivity as it inherently has a low withstanding voltage (especially at the drain edge), a highly protective nMOS Qopn1 may be obtained.

Figure 7:
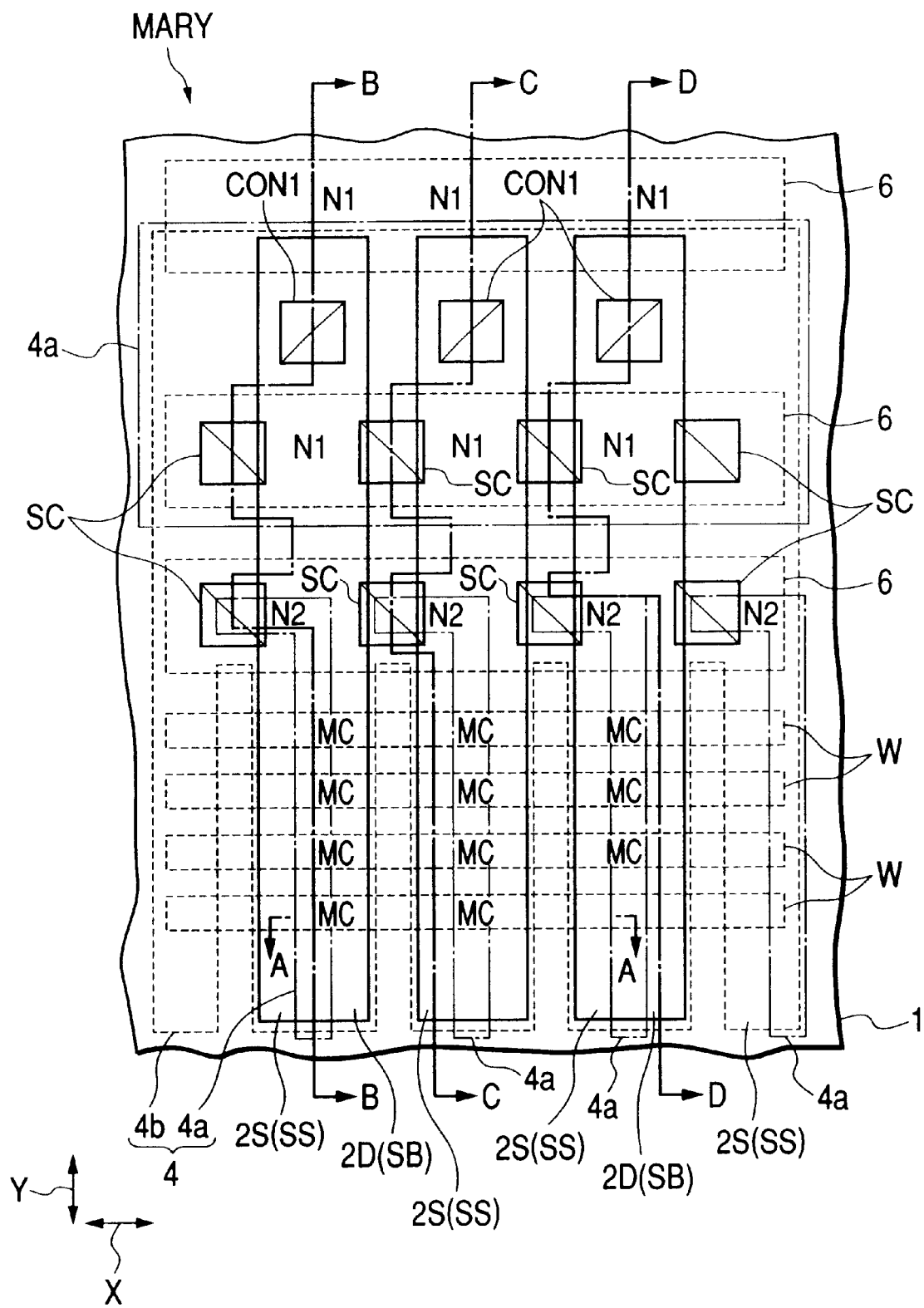
FIG. 7 is a schematic plan view of the memory array of FIG. 1.
Figure 8:
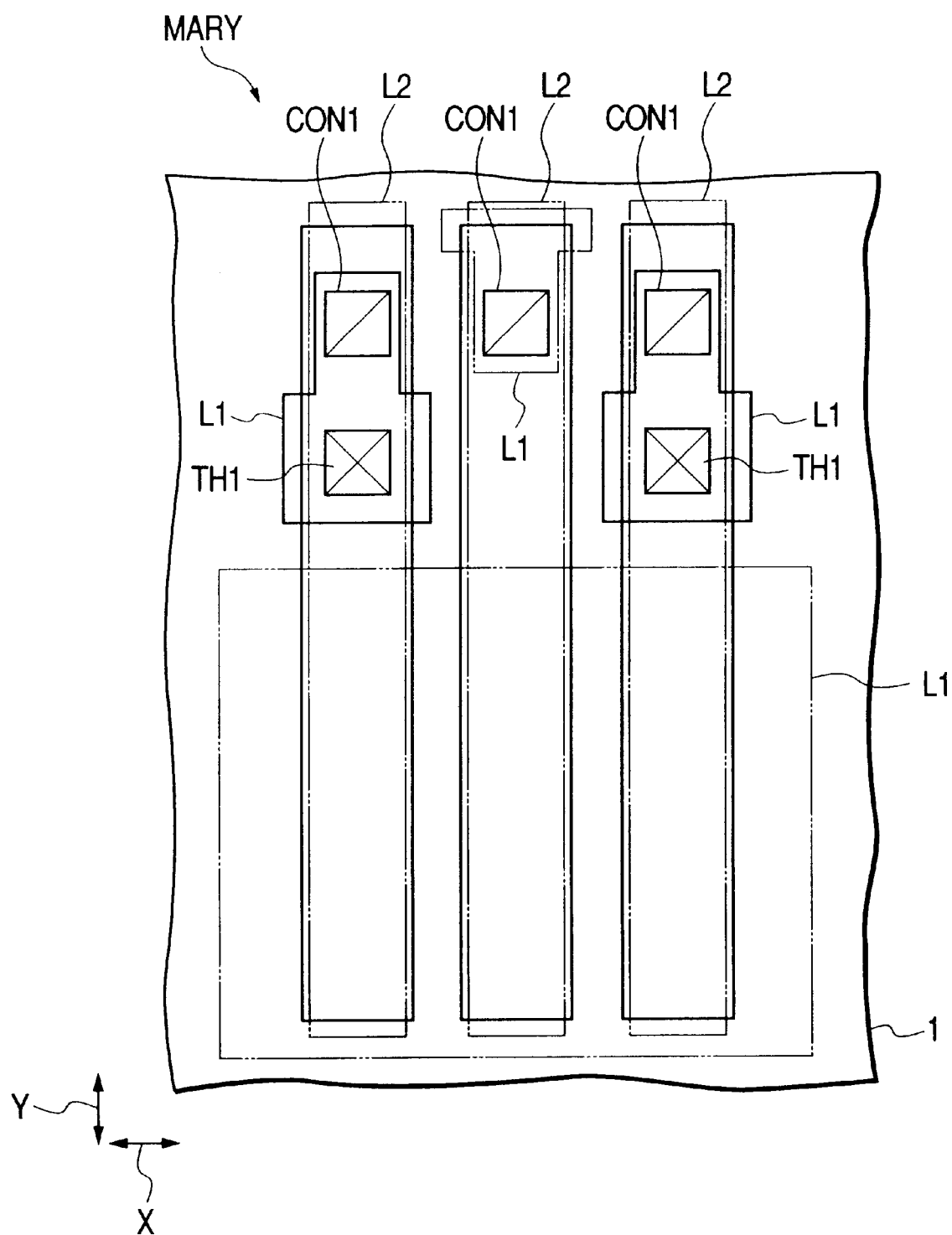
FIG. 8 is a schematic plan view of the same two-dimensional area of FIG. 7 but shows a layout layer located above the layer shown in FIG. 7.
Figure 9:
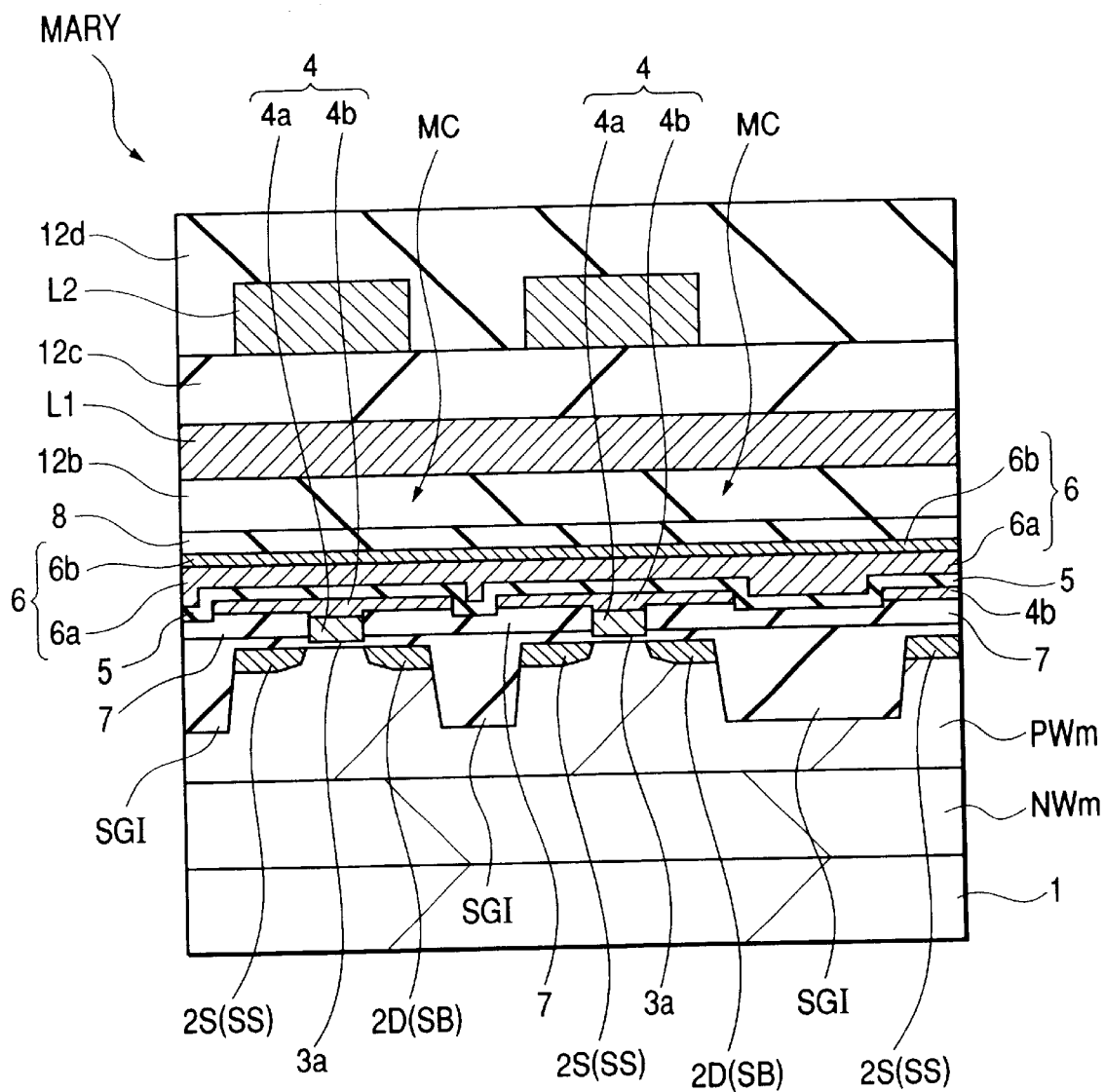
FIG. 9 is a cross-sectional view of FIG. 7 taken along the line A—A.
Figure 10:
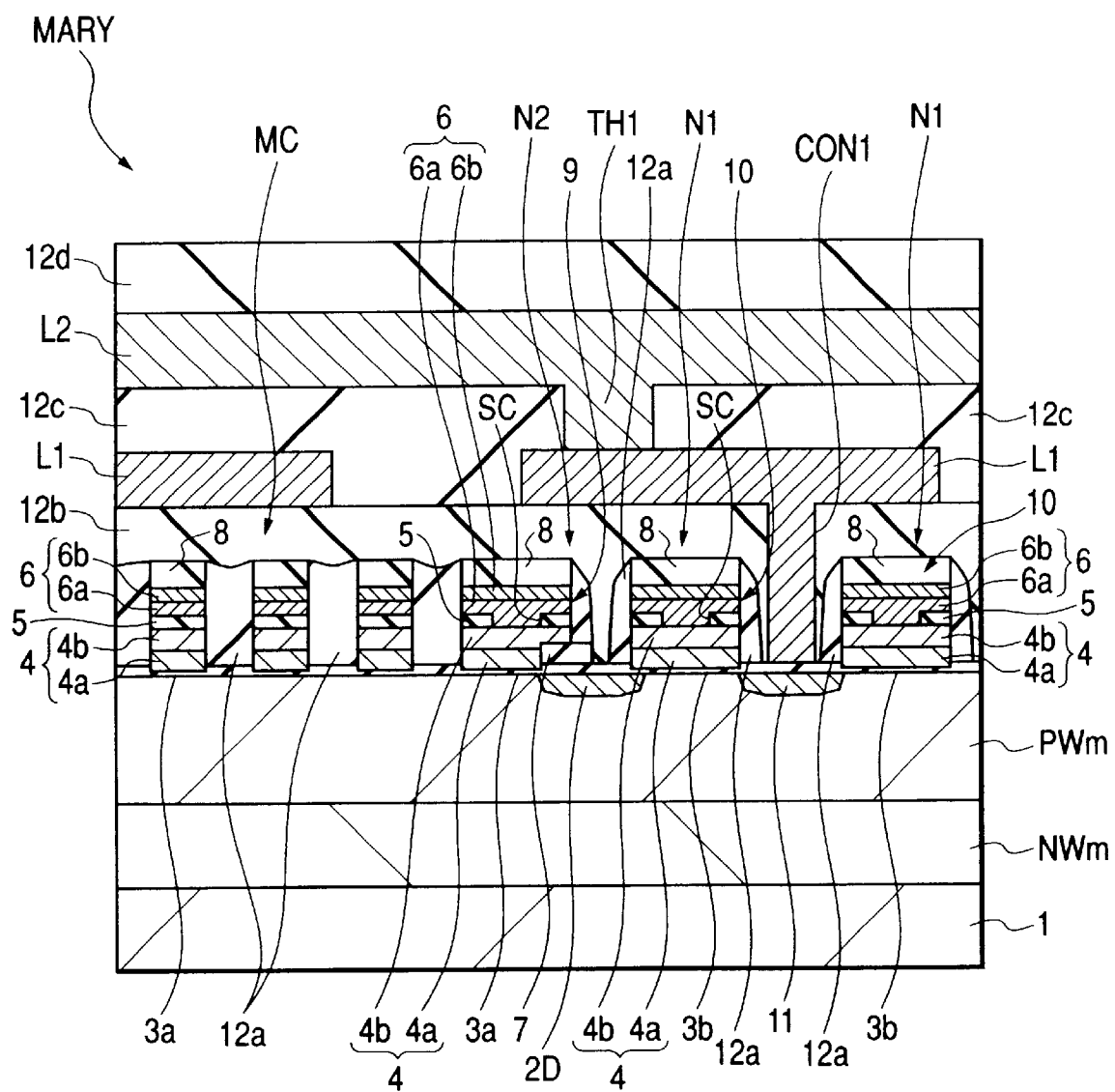
FIG. 10 is a cross-sectional view of FIG. 7 taken along the line B—B.
Figure 11:
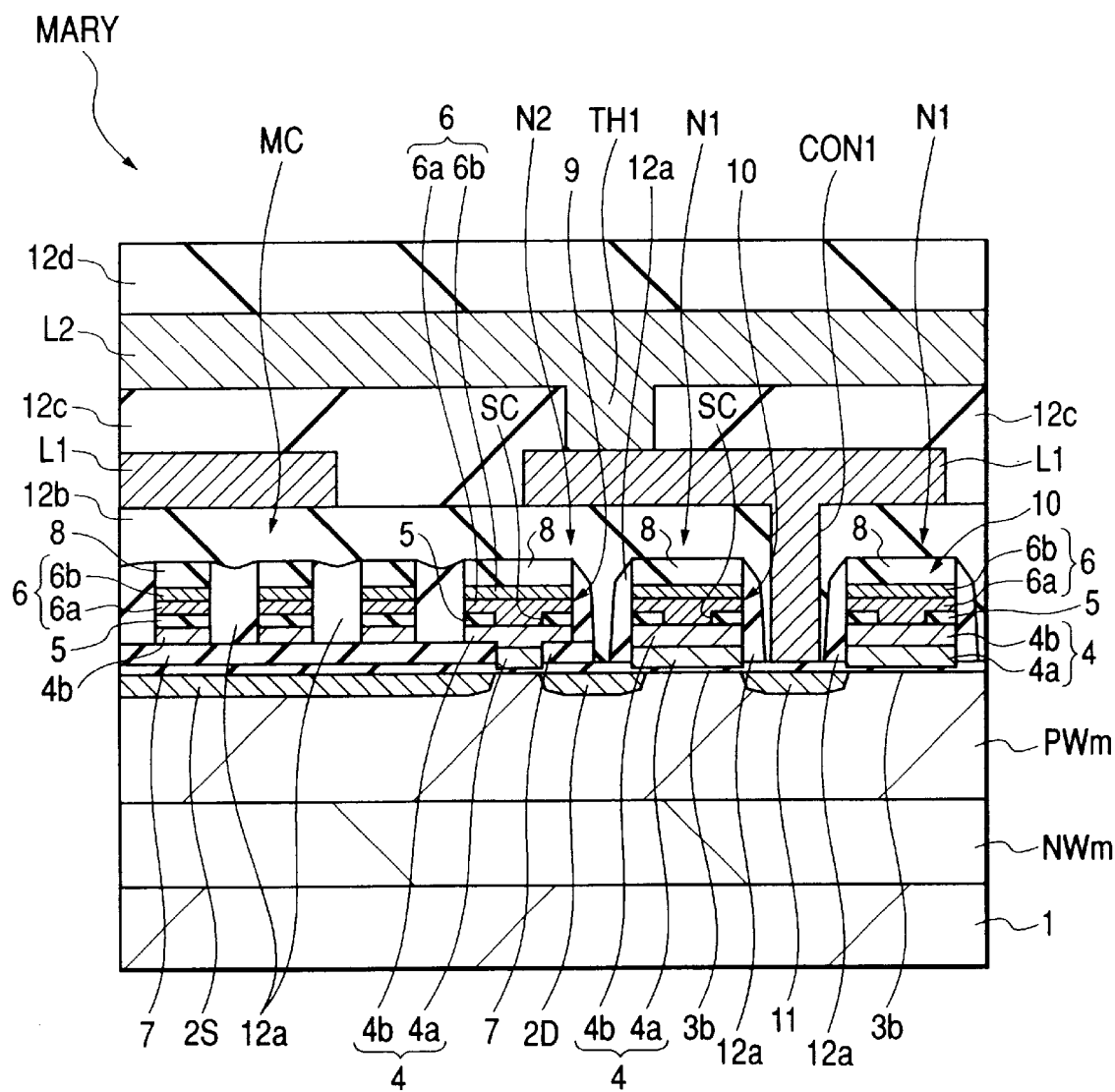
FIG. 11 is a cross-sectional view of FIG. 7 taken-along the line C—C.
Figure 12:
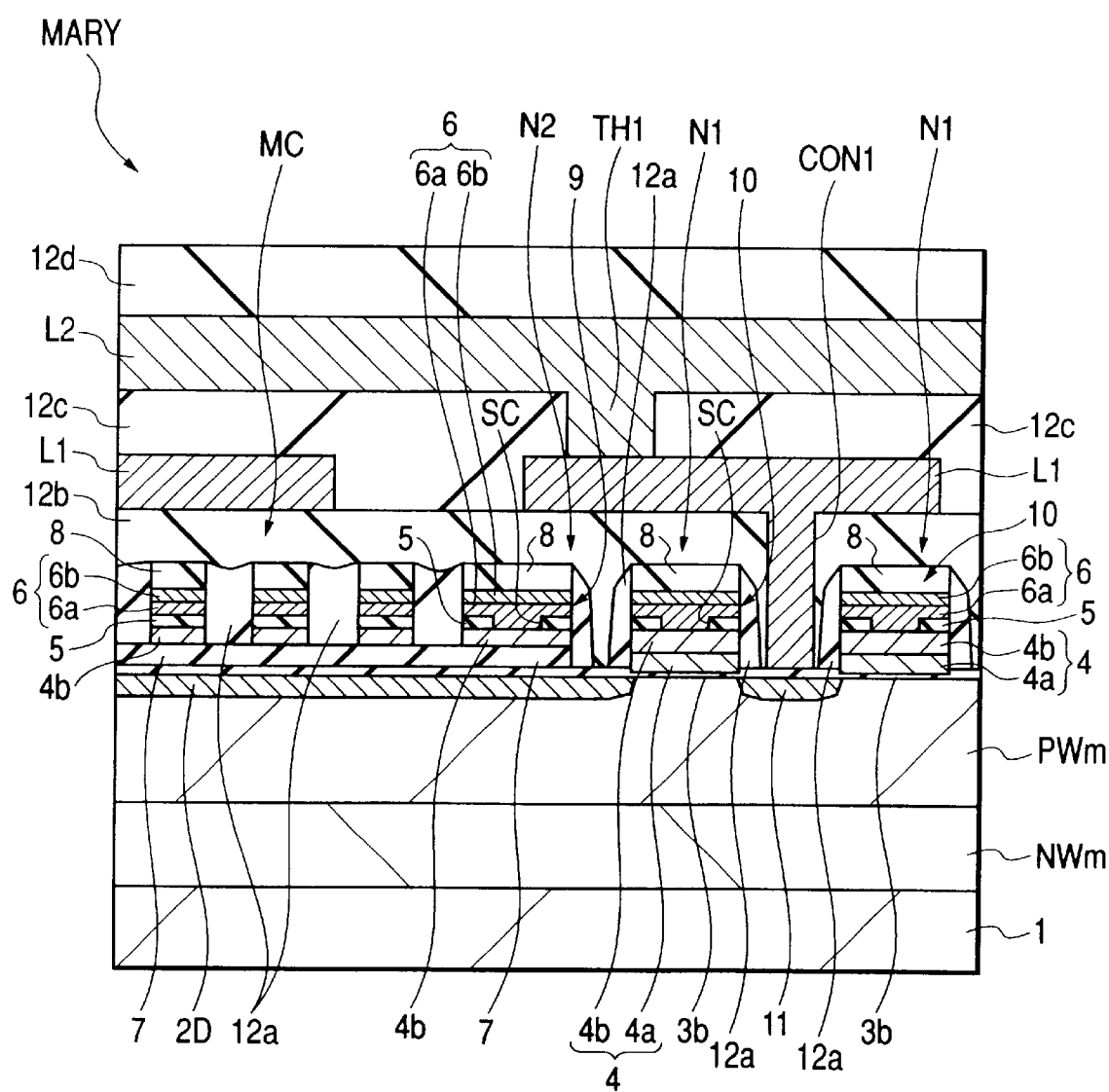
FIG. 12 is a cross-sectional view of FIG. 7 taken along the line D—D.

With reference to FIGS. 7 through 12, the arrangements and the structures of the elements in the flash memory (EEPROM) according to Embodiment 1 of the present invention will be explained. FIG. 7 is a schematic plan view of the aforementioned memory array MARY; FIG. 8 is a schematic plan view showing a layout layer above, but in the same two-dimensional area shown in FIG. 7; FIG. 9 is a cross-sectional view of FIG. 7 taken along the line A—A (a line cutting through a word line W along the direction in which the word line extends); FIG. 10 is a cross-sectional view of FIG. 7 taken along the line B—B (a line cutting through the channel regions of the memory cells in a direction perpendicular to the word lines, or Y-direction); FIG. 11 is a cross-sectional view of FIG. 7 taken along the line C—C (a line cutting through the source regions of the memory cells in the Y-direction, or a direction in which the local source lines extend); and FIG. 12 is a cross-sectional view of FIG. 7 taken along the line D—D (a line cutting through the drain regions of the,memory cells in the Y-direction, or a direction in which the bit lines extend). Although the following explanation deals mainly with the cross-sectional views of FIGS. 9 through 12, reference shall be made also to FIGS. 7 and 8 as necessary for those descriptions associated with the two-dimensional structures. The later explained FIG. 24 corresponds to the cross-sectional view of FIG. 7 taken along the line A—A, and the later explained FIG. 25 corresponds to the cross-sectional view of FIG. 7 taken along the line B—B.

A semiconductor substrate 1 constituting the above-described semiconductor chip is made of, for example, P-type single-crystalline silicon, and, in this semiconductor substrate 1, a p-type well PWm is formed. This p-type well PWm is formed by the introduction of, for example, boron (B), and, over this region the above-described memory cells MC, as well as the elements for the peripheral circuits, such as the short MOSs N2 (SMOS) and selection MOSs N1 (S1MOS), N3 (S1MOS) etc. are formed. This p-type well PWm is surrounded by an embedded n-type well NWm layer formed below an d an n-type well formed on the sides of the p-type well PWm, so that the p-type well PWm is electrically isolated from the semiconductor substrate 1. The embedded n-type well NWm and the n-type well are formed by introducing, for example, phosphorus (P) or arsenic (As) into the semiconductor substrate 1, and they have the functions to restrain or prevent noises from the other elements on the semiconductor substrate 1 from entering the p-type well PWm (that is, memory cells MC) via the semiconductor substrate 1 and to set the potential of the p-type well PWm to a given value independently from the semiconductor substrate.

On the principal surface of the semiconductor substrate 1, trench-type isolation regions SGI are formed. These isolation regions SGI are formed by an insulating film filled within the trenches having a band-like two-dimensional shape extending along the Y-direction so as to provide electrical isolation between a plurality of memory cells MC arranged in the direction in which the word lines W extend (X-direction). The insulating film for the isolation regions SGI may be, for example, a silicon oxide film etc. and its top surface is made flat so as to substantially match the principal surface of the semiconductor substrate 1. In order to provide electrical isolation between a plurality of memory cells MC arranged in the Y-direction, such trench-type isolation regions may be formed in the semiconductor substrate 1 also in the areas between those memory cells MC arranged in the Y-direction, or p-type semiconductor regions may be formed in the regions of the semiconductor substrate 1 between those memory cells MC by introducing, for example, boron into those regions.

Each of the memory cells MC comprises a pair of n-type semiconductor regions 2S, 2D formed over the semiconductor substrate 1, an insulating film 3a (a first insulating film) formed over the principal surface (active region) of the semiconductor substrate 1, a conductive film 4 for a floating gate electrode (a first gate electrode) formed thereon, an interlayer film 5 (a second insulating film) formed thereon, and a conductive film 6 for a control gate electrode (a second gate electrode) formed thereon.

The n-type semi-conductor region 2S of a memory cell MC is provided for forming a source region and is a portion of the above-described local source line SS. Similarly, the n-type semiconductor region 2D is provided for forming a drain region and is a portion of the above-described sub-bit line SB. The local source line SS and the sub-bit line SB in a band-like two-dimensional shape extend in parallel to each other in the Y-direction so as to sandwich therebetween the plurality of the memory cells MC arranged along the Y-direction, and they serve as common regions of these plurality of memory cells MC. In Embodiment 1 of the present invention, the n-type semiconductor region 2S (local source line SS) and the n-type semiconductor region 2D (sub-bit line SB) are formed by introducing, for example, arsenic (As) into the semiconductor substrate 1 to a concentration in the order of, for example, $10^{14}/cm^3$. This realizes shallow junctions of the semiconductor regions 2S, 2D, and also allows the impurity concentration to be increased while restraining or preventing the occurrence of short-channel effects etc., and, in turn, provides further minimization, the assurance of reliability, and the reduction of resistivity (sheet resistance). The local source line SS is electrically connected to the common source line SL (FIG. 2) formed of a metal film etc. via a selection MOS N3, and the sub-bit line SB is electrically connected to a main bit line MB formed of a metal film etc. via a selection MOS N1.

The insulating film 3a, forming a part of the memory cells MC, is made of silicon oxide etc., having a thickness of approximately 9–10 nm, and forms electron passage regions (tunnel insulating film) used for injecting electrons that contribute to the formation of data from the semiconductor substrate 1 to the conductive film 4, constituting the floating gate electrodes, and for emitting the electrons held by the conductor film 4 into the semiconductor substrate 1.

The conductive film 4 for constituting the floating gate electrode is constructed by sequentially forming two layers of conductive films 4a and 4b from the bottom. The conductive films 4a and 4b are both made of polycrystalline silicon with a low resistivity, to which an impurity has been added. The conductive film 4a has a thickness in the order of, for example, 70 nm, and the conductive film 4b has a thickness in the order of, for example, 40 nm. The conductive film 4, however, is formed to have a T-shaped cross section as shown in the cross-sectional view taken along the X-direction (FIG. 9), so that the upper conductive film 4b has a larger width than that of the lower conductive film 4a. This makes it possible to increase the area of the conductive film 4 serving as the floating gate electrode facing the conductive film 6 serving as the control gate electrode, while retaining the short channel length of the memory cell MC. Thus, the capacitance formed between these gate electrodes may be increased. Accordingly, the operation efficiency of the memory cell MC can be improved without increasing its size. It should be understood, however, that the present invention itself is also applicable to an implementation having a floating gate electrode with an I-shaped cross section. Between the conductive film 4b of the conductive film 4 for the floating gate electrode and the semiconductor substrate 1, an insulating film 7 made of, for example, silicon oxide etc. is interposed so as to provide isolation between the pair of n-type semiconductor regions 2S, 2D and the conductive film 4b.

The surface of the conductive film 4b of the memory cell MC is covered by the interlayer film 5 which isolates the conductive film 4 for the floating gate electrode from the conductive film 6 for the control gate electrode. The interlayer film 5 is constituted by forming a silicon oxide film over a silicon oxide film via a silicon nitride film, and has a thickness in the order of, for example, 15 nm. The conductive film 6 for the control gate electrode forms an electrode for performing read, write and erasure of data, and it is constituted by a portion of the word line W. The word line W is formed in a two-dimensional pattern of a baud-like shape extending in the X-direction, and a plurality of them are arranged in parallel in the Y-direction with a minimum process pitch (i.e. approximately 0.30 $\mu$m). This conductive film 6 (word line W) constituting the control gate electrode is constructed by sequentially forming, for example, two layers of conductive films 6a and 6b from the bottom. The conductive film 6a at the bottom is made of, for example, polycrystalline silicon with a low resistivity and having a thickness of approximately 100 nm. The conductive film 6b at the top is made of, for example, tungsten silicide ($Wsi_x$) with a thickness of 80 nm and is formed on the bottom conductive film 6a in an electrically connected manner. The provision of this conductive film 6b allows for the reduction of the electrical resistance of the word line V, thus permitting the operation speed of the flash memory (EEPROM) to be improved. However, the structure of the conductive film 6 is not limited to this particular example, and it may be modified in various ways. For example, it may have a structure in which a metal film made of tungsten etc. is formed over the polycrystalline silicon layer having a low resistivity via a barrier conductive film made of tungsten nitride etc. in this case, the electrical resistivity of the word line W may be substantially reduced, so that the operation speed of the flash memory (EEPROM) may be further improved. Over this word line W, a cap insulating film 8 made of, for example, silicon oxide is formed.

In Embodiment 1 of the present invention, the structures of the elements serving as the peripheral circuits such as short MOSs N2 (SMOS) and selection MOSs N1 (S1MOS), N3 (S1MOS) (refer also FIG. 2) etc. also have structures substantially similar to the structure of the memory cells MC. Especially, the gate electrodes 9 of the short MOSs N2 (SMOS) and the gate electrodes 10 of the selection MOSs N1 (S1MOS) and N3 (S1MOS) have the same structure as that in which the conductive film 6 for the control gate electrode is formed over the conductive film 4 for the floating gate electrode via the interlayer film 5. More particularly, they are constructed in the following way.

The short MOS N2 (SMOS) is constituted by, for example, an nMOS and comprises a pair of semiconductor regions 2S and 2D formed in a semiconductor substrate 1, an insulating film 3a formed over the principal surface of the semiconductor substrate 1, and a gate electrode 9 formed thereon. The pair of n-type semiconductor regions 2S and 2D of the short MOS N (SMOS) are integral, respectively, with the pairs of n-type semiconductor regions 2S and 2D of the aforementioned memory cells MC. The insulating film 3a of the short MOS N2 (SMOS) is a member constituting a gate insulating film and has the same configuration (in terms of the thickness and material) as that of the insulating layer 3a of the aforementioned memory cells MC. Furthermore, the gate electrode 9 of the short MOS N2 (SMOS) is constituted by the two layers of the conductive films 4 and 6 that are stacked via the interlayer film 5 of the aforementioned memory cells MC. However, the conductive films 4 and 6 constituting the gate electrode 9 of the short MOS N2 (SMOS) are electrically connected through a contact hole SC provided in the interlayer film 5 therebetween. This allows substantial reduction in the resistivity of the gate electrode 9. The details of the layout of this contact hole SC will be explained later. The conductive film 6 forming a part of the gate electrode 9 of the short MOS N2 (SMOS) is formed to have a larger width than the conductive film 6 of the memory cells MC.

The selection MOS N1 (SLMOS) is constituted by, for example, an nMOS and comprises a pair of n-type semiconductor regions 11 (2D), 11 as a source and a drain formed in a semiconductor substrate 1, an insulating film 3b formed over the principal surface of the semiconductor substrate 1, and a gate electrode 10 formed thereon. The pair of the n-type semiconductor regions 11 of the selection MOS N1 (S1MOS) are formed by introducing, for example, phosphorous, and the impurity doping process thereof is performed separately from the doping process of the pairs of n-type semiconductor regions 2S, 2D of the aforementioned memory cells MC. However, one of the n-type semiconductor regions 11 is overlapped with the n-type semiconductor region 2D. The formation process and the configuration of this pair of semiconductor regions 11 (2D), 11 will be explained later in detail. The insulating film 3b of the selection MOS N1 (S1MOS) is a member constituting a gate insulating film. This insulating film 3b is made of the same material as the aforementioned insulating film 3a, however, the thickness thereof is larger than the insulating film 3a, such as in the order of 25 nm. The method of formation of this insulating film 3b also will be explained later in detail. Furthermore, also in the selection MOS N1 (S1MOS), the gate electrode 10 is constructed by stacking the conductive films 4 and 6 of the aforementioned memory cells MC, however, in the same way as in the short MOS N2, its conductive films 4 and 6 are electrically connected through a contact hole SC provided in the interlayer film 5 located therebetween. The conductive film 6 forming a part of the gate electrode 10 of the selection MOS N1 (S1MOS) is formed to have a larger width than the conductive film 6 of the memory cells MC. Since the structure of the selection MOS N3 (S1MOS) is identical to that of the selection MOS N1 (S1MOS), an explanation thereof will be omitted.

The use of the structure in which the conductive film 6 is formed over the conductive film 4 via the interlayer film 5, as the structure of the gate electrodes 9 and 10 of the short MOSs N2 (SMOS) and the selection MOSs N1 and N2 (S1MOS) that are formed within the memory array MARY, makes it possible to improve the flatness across the memory array MARY. It is possible of course to improve the flatness across the entire plane of the semiconductor chip by employing the same MOS structure as the memory cells MC for the peripheral circuits outside the memory array MARY.

Figure 13:
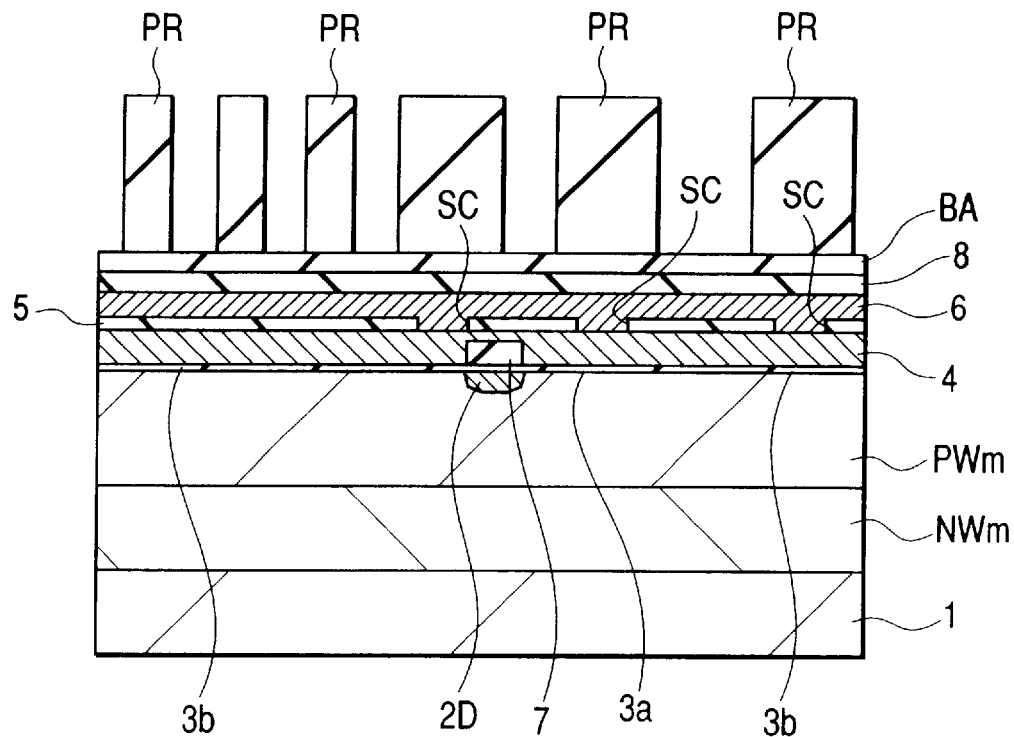
FIG. 13 is a cross-sectional view of the flash memory (EEPROM) of FIG. 1 during a step in the manufacturing process.

Now, reference will be made to FIG. 13, which is a schematic cross-sectional view of the memory array MARY during a patterning process of the word lines W. On the conductive film 6, a photo resist pattern PR for the formation of the word lines W and the gate electrodes 9 and 10 is formed via an antireflection film BA. Since, in this case, the flatne ss may be retained, it is possible to apply the antireflection film BA to substantially the same thickness in both the memory array region (left side of the semiconductor region 2D in FIG. 13) and the peripheral circuit region (right side of the n-type semiconductor region 2D in FIG. 13). This allows the further minimization of the pitch between the adjacent word lines W.

Figure 14:
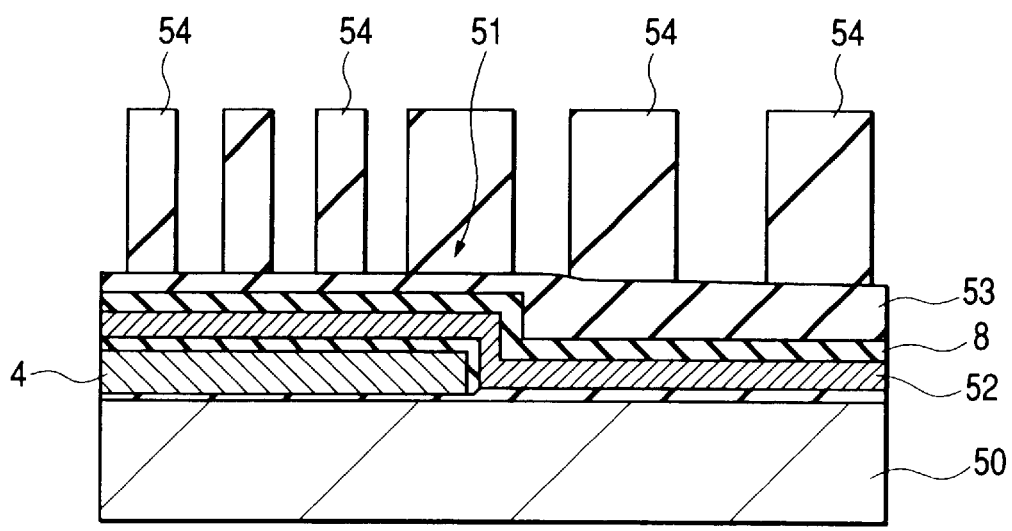
FIG. 14 is a cross-sectional view illustrating a defect which has occurred during the process of manufacture of the flash memory (EEPROM) that has been discussed by the inventor of the present invention.

On the other hand, for the purpose of comparison, FIG. 14 illustrates an example in which the gate electrodes of a short MOS (SMOS) and selection MOSs (S1MOS) formed within a memory array on a semiconductor substrate 50 have a single-layer structure. In this example, there is a step 51 af the boundary between the memory cell formation region and the short MOS (SMOS) and selection MOS (S1MOS) formation region. Thus, there is a step in a semiconductor film 52 for forming the word lines and the gate electrodes. Accordingly, an antireflection film 53 over the conductive film 52 is thicker in the region above the short MOS (SMOS) and the selection MOS (SLMOS) formation region than in the region above the memory cell formation region. With this structure, when patterning is performed over the conductive film 52 by etching using a photo resist pattern 54 as a mask, the photo resist pattern 54 on the word line side becomes narrower while patterning the gate electrodes due to the large thickness of the antireflection film 53 on the side of the short MOS (SMOS) and the selection MOS (SLMOS) formation region, and this tends to result in substantially narrow word lines W.

Accordingly, the initial setting of the width of the word lines has to be made larger by the expected narrowing amount, so that the pitch of the adjacent word lines also has to be made wider, thereby resulting in an increased area of the memory array.

On the side surfaces of the conductive film 4 for the floating gate electrode, the conductive film 6 for the control gate electrode, gate electrodes 9 and 10 and a cap insulating film 8, an insulating film 12a made of i.e. silicon oxide is deposited. Especially, the intervals between the word lines W adjacent to each other in the Y-direction are filled with this insulating film 12a. Over the insulating film 12a and the conductive film 6, an insulating film 12b made of, for example, silicon oxide is deposited. over this insulating film 12f), a first-level wiring layer L1 made of, for example, tungsten is formed. The given first-level wiring layer L1 is electrically connected with the n-type semiconductor region 11 of the selection MOS Ni via a contact hole CON1 provided in the insulating layer 12b. Furthermore, an insulating film 12c made of, for example, silicon oxide is deposited over the insulating film 12b, thereby covering the surface of the first-level wiring layer L1. Over this insulating film 12c, a second-level wiring layer L2 is formed. The second-level wiring layer L2 is constructed by sequentially depositing, for example, titanium nitride (TiN), aluminum (Al) and titanium nitride (TiN) from the bottom, and is electrically connected to the first-level wiring layer L1 via a through hole TH1 provided in the insulating layer 12c. The surface of this second-level wiring layer is covered by an insulating film 12d made of i.e. silicon oxide.

Now, with reference to FIGS. 15(a) through 19(d), examples of the layout of the contact holes SC provided in a MOS constituting a peripheral circuit will be explained.

In Embodiment 1 of the present invention, there are essentially two types of contact-hole SC layouts for the MOSs constituting peripheral circuits according to the gate lengths of the respective MOSS. FIGS. 15(a), 15(b) and 16(a), 16(b) diagrammatically illustrate examples of two types of MOSs QA and QB constituting peripheral circuits. Since the present invention can be applied to either pMOS or nMOS, the conductivity types of the channels of the MOSs QA and QB are not particularly specified in this description in order to simplify the explanation. Also, the pair of semiconductor regions for the source and drain of the MOS QA are representatively indicated by the designations "SA" and "DA", and the gate electrode of the MOS QA is representatively indicated by a designation "GA". The pair of semiconductor regions for the source and drain of the MOS QB are representatively indicated by the designations "SB" and "DB", and the gate electrode of the MOS QB is representatively indicated by a designation "GB". In the MOS QA and MOS QB, the designations "LA" and "LB" represent active areas, and the areas outside thereof represent isolation areas.

Figure 15A:
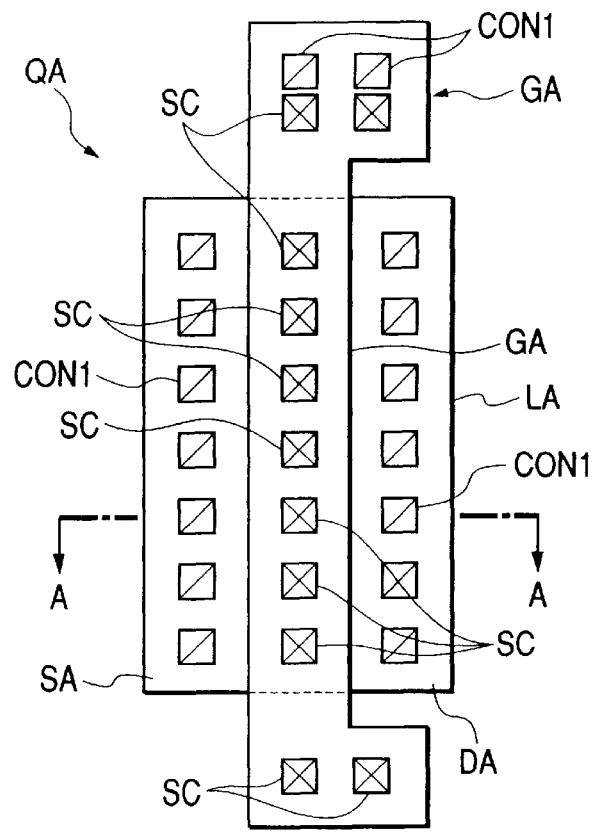
FIG. 15(a) is a plan view showing the layout of a device constituting a peripheral circuit of the flash memory (EEPROM) of FIG. 1; and, FIG. 15(b) is a cross-sectional view of FIG. 15(a) taken along the line A—A.
Figure 15B:
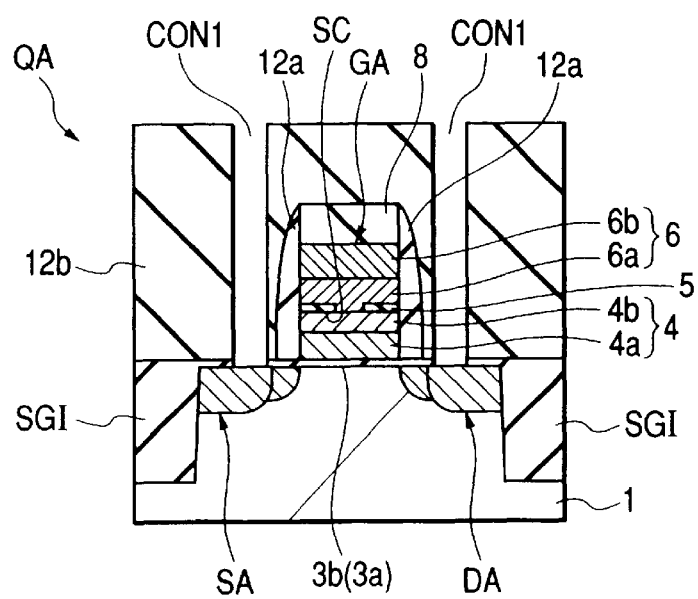

First, the MOS QA shown in FIGS. 15(a) and 15(b) represents a MOS having a relatively long gate length (horizontal direction in FIG. 15(a)) and gate width (vertical direction in FIG. 15(a)). This MOS QA is used as an element for forming, for example, a power circuit, a boosting transformer, a word line driver and a decoding circuit. For example, the input circuits nMOS Qipn, QINVn, QINVS and pMOS Qipp, and the output circuit pMOS Q0out, short MOS N2, selection MOSs N1 and N3 preferably have this structure.

In the case where the MOS QA forms a high-voltage circuit in which a high voltage (i.e. 18V) would be applied to the gate electrode GA, the gate insulating film is required to have a high withstand voltage, so that in the MOS QA shown in FIG. 15(b), the relatively thick insulating film 3b is used as the gate insulating film.

Although a large driving power is not required, in this type of MOS QA, it is necessary to provide a long gate length . To this end, the edge-to-edge distance of the gate electrode GA has to be made long, which tends to result in an increase in the resistivity. An increase in the resistivity means an increase in the through current, and that, in turn, causes an increase in the power consumption of the flash memory (EEPROM). In Embodiment 1 of the present invention, the gate electrode of a peripheral circuit MOS is constructed by forming a stack of t he conductive film 4 for the floating gate electrode and the conductive film 6 for the control gate electrode as in the memory cells MC and electrically connecting these films via contact holes; however, when the same rule is simply applied to the layout of the contact holes SC of all of the MOSs for the peripheral circuits, the above problem tends to occur. On the other hand, when attempting to solve this problem without providing the contact holes SC, it becomes difficult to lay out the gate electrode GA and the contact holes CON1 for the reduction in the resistivity of the gate electrode GA.

Accordingly, in Embodiment 1 of the present invention, in this type of MOSQA, as exemplified in FIG. 15(a), a plurality of contact holes SC are arranged at a given interval over the surface of the gate electrode GA in a region which two-dimensionally overlaps the active area LA along the direction in which the gate electrode extends. In other words, the conductive film 6 and the conductive film 4 are electrically connected through the contact holes SC at a plurality of locations in the region of the gate electrode GA above the active area LA. In this embodiment, a plurality of contact holes SC are also provided in the widened sections at both ends of the top surface of the gate electrode GA where they two-dimensionally overlap with the isolation areas. In other words, the conductive film 6 and the conductive film 4 are electrically connected through the contact holes SC also at a plurality of locations in the widened sections. By arranging the contact holes SC in this way providing the contact holes SC in the gate electrode GA mainly at the region which two dimensionally overlaps the active area LA), the resistivity of the gate electrode GA can be substantially reduced. Thus, the generation of a through current due to an increase in the resistivity of the gate electrode GA can be suppressed or prevented, and this, in turn, can suppress or prevent an increase in the power consumption of the flash memory (EEPROM). This also would make it easy to design the layout of such MOSs QA including the contact holes CON1 and SC. That is, this would allow an easier transition from circuit design to device design.

The diameter of the contact holes SC may be equal to that of the contact holes CON1, however, they may be made larger than the diameter of the contact holes CON1 in consideration of the reduction in resistivity and simplification of the manufacturing processes since it is independent of the size of the memory cell. Although the invention is not so limited, the diameter of the contact holes SC may be in the order of, for example, 0.3 $\mu$m, and the diameter of the contact holes CON1 may be in the order of, for example, 0.24$\mu$ to 0.26 $\mu$m. Also, exemplary dimensions of respective components other than those specified above are as follows, although the invention is not limited. That is, the gate length of the gate electrode GA may be in the order of 0.9 $\mu$m to 1 $\mu$m and the gate width may be in the order of 5 $\mu$m to 20 $\mu$m.

FIG. 15(a) illustrates an example in which two contact holes SC are arranged on each widened end of the gate electrode GA that two-dimensionally overlaps the isolation area, so as that the holes are aligned in a direction orthogonal to the current flow. The contact holes CON1 provided in the widened section of the gate electrode GA for connecting the first-level wiring layer and the gate electrode GA are arranged at locations in proximity of, or that two-dimensionally overlap with, the contact holes SC provided in the same widened section in order to minimize the area occupied by the gate electrode GA and to reduce the resistivity. Also, in the semiconductor regions SA and DA of the MOS QA, contact holes CON1 are arranged in a manner such that they two-dimensionally correspond to the contact holes SC arranged in the region of the gate electrode GA which overlaps the active area LA. The configuration as shown in FIG. 15(b) employs a so-called LDD (lightly doped drain) structure in which the semiconductor regions SA and DA for the source and drain are provided with regions containing relatively low concentrations of impurities on the sides adjacent to the channel, and regions containing relatively high concentrations of the impurities in other locations.

Figure 16A:
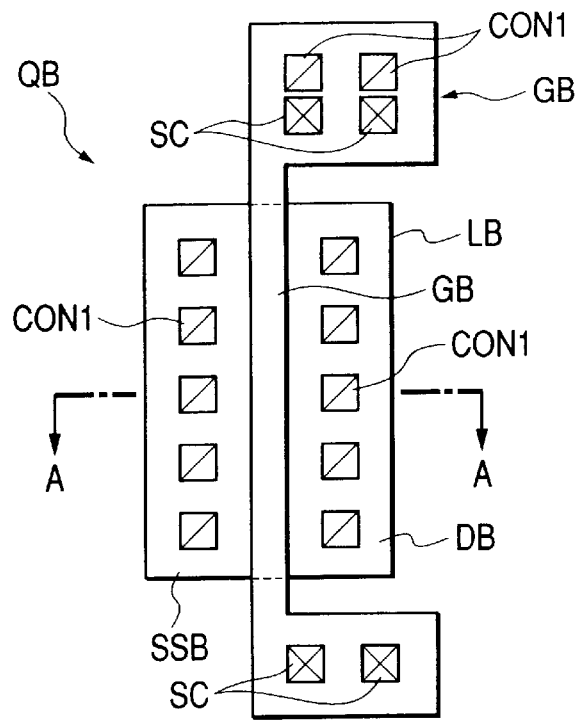
FIG. 16(a) is a plan view showing the layout of another device constituting the peripheral circuit of the flash memory (EEPROM) of FIG. 1; and, FIG. 16(b) is a cross-sectional view of FIG. 16(a) taken along the line A—A.
Figure 16B:
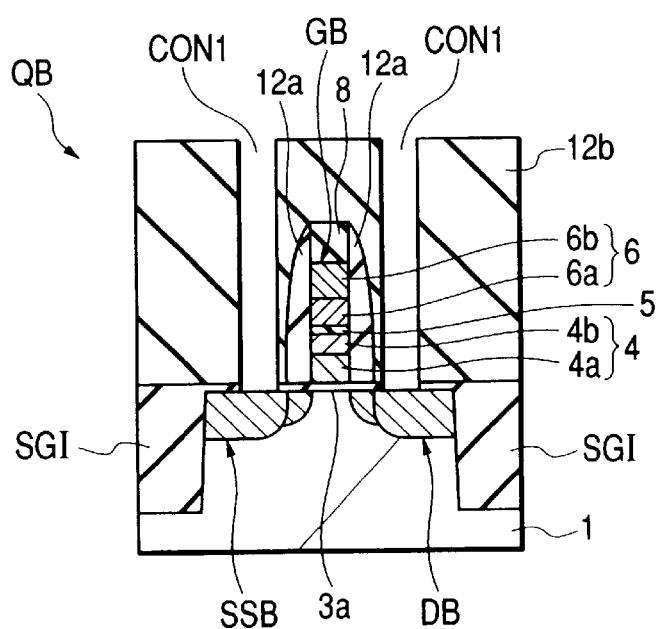

Next, the MOS QB shown in FIGS. 16(a) and 16(b) is a MOS having a relatively short gate length (the dimension in the horizontal direction in FIG. 16(a)) and a short gate width (the dimension in the vertical direction in FIG. 16(a)). This MOS QB is used as an element for constituting a circuit having a relatively high operation speed, such as, for example a logic circuit, control circuit or output circuit. The configuration shown in FIG. 16(b) uses the aforementioned relatively thin insulating film 3a as the gate insulating film of the MOSQB for improving the operation speed by an increased driving power.

In this type of MOS QB, a large driving power is required, but the gate width may be short. In most cases, the gate width itself may be shortened to an extent which would not cause a narrow channel effect (reverse short channel effect). Therefore, attention does not have to be paid to an increase in the resistivity of the gate electrode GB as much as in the case of the gate electrode GA of MOS QA . On the other hand, since the gate electrode GB generally has a short gate length, the aforementioned arrangement rule of the contact holes SC of the gate electrode GA cannot be applied to this example as it is.

Accordingly, in Embodiment 1 of the present invention, in this type of MOSQB, as exemplified in FIG. 16(a), contact holes SC are provided, not in the region of the top surface of the gate electrode GB, which two-dimensionally overlaps the active area LB, but in the widened sections which two-dimensionally overlap with the isolation areas. That is, the conductive film 6 and the conductive film 4 are electrically connected through the contact holes SC at a plurality of locations on the gate electrode GB in the regions above the isolation areas. By arranging the contact holes SC in this way, the resistivity of the gate electrode GB may be sufficiently reduced. Accordingly, the generation of a through current due to an increase in the resistivity of the gate electrode GB may be suppressed or prevented, and this, in turn, will suppress or prevent an increase in the power consumption of the flash memory (EEPROM). This also would make it easier to design the layout of the MOSs QB including the contact holes CON1 and SC. That is, this would allow an easier transition from circuit design to device design.

In this example of MOS QB, two contact holes SC are provided in each widened end of the gate electrode GB that two-dimensionally overlaps the isolation area, so as that they are aligned in a direction orthogonal to the direction of the current flow. The diameters of the contact holes SC and CON1 in the MOSQB may be the same as those in the previously mentioned MOS QA. Although the invention is not particularly so limited, exemplary dimensions of the other components may be given as follows. That is, the gate length of the gate electrode GB may be in the order of, for example, 0.4 $\mu$m to 0.5 $\mu$m, and the gate width may be in the order of, for example, 2 $\mu$m to 10 $\mu$m.

Again in FIG. 16(a), the contact holes CON1 provided in the widened sections of the gate electrode GB may be arranged at locations in the proximity of, or that overlap with, the contact holes SC provided in the widened sections in order to reduce the resistivity. Here, regarding the semiconductor regions SSB and DB for the source and drain, FIG. 16(b) shows an example having an LDD structure, similar to the semiconductor regions SA and DA previously mentioned.

Figure 17A:
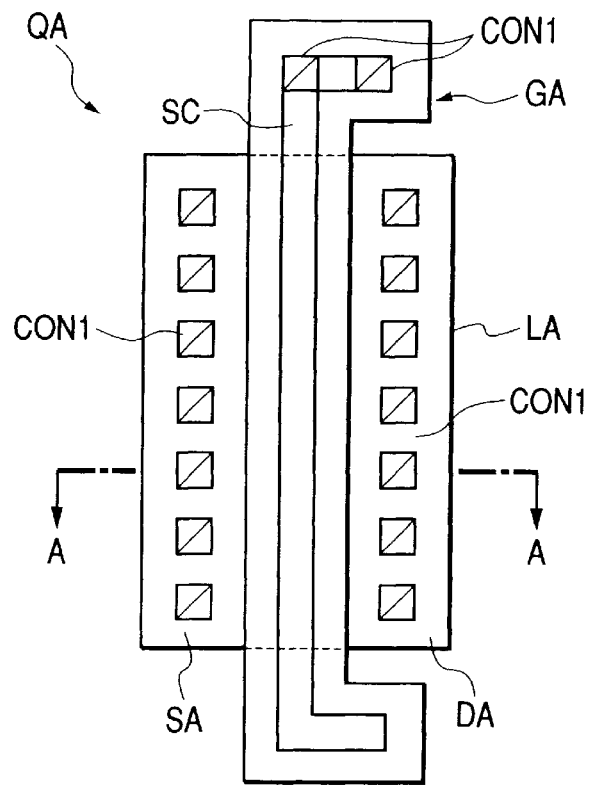
FIG. 17(a) is a plan view of a modified example of the layout of the element constituting the peripheral circuit of the flash memory (EEPROM) shown in FIG. 15; and, FIG. 17(b) is a cross-sectional view of FIG. 17(a) taken along the line A—A.
Figure 17B:
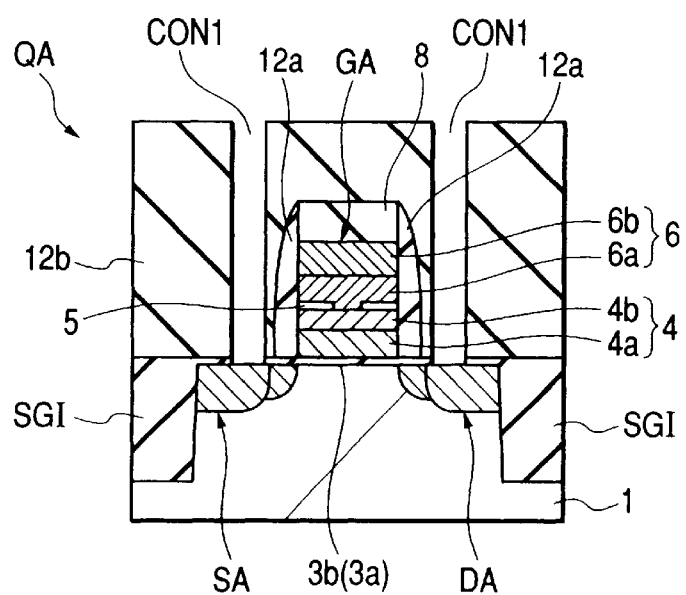

FIGS. 17(a) and 17(b) show a modified version of the aforementioned MOS QA. Here, a contact hole SC extends, in a contiguous manner, across almost the entire surface of the gate electrode GA in the direction in which the gate electrode extends. In this way, the contact area of the conductive film 4 and the conductive film 6 may be increased. Thus, the resistivity of the gate electrode GA may be further reduced. Also, since the area of the contact hole SC is large, the formation of the hole can be achieved in a easier manner. In this example, two contact holes CON1 are shown as being aligned so as to overlap two-dimensionally with a portion of the contact hole SC within a widened section of the gate electrode GA above the isolation area. The contact hole SC may be provided as a hole which two-dimensionally extends across a region that overlaps only the active area LA.

Figure 18A:
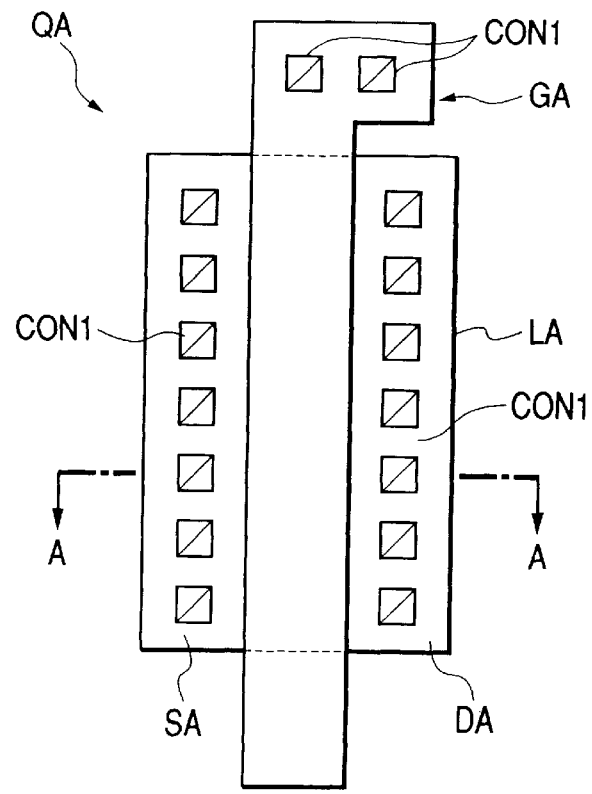
FIG. 18(a) is a plan view of a modified example of the layout of the device constituting the peripheral circuit of the flash memory (EEPROM) shown in FIG. 15; and, FIG. 18(b) is a cross-sectional view of FIG. 18(a) taken along the line A—A.
Figure 18B:
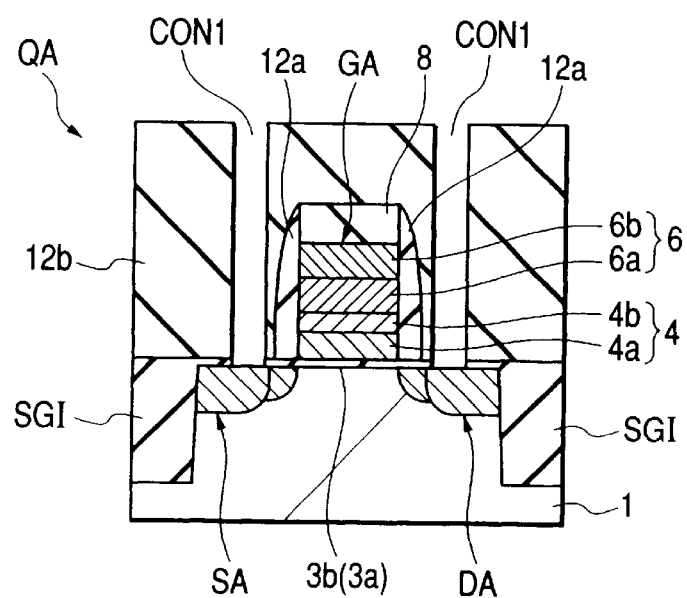

FIGS. 18(a) and 18(b) show another modified version of the aforementioned MOS QA. In this example, the two-dimensional shape and the dimensions of the gate elect rode GA are identical to those of the contact hole SC, but a contact hole SC is arranged so that it two-dimensionally overlaps and matches with the pattern of the gate electrode GA. This would cause the conductive film 4 and the conductive film 6 of the gate electrode GA to be stacked together in direct contact within the entire plane of the each film. Since this would result in a further increase in the contact area between the conductive film 4 and the conductive film 64 the resistivity of the gate electrode GA can be substantially reduced. This structure may be implemented in only the MOS QA or in both the MOS QA and the MOS QB. The method of forming such a structure will be explained with reference to Embodiment 2.

Figure 19A:
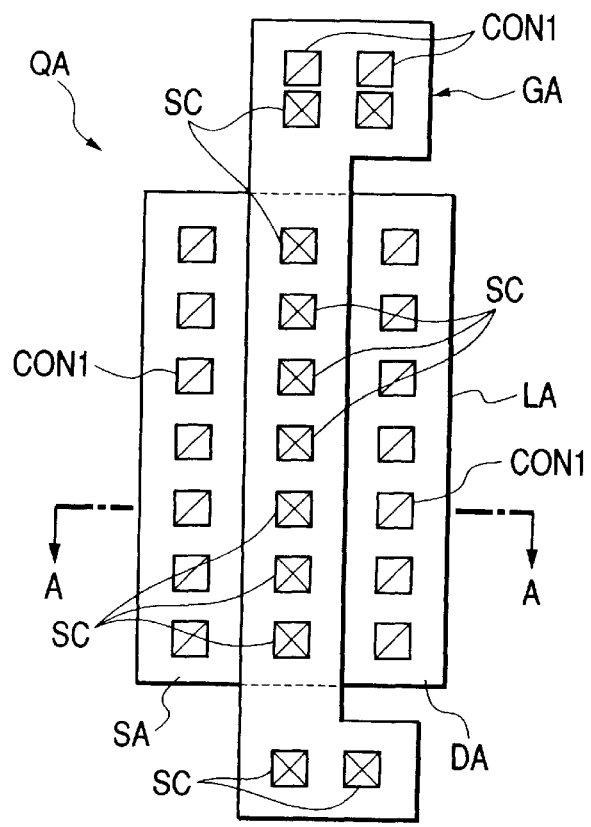
FIG. 19(a) is a plan view of a modified example of the layout of the device constituting the peripheral circuit of the flash memory (EEPROM) shown in FIG. 15; and, FIG. 19(b) is a cross-sectional view of FIG. 19(a) taken along the line A—A.
Figure 19B:
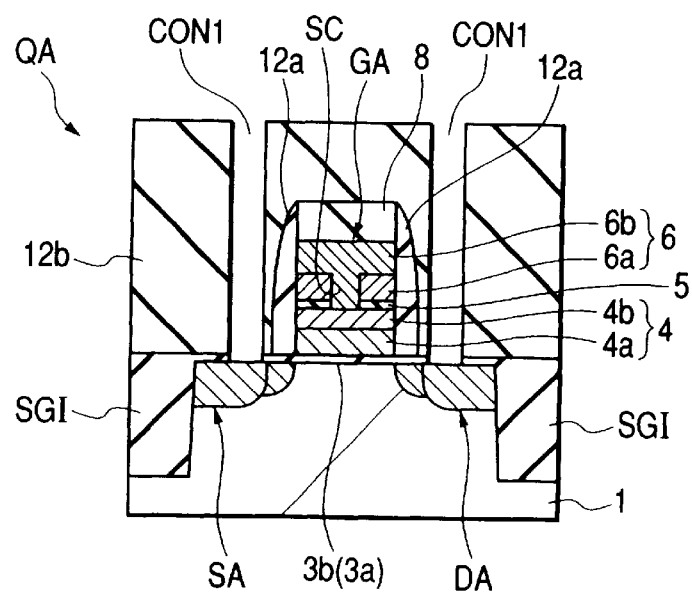

FIGS. 19(a) and 19(b) show still another modified version of the aforementioned MOS QA. In this example, the two-dimensional layout is identical to that in FIG. 15(a), but in its cross-section, as shown in FIG. 19(b), the structure has contact holes SC that are provided through the conductive film 6a of the conductive film 6 and the interlayer film 5, thereby electrically connecting the conductive film 6b above the conductive film 6a to the conductive film 4 via the contact holes SC. That is, in this example, after the deposition of the conductive film 6a over the inter layer film 5, the contact hole SC is formed by a dry etching method using a photo resist pattern as an etching mask. In this way, the photo resist pattern for forming the contact hole SC is not brought into a direct contact with the interlayer film 5 during the formation of the contact holes SC, so that the contamination of the interlayer film 5, which contributes to the storage function of the memory cell MS, may be substantially reduced. Accordingly, since the risk of failure or the degradation of reliability due to such contamination may be reduced, the yield and the reliability of the flash memory (EEPROM) may be improved.

Figure 20A:
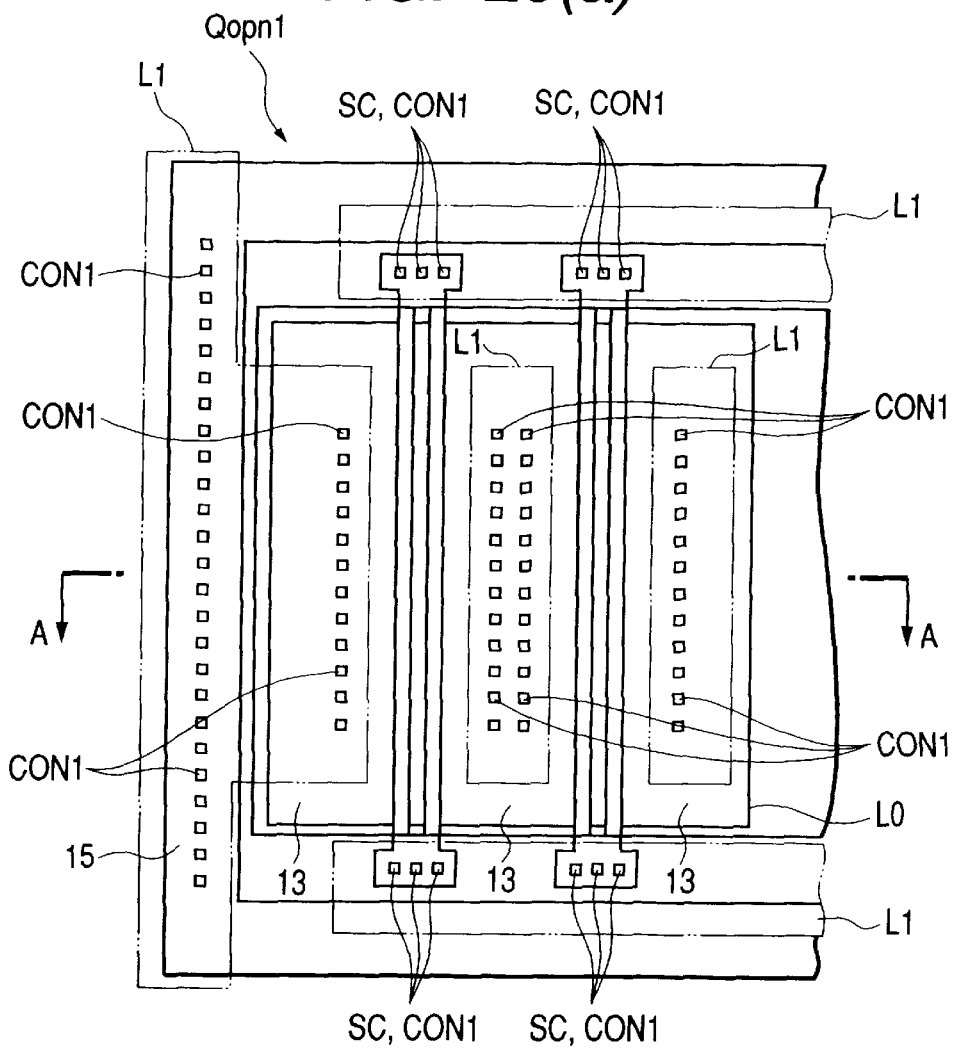
FIG. 20(a) is a plan view showing the layout of a device for protecting the flash memory (EEPROM) of FIG. 1; and, FIG. 20(b) is a cross-sectional view of FIG. 20(a) taken along the line A—A.
Figure 20B:
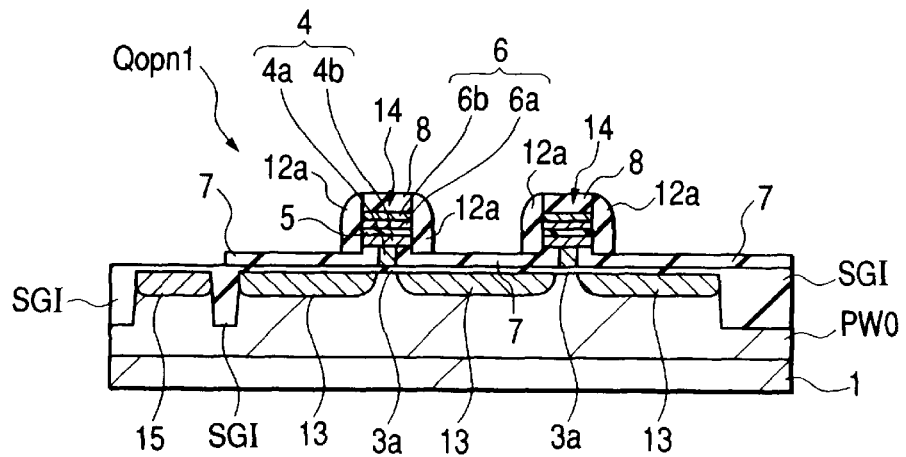

Next, FIGS. 20(a) and 20(b) show an exemplary structure of the RNOS Qopn1 for protecting the above-described output circuit according to Embodiment 1 of the present invention. As previously explained, in Embodiment 1, the structure of the protective nMOS Qopn1 is almost identical to that of the memory cells MC of the flash memory (EEPROM). This means that a highly protective nMOS Qopn1 may be obtained by forming this protective element to have the same structure as the memory cells which can provide a high electrostatic breakdown resistivity as it inherently has a low withstand voltage (of the drain edge). One example may be given as follows.

A p-type well PWo is formed in a semiconductor substrate 1, and, within this region, the above-mentioned protective nMOS Qopn1 is formed. The protective nMOS Qopn1 comprises a pair of n-type semiconductor regions 13 for the source and drain, an insulating film 3a and a gate electrode 14. In the example shown, there are two gate electrodes 14 two-dimensionally overlapping one active area LO, and the middle semiconductor region 13 serves as a common region for the nMOSs Qopn1 on the left and right.

The pair of n-type semiconductor regions 13 of the protective nMOS Qopn1 are formed by introducing, for example, arsenic, and they are formed during the same impurity doping process as the pair of n-type semiconductor regions 2S, 2D of the memory cells MC the impurity profile of the n-type semiconductor regions 13 is the same as that of the n-type semiconductor regions 2S, 2D of the memory cells MC.

Similarly, the p-type well PWo is formed during the same impurity doping process as the p-type well PWm of the memory cells MC, so that it has the same impurity profile as that of the p-type well PWm. Over this p-type well PWo, a $p^+$-type semiconductor region is is formed. This $P^+$-type semiconductor region 15, having a band-like two-dimensional shape, is formed so as that it extends along a direction parallel to the direction in which the gate electrode 14 extends. A plurality of contact holes CON1 connecting the first-level wiring layer L1 and the $p^+$-type semiconductor region 15 are aligned along the direction in which the $p^-$-type semiconductor region 15 extends. The potential to the p-type well PWo is applied through the $p^+$-type semiconductor region 15.

The gate electrode 14 is constructed by over-laying a conductive film 6 for forming a control gate electrode on the conductive film 4 for forming a floating gate electrode via an interlayer film 5 in a manner fundamentally similar to that of the memory cells MC, and the conductive film 4 is formed to have a T-shape in its cross section in the same way as the memory cells MC. However, in the protective nMOS Qopn1, the conductive film 4 and the conductive film 6 of the gate electrode 14 are electrically connected through contact holes SC. The example shown in FIG. 20(a) is illustrated as having contact holes SC provided in the widened sections at both ends of the gate electrode 14, which two-dimensionally overlap with the isolation areas, however, they may be arranged as illustrated in FIGS. 15(a), 17(a), 18(a) or 19(a). The contact holes CON1 electrically connecting the first-level wiring layer L1 and the gate electrode 14 are disposed so as to two-dimensionally overlap and match the locations of the contact holes SC. In this way, a minimization of the area occupied by the gate electrode 14 and a reduction of the resistivity may be attempted. Between a portion of the conductive film 4 of the gate electrode 14 and the semiconductor substrate 1, an insulating film 7 is interposed in a similar manner to that of the memory cells MC. Over the top surface of the gate electrode 14, a cap insulating film 8 is formed, and over the side surfaces thereof, an insulating film 12a is formed. The plurality of contact holes CON1 for electrically connecting the first-level wiring layer L1 and the n-type region 13 are arranged side by side along the direction in which the gate electrode 14 extends.

Figure 21:
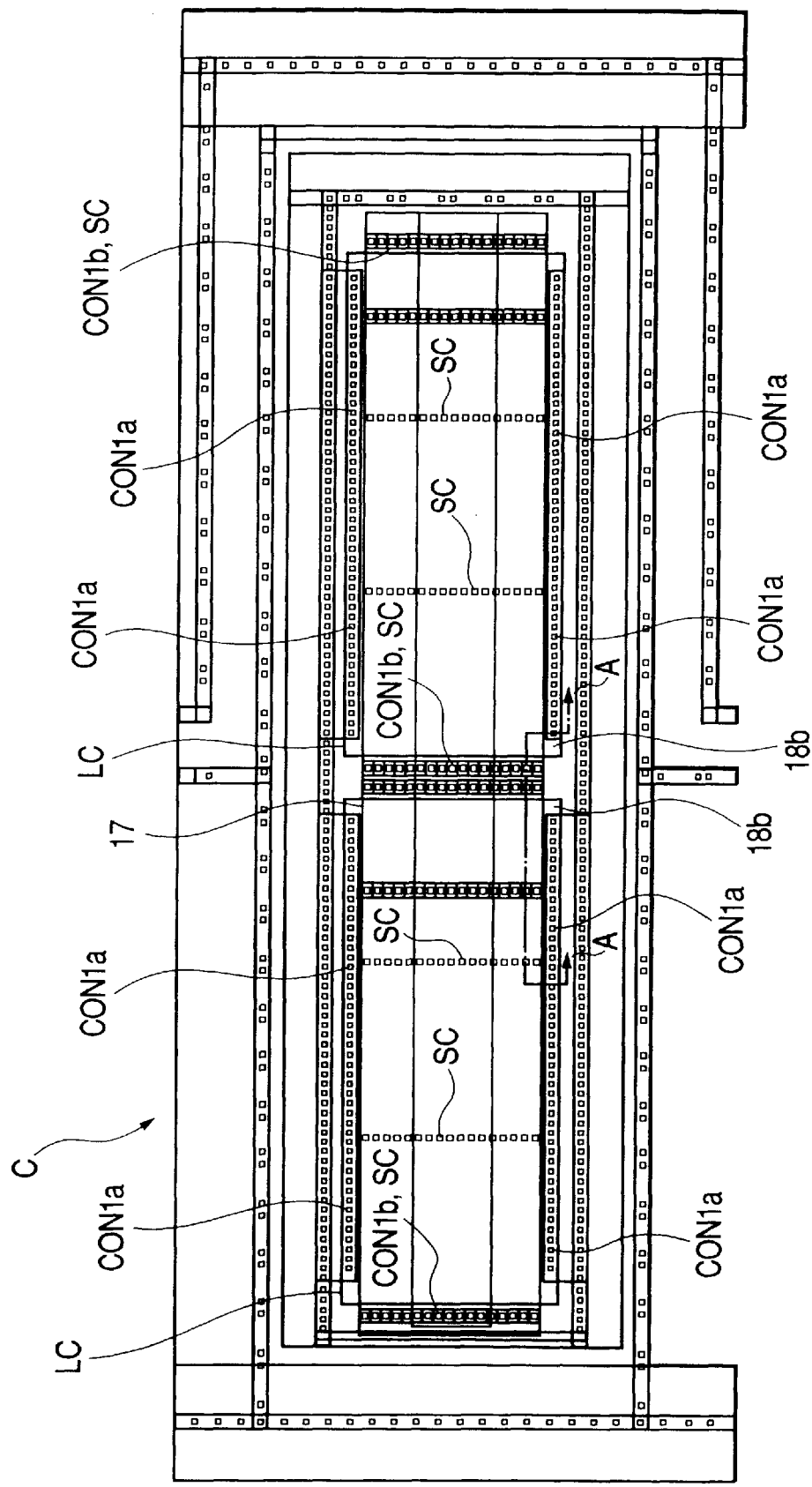
FIG. 21 is a plan view of one example of the layout of capacitor elements forming the flash memory (EEPROM) of FIG. 1.
Figure 22:
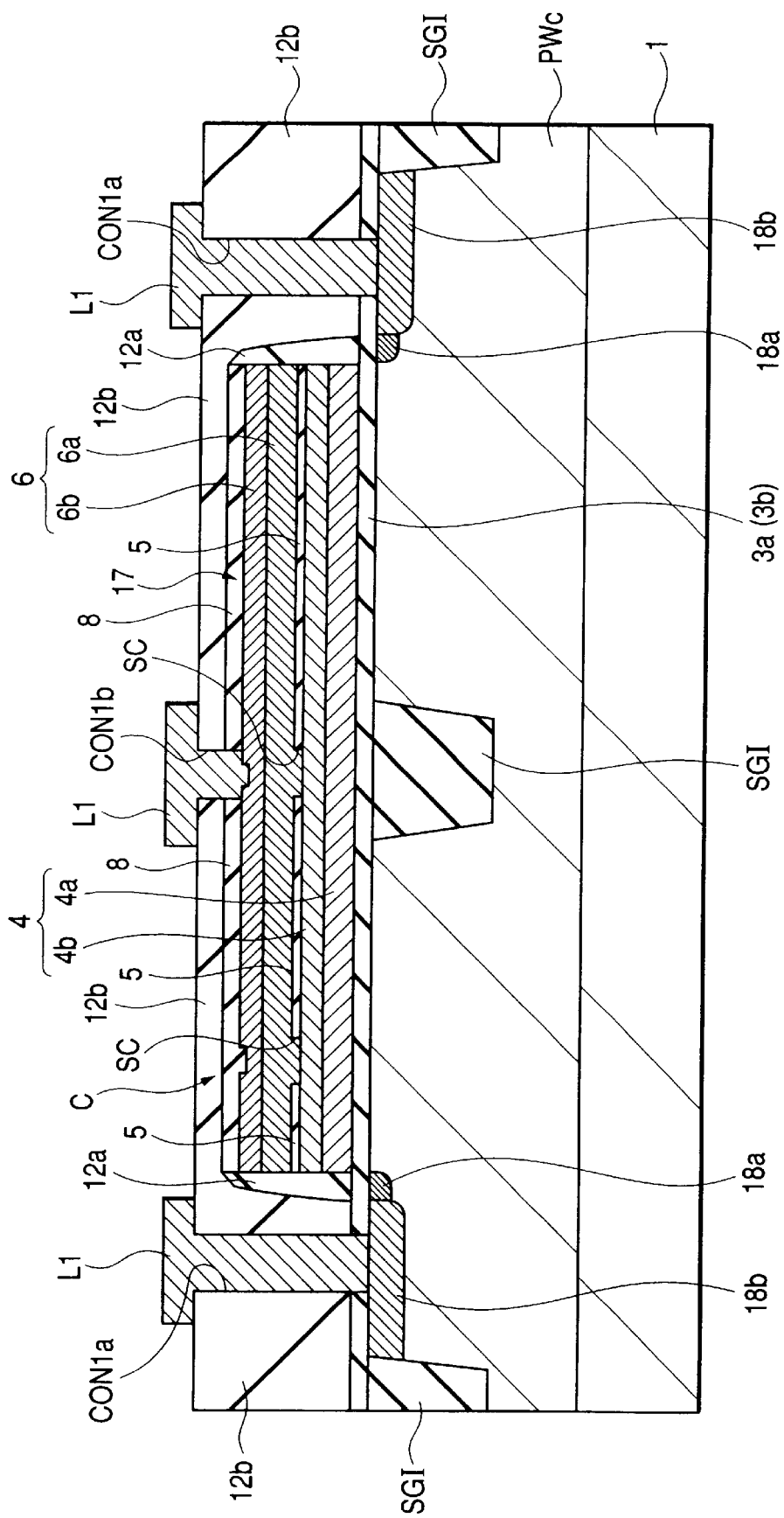
FIG. 22 is a cross-sectional view of FIG. 21 taken along the line A—A.

FIGS. 21 and 22 illustrate an exemplary structure of a capacitor element incorporated in a part of the flash memory (EEPROM) of Embodiment 1. FIG. 22 is a cross-sectional view of FIG. 21 taken along the line A—A.

The capacitor element C is constructed by providing an upper electrode 17 over a p-type well PWc of a semiconductor substrate 1 via an insulating film 3a (or an insulating film 3b) In the semiconductor substrate 1, two active areas LC, LC are arranged via a trench-type isolation area SGI. The p-type well PWc within the active area LC constitutes a lower electrode of the capacitor element C. The active area LC is divided into two areas in order to reduce the resistivity of the lower electrode (p-type well PWc) and also for the convenience of the layout of contact holes CoN1b for the upper electrode 17, which will be described later. In the top portion of this p-type well PWc at locations near the edges of the bottom of the upper electrode 17, P⁻-type semiconductor regions 18a and p⁺-type semiconductor regions 18b are formed. To the P⁻-type semiconductor regions 18a and p⁺-type semiconductor regions 18b, boron, for example, has been doped. The P⁺-type semiconductor regions 18b are formed at locations separated from the edges of the bottom of the top electrode 17 farther than the locations of P⁻-type semiconductor regions 18a by the width of the insulating film 12a. These p⁺-type semiconductor regions 18b are electrically connected with the first-level wiring layer L1 through contact holes CON1a provided in the insulating film 12b. A plurality of the contact holes CON1a are arranged side by side along the longitudinal sides of the top electrode 17.

The insulating film 3a (or 3b) of the capacitor element C forms a capacitance insulating film of the capacitor element C. In Embodiment 1 of the present invention, this capacitor element C also has a similar structure to that of the memory cells MC. That is, its upper electrode 17 is constructed by electrically connecting the conductive film 4 for the floating gate electrode of the memory cell MC and the conductive film 6 for the control gate electrode of the memory cell MC provided thereon via the insulating film 5, through the contact holes SC opened in the interlayer film 5. A plurality of the contact holes SC are arranged side by side along the direction of the width of the upper-electrode 17 over column lines that are arranged at a given interval in a longitudinal direction of the upper electrode 17. The contact holes SC are provided both over the active area LC of the semiconductor substrate 1 that constitutes the lower electrode and over the trench-type isolation area SGI between the adjacent active areas LC.

This upper electrode 17 is electrically connected to the first-level wiring layer L1 through the contact holes CON1b provided within the insulating film 12b. These contact holes CONIB are not provided over the active areas LC, but are provided only over the trench-type isolation section (isolation area) SGI between the adjacent active areas LC. This is because of, for example, the following reason. That is, these contact holes CON1b are formed in the same process as the previously-mentioned contact holes CON1a, so that it is possible that the contact holes CON1b are to be formed excessively deep while the contact holes CON1a are perforated, since the contact holes CON1a have to be deeper than the contact holes CON1b. Accordingly, the contact holes CON1b are provided over the trench-type isolation section (isolation area) SGI so that such excessive deepening will not cause a failure of the capacitor element C. For the purpose of this explanation, the contact holes CON1 are described as being separate contact holes CoN1a and CON1b, however, these contact holes CON1a and CON1b are substantially identical to the contact holes CON1.

Such a capacitor element C is used in, for example, a booster circuit (charge pump circuit), and a delay circuit etc. When the capacitor element C is used in a booster circuit that would form a high voltage of, for example, 3.3V to 18V, it is preferable to use the relatively thick insulating film 3b as the capacitance insulating film. On the other hand, when the capacitor element C is used in a delay circuit of a logic circuit etc., a relatively thin insulating film 3a may be used as the capacitance insulating film since only a low voltage would be applied.

The contact holes SC also may be provided only at locations that two-dimensionally overlap with the active areas LC, or only at locations that two-dimensionally overlap with the isolation section SGI.

In the following, one example of the method of manufacture of the flash memory (EEPROM) of Embodiment 1 will be explained.

FIGS. 23 through 25 are diagrams of the flash memory (EEPROM) of Embodiment 1 during manufacturing process. FIG. 23 is a schematic plan view of the section corresponding to the one shown in FIG. 7. FIG. 24 is a schematic cross-sectional view including the memory array MARY and peripheral circuit region of the flash memory (EEPROM), and the view of the memory array shown here corresponds to an A—A cross section of FIG. 7. FIG. 25 corresponds to a B—B cross section of FIG. 7. The Vpp nMOS and PMOS are the MOSs for forming the peripheral circuits in a high-voltage-system using a relatively high driving voltage in the order of, for example, 8V. The Vcc nMOS and PMOS are the MOSs for forming peripheral circuits in a low-voltage-system using a relatively low driving voltage in the order of, for example, 1.8V to 3.3V. Such conditions are assumed also in the subsequent figures.

First as shown in FIGS. 23 through 25, trench-type isolation areas SGI and active areas Lm etc. between the isolation areas SGI are formed in the principal surface of a semiconductor substrate 1 (at this point of time, this is a semiconductor thin plate having a circular two-dimensional shape, called a semiconductor wafer). That is, after forming the isolation trenches at given locations of the semiconductor substrate 1, an insulating film made of, for example, silicon oxide is deposited over the principal surface of the semiconductor substrate 1, and by polishing it by a chemical mechanical polishing (CMP) method etc. so as to leave the insulating film only within the isolation trenches, the isolation areas SGI are formed.

Next, by selectively doping given impurities to the given sections of the semiconductor substrate 1 at given energies by an ion implantation method etc., an embedded n-type well NWm, p-type well PWm, p-type wells NWp1, PWp2 and n-type wells NWp1, NWp2 are formed.

FIG. 26 is a schematic cross-sectional view of the section shown in FIG. 24 during a subsequent step of the manufacturing process, and FIG. 27 is a schematic cross-sectional view of the section shown in FIG. 25 during the subsequent step of the manufacturing process. Herein, two types of insulating films 3a and 3b having different thicknesses are formed as shown in FIGS. 26 and 27, for example, in the following manner.

First, over the principal surface of the semiconductor substrate 1, an insulating film having a large thickness in the order of, for example, 20 nm is formed through a thermal oxidation method etc. This is followed by the formation of a photo resist pattern, which exposes a memory array region and low-voltage MOS regions (exemplarily indicated as Vcc PMOS and Vcc nMOS) on the thick insulating film and covers all other regions, and the exposed portions of the thick insulating film are etched away via a wet etch method etc. using the photo resist pattern as the etching mask. Thereafter, the photo resist pattern is eliminated, and a thermal oxidation treatment is then performed over the semiconductor substrate 1 for forming a tunnel oxide film on the memory array. In this way, the relatively thin gate insulating film 3a having a thickness in the order of, for example, 9 nm is formed in the memory array region (including short MOS region) and the low-voltage MOS regions, and the relatively thick insulating film 3b having a thickness in the order of, for example, 25 nm is formed in the high-voltage MOS regions (exemplarily indicated as Vpp PMOS and Vpp nMOS) and the selection MOS region.

FIG. 28 is a schematic plan view of the same section as that shown in FIG. 23 during a subsequent step of the manufacturing process, FIG. 29 is a schematic cross-sectional view of the same section as that shown in FIG. 24 during the subsequent step of the manufacturing process, and FIG. 30 is a schematic cross-sectional view of the same section as that shown in FIG. 25 during the subsequent step of the manufacturing process.

Over the principal surface of the semiconductor substrate 1, a conductive film 4a made of polycrystalline silicon having a low resistivity in a thickness in the order of, for example, 70 nm, and an insulating film 19 made of silicon nitride etc. are sequentially formed from the bottom by a CVD method etc., and by processing the insulating film 19 and the conductive film 4a by photolithographic and dry-etching techniques, the conductive film 4a which forms the floating gate electrodes (first gate electrodes) is patterned in the memory array. At this time, the peripheral circuit region (high-voltage MOS regions, low-voltage MOS regions, and selection MOS region etc.) is entirely covered by the conductive film 4a and the insulating film 19. Thereafter, by introducing an impurity (for example, arsenic) for forming the drain and source of the memory cells in the semiconductor substrate 1 through an ion implantation method, pairs of n-type semiconductor regions 2S and 2D (local source lines SS and sub-bit lines SB) are formed. At this point, the high-voltage MOS regions, low-voltage MOS regions and selection MOS region etc. are covered by the conductive film 4a. In this way, the gate length of the short MOSs can be determined only by the conductive film 4a.

FIG. 31 is a schematic cross-sectional view of the same section as that shown in FIG. 24 during a subsequent step in the manufacturing process, and FIG. 32 is a schematic cross-sectional view of same the section as that shown in FIG. 25 during the subsequent step of the manufacturing process. In this process, after depositing an insulating film 7 made of, for example, silicon oxide, over the principal surface of the semiconductor substrate 1 via a CVD method, the insulating film 7 is polished by a CMP method so that the insulating film 7 is left within the recesses in the principal surface of the semiconductor substrate 1, and it is further etched using a dry etching method. In this way, the principal surface of the semiconductor substrate 1 is made flat. This would also prevent the conductive film for the later-described floating gate electrode to be deposited thereon from being connected with the n-type semiconductor regions 2S and 2D forming the sources and drains of the memory cells. At this point, the insulating film 19 is also eliminated, and this serves to protect the layer below.

FIG. 33 is a schematic plan view of the same section as that shown in FIG. 23 during a subsequent step of the manufacturing process, FIG. 34 is a schematic cross-sectional view of the same section as that shown in FIG. 24 during the subsequent step of the manufacturing process, and FIG. 35 is a schematic cross-sectional view of the same section as that shown in FIG. 25 during the subsequent step of the manufacturing process.

After depositing a conductive film 4b made of, for example, polycrystalline silicon having a low resistivity to a thickness in the order of 40 nm over the principal surface of the semiconductor substrate 1, a photo resist pattern PR1 is formed thereon by a photolithographic technique, and by eliminating the exposed portions of the conductive film 4b through a dry etching method etc. using the photo resist pattern as the etching mask, floating gate electrodes constituted by the conductive films 4a and 4b are formed. In the photolithography (exposure process) for the formation of the photo resist pattern PR1, a phase shift mask (half-tone mask) is used to minimize the spacing between adjacent portions of the conductive film 4b. This is so done in order to improve the coupling ratio between the floating gate electrodes and the control gate electrodes (second gate electrodes) by maximizing the area of the conductive film 4b by making the spacing S between adjacent portions of the conductive film 4b as narrow as possible so as to be able to satisfy the given rewrite characteristic requirement even if the memory cells are further miniaturized in the memory array regions. At this point of time, the high-voltage MOS regions, low-voltage MOS regions, short MOS region and selection MOS region are entirely covered by the conductive film 4b.

FIG. 36 is a schematic plan view of the same section as,that shown in FIG. 23 during a subsequent step of the manufacturing process, FIG. 37 is a schematic cross-sectional view of the same section as that shown in FIG. 24 during the subsequent step of the manufacturing process, and FIG. 38 is a schematic cross-sectional view of the same section as that shown in FIG. 25 during the subsequent step of the manufacturing process.

In this process, an interlayer film 5 (second insulating film) is formed to a thickness in the order of, for example, 15 nm by sequentially depositing by the CVD method, for example, a silicon oxide film, a silicon nitride film and a silicon oxide film from the bottom over the semiconductor substrate 1, and a photo resist pattern PR2 for the formation of the contact holes SC is then formed thereon by a photolithographic technique. Thereafter, by eliminating the exposed portions of the interlayer film S by a dry etching method using this photo resist pattern PR2 as the etching mask,.contact holes SC are formed within the interlayer film 5. In FIG. 36, the contact holes SC in the upper row are provided over the gate electrode formation regions of the selection MOSs, and the contact holes SC in the lower row are provided over the gate electrode formation regions of the short MOSs. In FIG. 37, there is no indication of the contact holes SC over the high-voltage MOS regions and the low-voltage MOS regions, but the contact holes SC exposing the portions of the conductive film 4b are formed over the gate electrode formation regions of those MOSs at locations that are not shown in the cross section of FIG. 37.

FIG. 39 is a schematic plan view of the same section as that shown in FIG. 23 during a subsequent step of the manufacturing process, FIG. 40 is a schematic cross-sectional view of the same section as that shown in FIG. 24 during the subsequent step of the manufacturing process, and FIG. 41 is a schematic cross-sectional view of the same section as that shown in FIG. 25 during the subsequent step of the manufacturing process.

In this process, a conductive film 6a made of, for example, polycrystalline silicon having a low resistivity, a conductive film 6b made of tungsten silicide etc., and a cap insulating film 8 made of silicon oxide, etc. are sequentially deposited on the semiconductor substrate 1 from the bottom by a CVD method etc., and, thereafter, these films are patterned by photolithographic and dry etching techniques. In this manner, control gate electrodes (word lines) are formed in the memory array region, and in any other regions (the high-voltage MOS regions, low-voltage MOS regions, short MOS region and selection MOS region), portions of the gate electrodes of the respective MOSs are formed. In this etching process, the interlayer film 6 functions as an etching stopper. In Embodiment 1 of the present invention, there is no step between the memory array region and the peripheral circuit region, so that the word lines W may be formed with a small pitch.

FIG. 42 is a schematic cross-sectional view of the same section as that shown in FIG. 24 during a subsequent step of the manufacturing process, and FIG. 43 is a schematic cross-sectional view of the same section as that shown in FIG. 25 during the subsequent step of the manufacturing process. In this process, using the cap insulating film 8 and the conductive film 6 as an etching mask, the interlayer film 5 and the conductive films 4b and 4a are etched away by a dry etching method etc.

In this way, within the memory array region, the control gate electrodes and the floating gate electrodes for the memory cells MC are formed. In other words, the double-level gate electrode structure is completed, in which the conductive film 6 for the control gate electrode is formed over the conductive film 4 for the floating gate electrode via the interlayer film 5. The floating gate electrode and the control gate electrode of each memory cell MC are completely insulated. ( In the peripheral circuit region, (low-voltage MOS regions, high-voltage MOS regions, short MOS region and selection MOS region), the gate electrodes 20n, 20p, 21n, 21p, 9, 10 of the respective MOSs are formed. In each of the gate electrodes 20n, 20p, 21n, 21p, 9, 10, the conductive film 4 and the conductive film are electrically connected through a contact hole SC.

FIG. 44 is a schematic cross-sectional view of the same section as that shown in FIG. 24 during a subsequent step of the manufacturing process, and FIG. 45 is a schematic cross-sectional view of the same section as that shown in FIG. 25 during the subsequent step of the manufacturing process. Here, the semiconductor regions 22na, 22pa, 23na, 23pa, 11na of the respective MOSs, which include relatively low concentrations of impurities, are formed separately. To the semiconductor regions 11na, 22na, 23na, arsenic, for example, is doped, and to the semiconductor regions 22pa, 23pa, boron, for example, is doped. This is followed by the deposition of an insulating film made of, for example, silicon oxide over the principal surface of the semiconductor substrate 1 by a CVD method; and, by etching back this film using an anisotropic dry etching method, the insulating film 12a is left on the side surfaces of the gate electrodes 20n, 20p, 21n, 21p, 9, 10. The spaces between adjacent word lines W are filled with this insulating film 12a.

FIG. 46 is a schematic cross-sectional view of the same section as that shown in FIG. 24 during a subsequent step of the manufacturing process, and FIG. 47 is a schematic cross-sectional view of the same section as that shown in FIG. 25 during the subsequent step of the manufacturing process. Here, the semiconductor regions 22nb, 22pb, 23nb, 23pb, 11nb of the respective MOSs, which include relatively high concentrations of impurities, are separately formed. To the semiconductor regions 11nb, 22nb, 23nb, arsenic, for example, is doped, and to the semiconductor regions 22pb, 23pb, boron, for example, is doped. In this way, the pairs of n-type semiconductor regions 11, 22n, 23n and the pairs of p-type semiconductor regions 22p, 23p are formed for use as the sources and drains of the nMOSs QLn and pMOSs QHp in the low-voltage system, MOSs QHn and pMOSs QHp in the high-voltage system, and the selection MOSs N1, N3.

FIG. 48 is a schematic plan view of the same section as that shown in FIG. 23 during a subsequent step of the manufacturing process, FIG. 49 is a schematic cross-sectional view of the same section as that shown in FIG. 24 during the subsequent step of the manufacturing process, and FIG. 50 is a schematic cross-sectional view of the same section as that shown in FIG. 25 during the subsequent step of the manufacturing process. Here, an insulating film 12b made of silicon oxide, for example, is deposited over the semiconductor substrate 1 by a CVD method etc., and, in this insulating film 12b, contact holes CON1 are formed through photolithographic and dry etching techniques so as to expose the portions of the semiconductor substrate 1 (the source and drain regions of the respective MOSs), the portions of the word lines, and the portions of the gate electrodes of specific MOSs. Over this semiconductor substrate 1, a metal film made of tungsten, for example, is deposited by a sputtering method etc., and this is then patterned by photolithographic and dry etching techniques to form a first-level wiring layer L1 (including the common source line). The first-level wiring layer L1 is electrically connected, accordingly, with the pairs of the semiconductor regions serving as the sources and drains of the respective MOSs, the gate electrodes and the word lines W via the contact holes CON1.

FIG. 51 is a schematic plan view of the same section as that shown in FIG. 23 during a subsequent step of the manufacturing process, FIG. 52 is a schematic cross-sectional view of the same section as that shown in FIG. 24 during the subsequent step of the manufacturing process, and FIG. 53 is a schematic cross-sectional view of the same-section as that shown in FIG. 25 during the subsequent step of the manufacturing process. Here, an insulating film 12c made of silicon oxide, for example, is deposited over the semiconductor substrate 1 by a CVD method etc., and in this insulating film 12c, through holes TH1 are formed using photolithographic and dry etching techniques so as to expose the portions of the first-level wiring layer L1. Over this semiconductor substrate 1, a metal film made of tungsten, for example, is deposited by a sputtering method or a CVD method etc., and this film is then polished by a CMP method etc. so as to leave the metal film only within the through holes TH1 to form plugs 24 in the through holes TH1. Thereafter, for example, titanium nitride, aluminum and titanium nitride, for example, are sequentially deposited on the semiconductor substrate 1 from the bottom via a sputtering method etc., and by patterning these films using photolithographic and dry etching techniques, a second-level wiring layer L2 (including the main bit lines) is formed. The second-level wiring layer L2 is electrically connected with the first-level wiring layer L1 through the plugs 24.

FIG. 54 is a schematic cross-sectional view of the same section as that shown in FIG. 24 during a subsequent step of the manufacturing process, and FIG. 55 is a schematic cross-sectional view of the same section shown in FIG. 25 during the subsequent step of the manufacturing process. Here, an insulating film 12d made of silicon oxide, for example, is deposited over the semiconductor substrate 1 by a CVD method etc., and through holes TH2 are formed within this insulating film 12d in the same manner as the through holes TH1 so as to expose the portions of the second-level wiring layer L2. This is followed by the formation of plugs 25 made of tungsten etc. within the through holes TH2 in the same manner as the plugs 24, and a third-level wiring layer L3 is formed over the semiconductor substrate 1 by sequentially depositing the films of, for example, titanium nitride, aluminum and titanium nitride in the same manner as the second-level wiring layer L2. The third-level wiring layer L3 is in electrical connection with the second-level wiring layer L2 through the plugs 25. Thereafter, a surface protection film is formed over the semiconductor substrate 1, and openings are formed in the portions of the protection film so as to expose the portions of the third-level wiring layer L3 to form bonding pads, thereby completing the flash memory (EEPROM).

The major effects provided by Embodiment 1 of the present invention are as follows.

(1) By employing the same gate electrode structure as the idemory cells MC for the gate electrode structure of the peripheral circuit MOSs of the flash memory (EEPROM), the formation of a step at the boundary between the peripheral circuit region and the memory cell region may be prevented when the word lines of the memory cells MC are formed.

(2) Since the spacing between adjacent word lines W may be minimized due to the effect of (1), the area of the memory array regions can be reduced and the miniaturization of the size of the semiconductor chip may be further advanced.

(3) By employing the same gate electrode structure as the memory cells MC for the gate electrode structure of the peripheral circuit MOSs, and for those MOSs having a long gate length (i.e. high-voltage MOS), by providing contact holes SC for connecting the conductive films 4 and 6 within the plane of the gate electrode also at the locations over the active areas, the resistivity of the gate electrodes of those MOSs may be reduced.

(4) By the effect of (3), the power consumption of the flash memory (EEPROM) may be reduced.

(5) By varying the layouts of the contact holes SC for connecting the conductive films 4 and 6 according to the types of the MOSs arranged over the semiconductor substrate 1, the layouts of the respective patterns (i.e. contact holes CON1) of the MOSs may be designed more easily.

(6) By varying the layout of the contact holes SC for connecting the conductive films 4 and 6 according to the types of the MOSs arranged over the semiconductor substrate 1, the device may be designed without incurring inconveniences for the circuitry, so that the transition from the circuit design to the device design can be made more easily.

(7) By arranging the contact holes CON1 for connecting the first-level wiring layer L1 and the p⁺-type semiconductor regions 18b over the isolation areas when the gate electrode structure of the memory cells MC is employed for the capacitor elements formed over the semiconductor substrate 1, the occurrence of failures in the capacitor elements may be minimized.

(8) Due to the effect of (7), the yield and the reliability of the flash memory (EEPROM) may be improved.

Embodiment 2

Embodiment 2 of the present invention is provided for illustrating a manufacturing method for forming the structure shown in FIG. 18 that has been explained according to Embodiment 1.

FIGS. 56 and 57 illustrating Embodiment 2 of the resent invention are schematic cross-sectional views of the semiconductor substrate 1 after being processed through the manufacturing processes explained with reference to FIGS. 23 through 35 in Embodiment 1. FIG. 56 shows a schematic cross-sectional view of the same section as that shown in FIG. 24 during a step of the process subsequent to the process step of FIG. 35, and FIG. 57 shows a schematic cross-sectional view of the same section as that shown in FIG. 25 during a process step subsequent to the process step of FIG. 35.

Here, as previously mentioned, after the interlayer 5 is formed over the semiconductor substrate 1, a photo resist pattern PR3 is formed thereon. This photo resist pattern PR3 is formed in a manner so as to entirely cover the memory cell formation region, but to cover only the area other than particular portions (contact hole SC formation regions) in the gate electrode formation region of the short MOSs. The photo resist pattern PR3 is formed so as to leave any other peripheral circuit regions uncovered. Next, using this photo resist pattern PR3 as an etching mask, the exposed portions of the interlayer film 5 are etched off. In this way, the contact holes SC are formed in the short MOS region, and the surface of the conductive film 4b is entirely exposed in the other peripheral circuit regions. The photo resist pattern PR3 is then removed.

FIG. 5B is a schematic cross-sectional view of the same section as that shown in FIG. 24 during a subsequent step of the manufacturing process, and FIG. 59 shows a schematic cross-sectional view of the same section as that shown in FIG. 25 during the subsequent step of the manufacturing process. Here, the conductive film 6 and a cap insulating film 8 are sequentially deposited from the bottom over the semiconductor substrate 1 by a CVD method etc., and a photo resist pattern for the formation of the gate electrodes and the word lines is formed over the cap insulating film 8. After patterning the cap insulating film 8 using this photo resist pattern, the photo resist pattern is eliminated. Using the remaining cap insulating film 8 as an etching mask, the conductive films 6 and 4 are patterned, thereby forming the double-level gate electrodes of the memory cells MC and the gate electrodes 9, 10, 20n, 20p, 21n, 21p of the respective peripheral circuit MOSs. In Embodiment 2, the conductive film 4 and the conductive film 6 in the gate electrodes 10, 20n, 20p, 21n, 21p are electrically connected, being in direct contact across the entire plane of the gate electrode pattern. Accordingly, the resistivity of the gate electrodes 10, 20n, 20p, 21n and 21p may be further reduced. In this etching process, the cap insulating film 8 and the insulating films 3a and 3b made of silicon oxide are utilized as an etching stopper.

FIG. 60 shows a schematic cross-sectional view of the same section as that shown in FIG. 24 during a subsequent step of the manufacturing process, and FIG. 61 shows a schematic cross-sectional view of the same section as that shown in FIG. 25 during that subsequent step of the manufacturing process. Here, after forming a photo resist pattern PR4 over the semiconductor substrate 1 so as to cover the areas other than the intervals between adjacent word lines W by a photolithographic technique, and using this as a mask, by performing ion implantation of, for example, boron into the semiconductor substrate 1, punch through stoppers are formed for the word lines W arranged adjacent to each other over the semiconductor substrate 1. Since the subsequent processes are identical to those explained with reference to FIG. 44 and later figures of Embodiment 1, detailed descriptions thereof will be omitted.

Embodiment 3

Embodiment 3 of the present invention is provided for illustrating a manufacturing method when providing the protective MOS shown in FIG. 20 according to Embodiment 1.

First, as shown in FIG. 62, after forming the trench-type isolation sections SGI and active areas Lm (refer to FIG. 23)

in the principal surface of the semiconductor substrate 1 in the same manner as Embodiment 1, the embedded n-type well NWm, p-type well PWm, p-type wells PWp2, PWo and n-type well NWp2 are formed by selectively doping particular impurities with a given energy within given sections of the semiconductor substrate 1 by an ion implantation method etc. FIG. 62 is a schematic cross-sectional view of the semiconductor substrate 1 during the same step of the manufacturing process of FIG. 24, showing the same section as that shown in FIG. 24 except for the protective MOS formation region (Vcc MSDMOS). Those figures later than FIG. 62 which illustrate Embodiment 3 are cross-sectional views of the same section as that shown FIG. 62, but in different manufacturing processes. The cross-sectional view corresponding to the section taken along the line B—B of FIG. 7 during the manufacturing process of FIG. 62 is identical to that shown in FIG. 25.

As shown in FIG. 63, a relatively thin insulating film 3a and a relatively thick insulating film 3b are formed over the principal surface of the semiconductor substrate 1 in the same manner as Embodiment 1. Within the protective MOS formation region, the thin insulating film 3a is formed. The cross-sectional view corresponding to the section taken along the line B—B of FIG. 7 during the manufacturing process of FIG. 63 is identical to that shown in FIG. 27.

Thereafter, as shown in FIG. 64, the patterns of the conductive film 4 and the insulating film 19 are formed over the principal surface of the semiconductor substrate 1 in the same manner as Embodiment 1. Here, in the protective MOS formation region, the conductive film 4a is patterned in the shape of a gate electrode, so as to expose the sources and drains of the protective MOSs. Other than this region, the conductive film 4a is patterned in the same manner as Embodiment 1. The impurity (for example, arsenic) for the formation of the sources and drains of the memory cells is doped into the source and drain regions of the memory cells and the source and drain regions of the protective MOSs in the semiconductor substrate 1 by an ion implantation method etc. to form the pairs of the n-type semiconductor regions 2S, 2D (local source lines SS and sub-bit lines SB) for forming the sources and drains of the memory cells and pairs of n-type semiconductor regions 13, 13 for forming the sources and drains of the protective MOSs. In other words, in Embodiment 3, the n-type semiconductor regions 13, 13 forming the sources and drains of the protective MOSs are formed in conjunction with the formation of the pairs of n-type semiconductor regions 2S, 2D forming the sources and drains of the memory cells, using the same impurity. This means that the impurity concentration profile of the arsenic in the n-type semiconductor regions 13 forming the sources and drains of the protective MOSs is identical to that of the n-type semiconductor regions 2S, 2D forming the sources and drains of the memory cells. Other than that, the process is identical to Embodiment 1. The cross-sectional view corresponding to the section taken along the line B—B of FIG. 7 during the step of the manufacturing process of FIG. 64 is identical to that shown in FIG. 30.

Next, as shown in FIG. 65, an insulation film 7 is formed in a recess on the principal surface of the semiconductor substrate 1 in the same manner as embodiment 1. The cross-sectional view corresponding to the section taken along the line B—B of FIG. during the step of the manufacturing process of FIG. 65 is identical to that shown in FIG. 32.

Next, as shown in FIG. 66, after depositing a conductive film 4b over the semiconductor substrate 1 in the same manner as Embodiment 1, this conductive film 4b is patterned using a photo resist pattern PR1 to form the floating gate electrodes constituted by the conductive films 4a and 4b. At this point, the high-voltage MOS regions, protective MOS region, short MOS region and the selection MOS region etc. are entirely covered by the conductive film 4b. The cross-sectional view corresponding to the section taken along the line B—B of FIG. 7 during the manufacturing process of FIG. 66 is identical to that shown in FIG. 35.

Next, as shown in FIG. 67, after forming an interlayer film 5 over the semiconductor substrate 1 in the same manner as Embodiment 1, using the photo resist pattern PR2 formed thereon as an etching mask, the exposed portions of the interlayer film 5 are eliminated by a dry etching method etc. to form contact holes SC within the interlayer film 5. In FIG. 67, although there is no indication of contact holes SO in the high-voltage MOS regions and the protective MOS region, there are contact holes formed over the gate electrode formation regions of those MOSs, exposing the portions of the conductive film 4b, that are located in the positions that cannot be seen from the cross-sectional view of FIG. 67. The cross-sectional view corresponding to the section taken along the line B—B of FIG. 7 during the step of the manufacturing process of FIG. 67 is identical to that shown in FIG. 38.

Thereafter, as shown in FIG. 68, conductive films 6a and 6b and a cap insulating film 8 are sequentially deposited from the bottom over the semiconductor substrate 1 by a CVD method etc. in the same manner as Embodiment 1, and they are then patterned using photolithographic and dry etching techniques. This process forms the control gate electrodes (word lines W) in the memory array, and portions of the gate electrodes of respective MOSs in other regions including the high-voltage MOS regions, protective MOS region, short MOS region and selection MOS region etc. Again, in this Embodiment 3, there is no strip formed between the memory array region and the peripheral circuit region, so that the word lines W may be processed with a small pitch. The cross-sectional view corresponding to the section taken along the line B—B of FIG. 7 during the manufacturing process of FIG. 68 is identical to that shown in FIG. 41.

Next, as shown in FIG. 69, using the cap insulating film 8 and the conductive film 6 as an etching mask, the interlayer film 5 and the conductive films 4b and 4a thereunder are etched away by a dry etching method etc. in the same manner as Embodiment 1. This process completes the control gate electrodes and floating gate electrodes of the memory cells MC in the memory array. And, at the same time, in the peripheral circuit region (high-voltage MOS region, protective MOS region, short MOS region and selection MOS region), the gate electrodes 21n, 21p, 14, 9 and 10 are completed. In each of the gate electrodes 21n, 21p, 14, 9 and 10 of respective MOSs, the conductive film 4 and the conductive film 6 are in electrical connection via a contact hole SC. In this manner, the protective nMOS Qopn1 are formed. The cross-sectional view corresponding to the section taken along the line B—B of FIG. 7 during the step of the manufacturing process of FIG. 69 is identical to that shown in FIG. 43.

Next, as shown in FIG. 70, semiconductor regions 23na, 23pa, 11na (see FIG. 45) of the respective MOSs having relatively low concentrations of impurities are formed respectively by separate impurity doping rocesses using different photo resist patterns as asks, and an insulating film 12a is then formed on he side surfaces of the gate electrodes 14, 21n, 21p, and 10 in the same manner as Embodiment 1. The intervals between the adjacent word lines W are filled with this insulating film 12a. The cross-sectional view corresponding to the section taken along the line B—B of FIG. 7 during the step of the manufacturing process of FIG. 70 is identical to that shown in FIG. 45.

Next, as shown in FIG. 71, semiconductor regions 23nb, 23pb, 11nb of the respective MOSs having relatively high concentrations of impurities are formed respectively by separate impurity doping processes using different photo resist patterns as masks in the same manner as Embodiment 1. This process forms pairs of n-type semiconductor regions 11, 23n and pairs of p-type semiconductor regions 23p for forming the sources and drains of the nMOSs QHn and pMOSs QHp in the high-voltage system and the selection MOSs N1 and N3. The cross-sectional view corresponding to the section taken along the line B—B of FIG. 7 during the manufacturing process of FIG. 71 is identical to that shown in FIG. 47.

Next, as shown in FIG. 72, an insulating film 12b (this corresponds to the insulating films 12b and 7n the protective MOS region) is deposited over the semiconductor substrate 1, and contact holes CON1 are provided thereto so as to expose the portions of the semiconductor substrate 1 (source and drain regions of respective MOSs), portions of the word lines W and artions of the gate electrodes of given MOSs using photolithographic and dry etching techniques, and a first-level wiring layer L1 (including common source lines) is then formed over the insulating film 12b in the same manner as Embodiment 1. The first-level wiring layer L1 is electrically connected, accordingly, with the pairs of the semiconductor regions forming the sources and drains, the gate electrodes and the word lines W of the respective MOSs via the contact holes CON 1. The cross-sectional view corresponding to the section taken along the line B—B of FIG. 7 during the step of the manufacturing process of FIG. 72 is identical to that shown in FIG. 50.

Thereafter, as shown in FIG. 73, plugs 24, a second-level wiring layer L2, plugs 25 and a third-level wiring layer L3 etc. are formed in the same manner as Embodiment 1. The cross-sectional view corresponding to the section taken along the line B—B of FIG. 3 during the step of the manufacturing process of FIG. 73 is identical to that shown in FIG. 55. In this way the flash memory (EEPROM) is manufactured.

In Embodiment 3 of the present invention, the electrostatic breakdown resistivity of the protective MOS Qop1 may be improved as described with reference to in Embodiment 1.

The present invention has been explained heretofore in detail with reference to various embodiments, however, it should be appreciated that the present invention is not limited to Embodiment 1–3, and various modifications may be possible without departing from the principle of the present invention.

For example, a silicide layer may be formed over the top surfaces of the source and drain regions of the memory cells of Embodiment 1–3. This allows the reduction in the contact resistance between the wiring and the source and drain regions, so that the operation speed of the memory may be improved.

When doping an impurity to the channels of the memory cells, the impurity may be ion-implanted in a diagonal direction from the source side to offset the drain side. This would allow the extension of the drain disturb margin.

In the above-description, the present invention was explained as being applied to a single flash memory (EEPROM), which is the background field of use of the present invention, however, the present invention is not limited thereto, and it may also be applied, for example, to a composite-type semiconductor integrated circuit device in which the flash memory (EEPROM) and logics are provided on a single semiconductor substrate.

The effects obtained by representative aspects of the invention disclosed herein will be set forth below.

(1) According to the present invention, in a field-effect transistor for a peripheral circuit having the same structure as the double-level gate electrode of a nonvolatile memory cell, a hole for connecting the two layers of the gate electrode is provided at a location which two-dimensionally overlaps the active region within the plane of the gate electrode, so that the resistivity of the gate electrode of this field-effect transistor may be reduced.

(2) Due to the effect of (1), the power consumption of a semiconductor integrated circuit device having the nonvolatile memories may be reduced.

(3) According to the present invention, in a field-effect transistor for a peripheral circuit having the same structure as the double-level gate electrode of a nonvolatile memory cell, a hole for connecting the two layers of the gate electrode is provided at a location which two-dimensionally overlaps the active region within the plane of the gate electrode, so that the design of the layout of the peripheral circuit elements of a semiconductor integrated circuit device having nonvolatile memory cells may be simplified.

(4) Due to the effect of (3), the transition from the circuit design to the device design of a semiconductor integrated circuit device having the nonvolatile memory cells may be made more easily.

What is claimed is:

1. A semiconductor integrated circuit device comprising a plurality of nonvolatile memory cells and a field-effect transistor for the use as a peripheral circuit on a semiconductor substrate, each of said plurality of nonvolatile memory cells comprising;

a pair of memory-cell semiconductor regions provided on said semiconductor substrate;

a first gate electrode provided over said semiconductor substrate via a first insulating film at a location between said pair of memory-cell semiconductor regions; and a second gate electrode provided over said first gate electrode via a second insulating film;

said field-effect transistor for the use as a peripheral circuit comprising;

a pair of peripheral-circuit semiconductor regions provided on said semiconductor substrate;

said first gate electrode provided over said semiconductor substrate via a gate insulating film at a location between said pair of peripheral-circuit semiconductor regions;

said second gate electrode provided over said first gate electrode via said second insulating film; and a hole provided in said second insulating film so as to electrically connect said first gate electrode and said second gate electrode, said hole being provided at a location which two-dimensionally overlaps an active area within the plane of said first and second gate electrodes.

2. A semiconductor integrated circuit device comprising a plurality of nonvolatile memory cells and a field-effect transistor for the use as a peripheral circuit on a semiconductor substrate, each of said plurality of nonvolatile memory cells comprising;

a pair of memory-cell semiconductor regions provided on said semiconductor substrate;

a first gate electrode provided over said semiconductor substrate via a first insulating film at a location between said pair of memory-cell semiconductor regions; and a second gate electrode provided over said first gate electrode via a second insulating film;

said field-effect transistor for the use as a peripheral circuit comprising;

a pair of peripheral-circuit semiconductor regions provided on said semiconductor substrate;

said first gate electrode provided over said semiconductor substrate via a gate insulating film at a location between said pair of peripheral-circuit semiconductor regions;

said second gate electrode provided over said first gate electrode via said second insulating film; and a hole provided in said second insulating film so as to electrically connect said first gate electrode and said second gate electrode, said hole being provided both at a location which two-dimensionally overlaps an active area and at a location which two-dimensionally overlaps an isolation area within the plane of said first and second gate electrodes.

3. A semiconductor integrated circuit device comprising a plurality of nonvolatile memory cells and a field-effect transistor for the use as a peripheral circuit on a semiconductor substrate, each of said plurality of nonvolatile memory cells comprising;

a pair of memory-cell semiconductor regions provided on said semiconductor substrate;

a first gate electrode provided over said semiconductor substrate via a first insulating film at a location between said pair of memory-cell semiconductor regions; and a second gate electrode provided over said first gate electrode via a second insulating film;

said field-effect transistor for the use as a peripheral circuit comprising;

a pair of peripheral-circuit semiconductor regions provided on said semiconductor substrate;

said first gate electrode provided over said semiconductor substrate via a gate insulating film at a location between said pair of peripheral-circuit semiconductor regions;

said second gate electrode provided over said first gate electrode via said second insulating film; and a hole provided in said second insulating film so as to electrically connect said first gate electrode and said second gate electrode, said hole being provided not at a location which two-dimensionally overlaps an active area, but at a location which two-dimensionally overlaps an isolation area within the plane of said first and second gate electrodes.

4. A semiconductor integrated circuit device comprising a plurality of nonvolatile memory cells and first and second field-effect transistors for the use as a peripheral circuit on a semiconductor substrate, each of said nonvolatile memory cells comprising:

a pair of memory-cell semiconductor regions provided on said semiconductor substrate;

a first gate electrode provided over said semiconductor substrate via a first insulating film at a location between said pair of memory-cell semiconductor regions; and a second gate electrode provided over said first gate electrode via a second insulating film;

said first and second field-effect transistors for the use as peripheral circuits comprising;

a pair of peripheral-circuit semiconductor regions provided on said semiconductor substrate;

said first gate electrode provided over said semiconductor substrate via a gate insulating film at a location between said pair of peripheral-circuit semiconductor regions;

said second gate electrode provided over said first gate electrode via said second insulating film; and a hole provided in said second insulating film so as to electrically connect said first gate electrode and said second gate electrode, said hole being provided at a location which two-dimensionally overlaps an active area within the plane of said first and second gate electrodes in said first field-effect transistor, and being provided at a location which two-dimensionally overlaps an isolation area within the plane of said first and second gate electrodes in said second field-effect transistor.

5. A semiconductor integrated circuit device according to claim 4 wherein the gate length of said first field-effect transistor is longer than the gate length of said second field-effect transistor.

6. A semiconductor integrated circuit device according to claim 4 or 5 wherein the gate width of said first field-effect transistor is wider than the gate width of said second field-effect transistor.

7. A semiconductor integrated circuit device according to claim 4 or 5 wherein said gate insulating film of said first field-effect transistor has a larger thickness than the thickness of said gate insulating film of said second field-effect transistor.

8. A semiconductor integrated circuit device according to claim 4 wherein the driving voltage of said first field-effect transistor is higher than the driving voltage of said second field-effect transistor.

9. A semiconductor integrated circuit device according to claim 4 wherein said first field-effect transistor is a field-effect transistor constituting an input circuit, an output circuit an input/output bidirectional circuit, a power circuit or a booster circuit.

10. A semiconductor integrated circuit device comprising a plurality of nonvolatile memory cells and a protective field-effect transistor on a semiconductor substrate, each of said plurality of nonvolatile memory cells comprising;

a pair of memory-cell semiconductor regions provided on said semiconductor substrate;

a first gate electrode provided over said semiconductor substrate via a first insulating film at a location between said pair of memory-cell semiconductor regions; and a second gate electrode provided over said first gate electrode via a second insulating film;

said protective field-effect transistor comprising;

said pair of memory-cell semiconductor regions provided on said semiconductor substrate;

said first gate electrode provided over said semiconductor substrate via said first insulating film at a location between said pair of memory-cell semiconductor regions;

said second gate electrode provided over said first gate electrode via said second insulating film; and a hole provided in said second insulating film so as to electrically connect said first gate electrode and said second gate electrode.

11. A semiconductor integrated circuit device according to claim 10 wherein said hole is provided at a location which two-dimensionally overlaps an active area, or at a location which two-dimensionally overlaps an isolation area within the plane of said first and second gate electrodes.

12. A semiconductor integrated circuit device according to claim 10 wherein said hole is provided both at a location which two-dimensionally overlaps an active region and at a location which two-dimensionally overlaps an isolation area within the plane of said first and second gate electrodes.

13. A semiconductor integrated circuit device comprising a plurality of nonvolatile memory cells and a capacitor element on a semiconductor substrate, each of said plurality of nonvolatile memory cells comprising;

a pair of memory-cell semiconductor regions provided on said semiconductor substrate;

a first gate electrode provided over said semiconductor substrate via a first insulating film at a location between said pair of memory-cell semiconductor regions; and a second gate electrode provided over said first gate electrode via a second insulating film;

said capacitor element comprising;

an active area for the capacitor element formed in said semiconductor substrate;

said first gate electrode provided thereon via said first insulating film so as that it two-dimensionally overlaps said active area;

said second gate electrode provided over said first gate electrode via said second insulating film; and a hole provided in said second insulating film so as to electrically connect said first gate electrode and said second gate electrode.

14. A semiconductor integrated circuit device according to claim 13 wherein said hole is provided at a location which two-dimensionally overlaps an active area for said capacitor element or at a location which two-dimensionally overlaps an isolation area, or at the both locations which two-dimensionally overlap, respectively, the active area for said capacitor element and the isolation area within the plane of said first and second gate electrodes.

15. A semiconductor integrated circuit device according to claim 13 or 14 wherein a hole for electrically connecting said second gate electrode and a wiring thereon is provided at a location which two-dimensionally overlaps an isolation area of said semiconductor substrate.

16. A semiconductor integrated circuit device according to claim 13 or 14 wherein said active area for said capacitor element is divided by an isolation area interposed therebetween, and a hole for electrically connecting said second gate electrode and a wiring thereon is provided at a location which two-dimensionally overlaps said isolation area of said semiconductor substrate.

17. A semiconductor integrated circuit device comprising a plurality of nonvolatile memory cells and a field-effect transistor for the use as a peripheral circuit on a semiconductor substrate, each of said plurality of nonvolatile memory cells comprising;

a pair of memory-cell semiconductor regions provided on said semiconductor substrate;

a first gate electrode provided over said semiconductor substrate via a first insulating film at a location between said pair of memory-cell semiconductor regions; and a second gate electrode provided over said first gate electrode via a second insulating film;

said field-effect transistor for the use as a peripheral circuit comprising;

a pair of peripheral-circuit semiconductor regions provided on said semiconductor substrate;

said first gate electrode provided over said semiconductor substrate via a gate insulating film at a location between said pair of peripheral-circuit semiconductor regions;

said second gate electrode provided over said first gate electrode via said second insulating film; and a hole provided in said second insulating film so as to electrically connect said first gate electrode and said second gate electrode, said second gate electrode including a first conductive film and a second conductive film formed on said first conductive film, said second conductive film being directly connected to said first gate electrode via said hole, said hole being provided at a location which two-dimensionally overlaps an active region within the plane of said first and second gate electrodes.

* * * * *